United States Patent [19]
Harris et al.

[11] Patent Number: 6,078,222
[45] Date of Patent: Jun. 20, 2000

[54] CONTROLLER-BASED RADIO FREQUENCY AMPLIFIER MODULE AND METHOD

[75] Inventors: Clifford Harris; Carl Ungvarsky, both of Mountaintop; Paulo Correa, Kingston, all of Pa.

[73] Assignee: Thomcast Communications, Inc., Southwick, Mass.

[21] Appl. No.: 08/887,940

[22] Filed: Jul. 3, 1997

Related U.S. Application Data

[60] Provisional application No. 60/021,271, Jul. 5, 1996.

[51] Int. Cl.[7] .................................. H03F 3/68; H03G 3/30
[52] U.S. Cl. .......................................... 330/295; 330/285
[58] Field of Search .................................... 330/277, 285, 330/286, 295, 298

[56] References Cited

U.S. PATENT DOCUMENTS

| | | | |
|---|---|---|---|
| 4,780,685 | 10/1988 | Ferguson | 330/124 D |
| 5,023,930 | 6/1991 | Leslie | 455/9 |
| 5,101,173 | 3/1992 | Dipiazza et al. | 330/136 |
| 5,119,042 | 6/1992 | Crampton et al. | 330/295 |
| 5,128,628 | 7/1992 | Marks et al. | 330/66 |
| 5,182,527 | 1/1993 | Nakanishi et al. | 330/285 |
| 5,191,299 | 3/1993 | Nesbit | 330/295 |
| 5,206,604 | 4/1993 | Vaninetti | 330/124 R |
| 5,229,926 | 7/1993 | Donaldson et al. | 363/50 |
| 5,250,912 | 10/1993 | Fujita | 330/285 |
| 5,256,987 | 10/1993 | Kibayashi et al. | 330/295 |
| 5,287,543 | 2/1994 | Wolkstein | 455/13.3 |
| 5,302,914 | 4/1994 | Arntz et al. | 330/129 |
| 5,373,250 | 12/1994 | Gatti et al. | 330/277 |
| 5,488,331 | 1/1996 | Keane et al. | 330/296 |
| 5,500,626 | 3/1996 | Barclay, Jr. | 330/279 |
| 5,555,257 | 9/1996 | Dent | 370/95.1 |
| 5,561,395 | 10/1996 | Melton et al. | 330/2 |
| 5,903,854 | 5/1999 | Abe et al. | 330/295 X |

FOREIGN PATENT DOCUMENTS 2 260 871   4/1993   United Kingdom .

*Primary Examiner*—Steven J. Mottola
*Attorney, Agent, or Firm*—Oblon, Spivak, McClelland, Maier & Neustadt, P.C.

[57] ABSTRACT

A controller-based radio frequency amplifier method and module are employed in a modular transmission system in which respective of the controller-based radio frequency amplifier modules amplify a portion of a signal that is input into the system. Each amplifier module includes an amplifier submodule have a plurality of discrete amplifiers arranged in an amplifier chain, a processor submodule is configured to control a level of the amplified output signal that is output from each amplifier module, a power supply module, and an enclosure. The processor submodule is configured to control the discrete amplifiers in the amplifier submodule such that the module may be removed or added to the system without damaging the power amplifier module or other system components.

28 Claims, 45 Drawing Sheets

*FIG. 6*

| CHANNEL DESIGNATION | BANDWIDTH (MHz) |
|---|---|
| MDS1 | 2150-2156 |
| MDS2 | 2156-2162 |
| ITFS A1 | 2500-2506 |
| ITFS A2 | 2512-2518 |
| ITFS A3 | 2524-2530 |
| ITFS A4 | 2536-2542 |
| ITFS B1 | 2506-2512 |
| ITFS B2 | 2518-2524 |
| ITFS B3 | 2530-2536 |
| ITFS B4 | 2542-2548 |
| ITFS C1 | 2548-2554 |
| ITFS C2 | 2560-2566 |
| ITFS C3 | 2572-2578 |
| ITFS C4 | 2584-2590 |
| ITFS D1 | 2554-2560 |
| ITFS D2 | 2566-2572 |
| ITFS D3 | 2578-2584 |
| ITFS D4 | 2590-2596 |
| MMDS E1 | 2596-2602 |
| MMDS E2 | 2608-2614 |
| MMDS E3 | 2620-2626 |
| MMDS E4 | 2632-2638 |
| MMDS F1 | 2602-2608 |
| MMDS F2 | 2614-2620 |
| MMDS F3 | 2626-2632 |
| MMDS F4 | 2638-2644 |
| ITFS G1 | 2644-2650 |
| ITFS G2 | 2656-2662 |
| ITFS G3 | 2668-2674 |
| ITFS G4 | 2680-2686 |
| OFS H1 | 2650-2656 |
| OFS H2 | 2662-2668 |
| OFS H3 | 2674-2680 |

MDS1–MDS2: F1
ITFS A1–ITFS G4: F2
OFS H1–OFS H3: F3

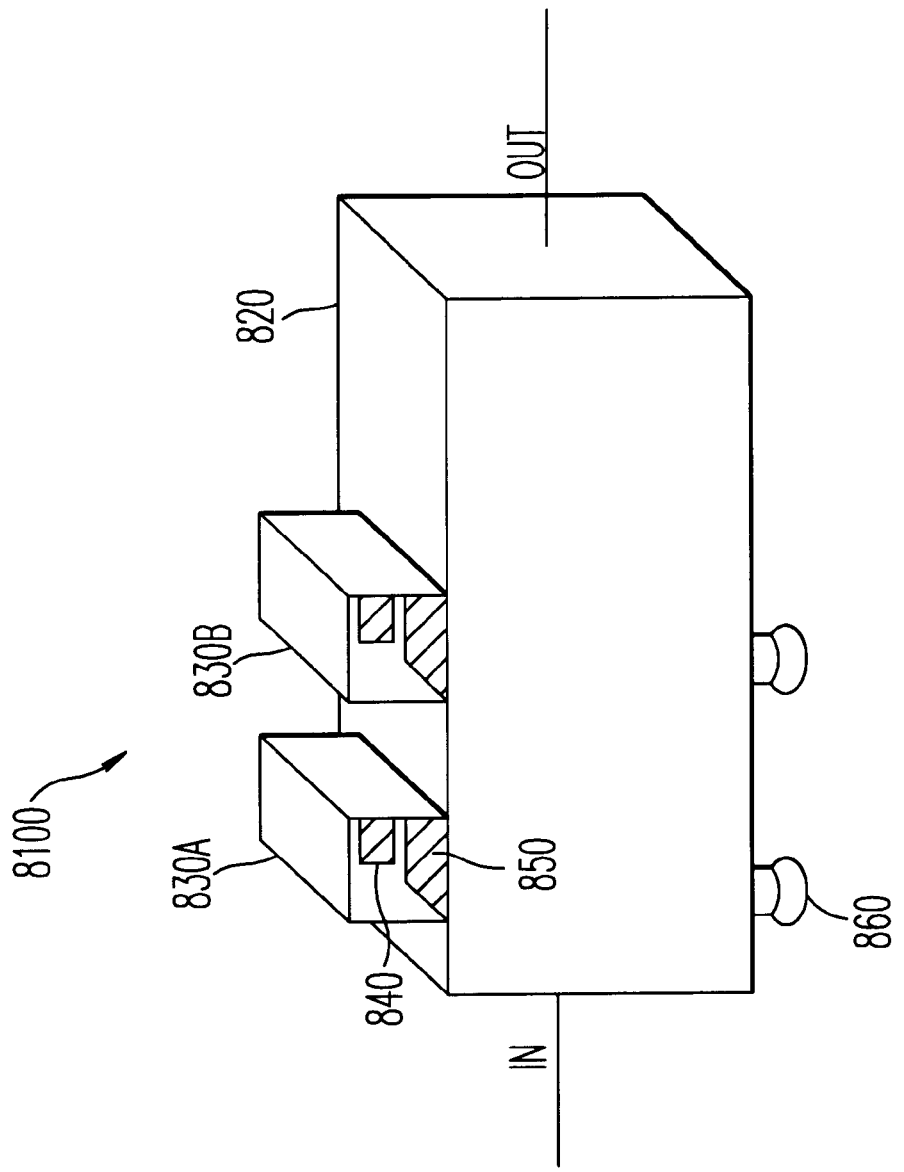

266

| TRAP No. | Object Class | Attribute 1= | Attribute 2= | EOM |

| 000028 | Slice | Saddr = 7 | RefPStatus = high | END |

FIG. 35b

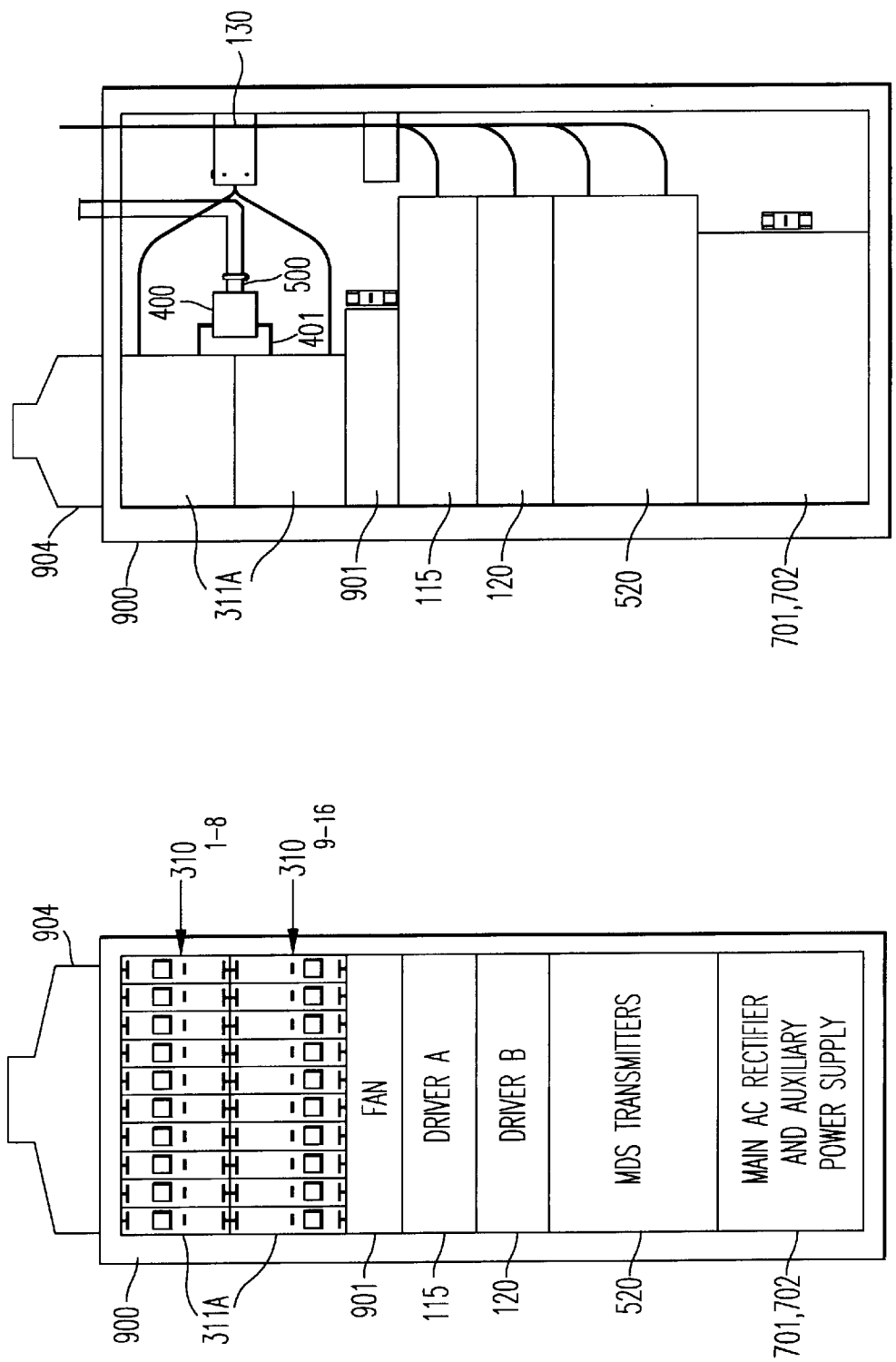

CONTROLLER-BASED RADIO FREQUENCY AMPLIFIER MODULE AND METHOD

CROSS-REFERENCE TO RELATED APPLICATION

This application claims the benefit of U.S. Provisional Application No. 60/021,271, filed Jul. 5, 1996.

BACKGROUND OF THE INVENTION

1. Field of the Invention

The present system and method pertains to communication systems and methods of the types used in communication networks and distribution services. More particularly the present invention relates to radio frequency (RF) transmission systems having modular architectures that accept an input signal(s), amplifies the signal(s) using modular components, and transmits the amplified signal(s) via radio waves to at least one receiver.

2. Discussion of the Background

By their very nature wireless technologies do not require the same investment in infrastructure that originally motivated the United States (U.S.) to permit local telephone companies and cable operators to create "wired" service monopolies. However, in order to compete with "wired" technologies, wireless technologies have a number of unique obstacles that must be overcome. These obstacles include distributing radio waves to areas located in valleys, blocked by mountains, buildings, etc. as well as maintaining a network of high powered transmitters used to reliably broadcast the radio waves to service areas.

Multi-channel multi-point distribution service (MMDS) is generally referred to as "wireless cable," and is one of the wireless service industries that faces the inherent obstacles associated with wireless technologies. Although this document refers to MMDS and wireless cable synonymously, the following other channels of wireless cable when appropriate will be described individually: multi-point distribution service (MDS); Instructional Television Fixed Service (ITFS); and private operational fixed service (OFS).

One of the obstacles facing MMDS service providers is "blocking". In order to further illustrate blocking, FIG. 1 shows a conventional MMDS system where blocking is not a problem. A main transmitter 1 is capable of directly transmitting an analog signal to a receiver 2 without any intervening structures blocking the transmitted signal. When blocking does not occur, the receiver 2 couples the transmitted signal through an antenna 3 and to a home-unit 4. Once in the home-unit, a receiver 5 receives the signal and passes it to a set top 6 which descrambles and tunes the signal. A television 7 then displays a video image that was carried by the signal.

FIG. 2 illustrates a scenario where blocking is a problem. A MMDS signal 8 is blocked by an obstruction (e.g., a hill) 9 so that the receiver 2 cannot receive the MMDS signal. It is estimated that blocking reduces a service area of an MMDS service provider from a theoretical value of 100% to 40%.

FIG. 3 illustrates a conventional approach developed by the MMDS industry to counter the effects of blocking and improve the service area. A booster 10 is strategically placed such that it can receive the MMDS signal from the main transmitter 1 and rebroadcast the MMDS signal to the receiver 2. Thus, the booster 10 can improve service area coverage because the booster 10 can cover areas that are outside of a line-of-sight of the main transmitter 1.

There are generally two types of MMDS boosters 10 used to improve service area coverage. A first type of MMDS booster is a single channel booster which receives 1 of 33 different MMDS channels (actually carriers which are capable of holding multiple audio/video programs) broadcast from the main transmitter 1, and amplifies and transmits that selected single channel to a receiver 2. Because the single channel boosters only process one channel, they do not provide service for the remaining 32 channels. A second type of MMDS booster is a broadband booster, which amplifies all of the channels (typically 33) transmitted from the main transmitter 1 and rebroadcasts the channels to the receiver 2. The broadband boosters require power amplifiers having greater power than those of the single channel boosters because the broadband boosters must amplify up to 33 MMDS channels while single channel boosters amplify only one channel.

As a practical matter, boosters 10 (single channel and broadband boosters) are expensive because they contain a single-unit power amplifier as well as supporting electronics. The expense of the boosters 10 is further escalated by the operational need to have two power amplifiers, or more often, a back-up booster system 10 in order to improve booster reliability. When only redundant power amplifiers are used, one amplifier serves as the operational amplifier and the other is used as a spare. However, aside from the high expense, the use of two single-unit amplifiers is not optimum because if one of the amplifiers fails, service to the service area will cease until the back-up amplifier can be brought on-line. Similarly, when two booster systems 10 are used to improve reliability, the back-up booster system 10 will not begin to broadcast until the operational booster system 10 fails. A gap in service to the service area will exist during the period when the operational booster system 10 fails and the back-up booster system 10 is brought on-line.

Co-channel interference is a second obstacle facing the MMDS industry and limits the effectiveness of current MMDS boosters. Co-channel interference occurs when a stray signal (say from a neighboring one of the boosters 10) interferes with an intended signal by acting as a coherent noise source. Co-channel interference has been particularly problematic with analog MMDS signals, preventing the boosters 10 from being placed close to one another for fear that their respective signals would cause co-channel interference. However, with digital MMDS signals, digital signal processing techniques have been developed that effectively combat co-channel interference so more boosters 10 may be used to cover greater percentages of the MMDS service area.

Even though more of the MMDS boosters 10 may be used in a given service area, the single-unit amplifier architecture of the MMDS boosters 10 (single channel and broadband boosters) is problematic in that when the single unit amplifier fails, service from that MMDS booster 10 is interrupted until a spare amplifier can be brought on-line. Similarly, when a back-up booster 10 is used, service is interrupted until the back-up booster 10 is brought on line. Thus, the MMDS boosters 10 do not degrade gracefully, but rather, fail with little notice, making the MMDS boosters 10 difficult to maintain. When individual ones of the boosters 10 fail, other neighboring boosters are not equipped to increase their transmission powers in order to compensate for the failed booster 10. While some MMDS boosters 10 are equipped to communicate with a network manager, the communication is generally "reactive", in that the failed booster 10 reports its failure, but is incapable of reconfiguring itself in order to restore service.

FIG. 4 illustrates an exemplary conventional broadband MMDS booster 10 which may or may not be supported by a back-up booster 10 (not shown). MMDS signals received through a receive antenna 11 are passed through a low noise amplifier 12, where they amplified. From the LNA 12, the RF signals are passed through a power amplifier assembly 13, which includes a single-unit amplifier, where the RF signals are amplified and passed to a conventional antenna coupler 17. The antenna coupler 17 couples the output signal from the PA assembly 13 and passes the signal to the transmit antenna 18. The amplifier unit 14 is typically powered by a system power supply 15 that distributes low voltage direct current (DC) voltage to all of the components of the booster 10. A control head 16, which is placed in a separate housing than either the power supply 15, the PA assembly 13, or a coupler 17, provides system control functions such as turning on and off the PA assembly.

The amplifier unit 14 is a single-unit amplifier and is not simultaneously operated with one or more of the power-amplifiers for several reasons. First, conventional combining networks for combining output powers from multiple power amplifiers may become damaged when one of the amplifier units 14 fails and in any event would result in several dB of lost output power when one amplifier fails. Second, combining losses are appreciable, and it is less expensive to increase broadcast power by using a larger single-unit amplifier. Third, MMDS booster operators would have to take the second amplifier off-line before removing the failed amplifier unit 14 because conventional MMDS amplifiers are not "hot-swappable". Fourth, maintaining constant output power from each of the single-unit amplifier assemblies 14 would be necessary in order to avoid significant combining and matching problems in a combiner, but conventional single-unit amplifiers are not well suited to provide constant, matched output power.

Because of all the economic, reliability, and performance limitations on the conventional booster 10, the conventional boosters serve a more limited role in MMDS networks than desired by MMDS service operators. Furthermore, due to their specialized architectures, conventional boosters 10 are not used in other applications such as a main MMDS transmitter (single channel or multi-channel), a Personal Communications Services (PCS) base station, or a general purpose reconfigurable transmitter.

SUMMARY OF THE INVENTION

Accordingly, one object of this invention is to provide a novel power amplifier module and method that overcomes the above-mentioned problems.

It is an another object of the invention to provide a power amplifier module for amplifying an input signal applied thereto and providing an amplified output signal to a N-way radial combiner that combines the amplified output signal with other amplified output signals from other power amplifier modules, where the power amplifier module includes a processor submodule configured to control a level of the amplified output signal.

It is another object of the invention to provide a power amplifier module that includes a controller configured to monitor and adjust specific input, output, and control voltages of discrete amplifiers contained in the amplifier module.

It is another object of the invention to provide an amplifier module that is controllably configured to operate in one of a cold standby mode of operation, a transmission mode of operation, a hot-standby mode of operation, a transmit mode of operation and a failed mode of operation.

It is yet a further object of the invention to suppress electromagnetic interference within the power amplifier module.

It is still a further object of the invention to be connected to, and removed from, a system in which other power amplifier modules are presently operating so as to provide a hot-swapping capability.

Another object of the invention is to provide a power amplifier module that may be used with other power amplifier modules in a modular system where the respective power amplifier modules communicate data and status information to a system controller.

Yet another object of the invention is to provide a method for controlling discrete amplifiers in a power amplifier module by monitoring and adjusting specific voltages in the power amplifier module.

These and other objects are accomplished by a novel modular transmission system, that has multiple power amplifier modules, that receives an input signal which may be a single carrier or multiple carriers. The signal is passed to a one-by-N divider which divides the signal N ways. Each of the N divided signals are independently amplified by the separate power amplifier (PA) modules or "slices" (i.e., PA modules) that includes an RF amplifier module, a microcontroller module, and a power supply module, all of which are tightly coupled via a plurality of signal, power, control, and status connections. Each the PA slices amplifies its respective input signal and outputs a respective radio frequency output signal at a predetermined power level as controlled by the microcontroller module, the driver, and a redundant system controller, or a network manager via a system input/output interface. The N amplified output signals are passed via semirigid lines to a N-way radial combiner which combines the energy from the N PA slices such that the entire broadband amplifier system does not shut down if an individual PA slice fails. Furthermore, output power drops by only a few tenths of a dB when a single PA module fails, as opposed to at least several dB in conventional transmitters.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6 is a segmented table of channels used in wireless cable;

FIG. 30b is a perspective view of a waveguide and notch filter assembly of the diplexer;

FIG. 35a is a data structure diagram of a generic TRAP message;

FIG. 35b is a data structure of an example TRAP message;

FIG. 37a is front view of a rack for holding components of a modular transmission system;

FIG. 37b is a side view of a rack holding components of a modular transmission system;

DESCRIPTION OF THE PREFERRED EMBODIMENTS

Figure 5A:
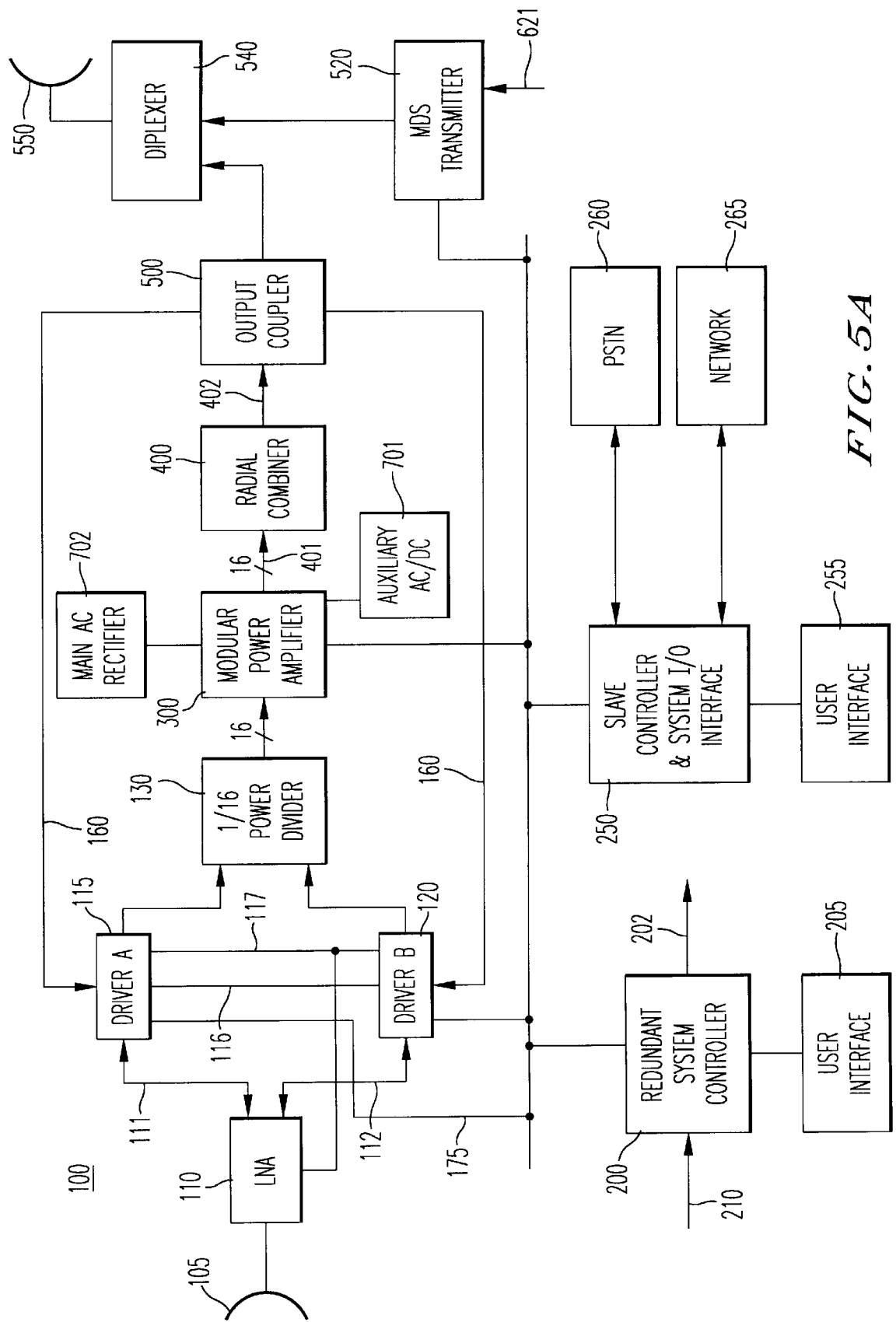
FIG. 5A is a block diagram of a modular broadband booster system of a first embodiment of the present invention.

Referring now to the drawings wherein like reference numerals designate identical or corresponding parts throughout the several views, and more particularly to FIG. 5A thereof, there is illustrated a modular transmit system 100 configured as a broadband booster. In reference to FIG. 5A, each of the components of the modular broadband booster system 100 will be described briefly and selected ones of the components will be described in more detail (where noted) in reference to other figures.

Figure 1:
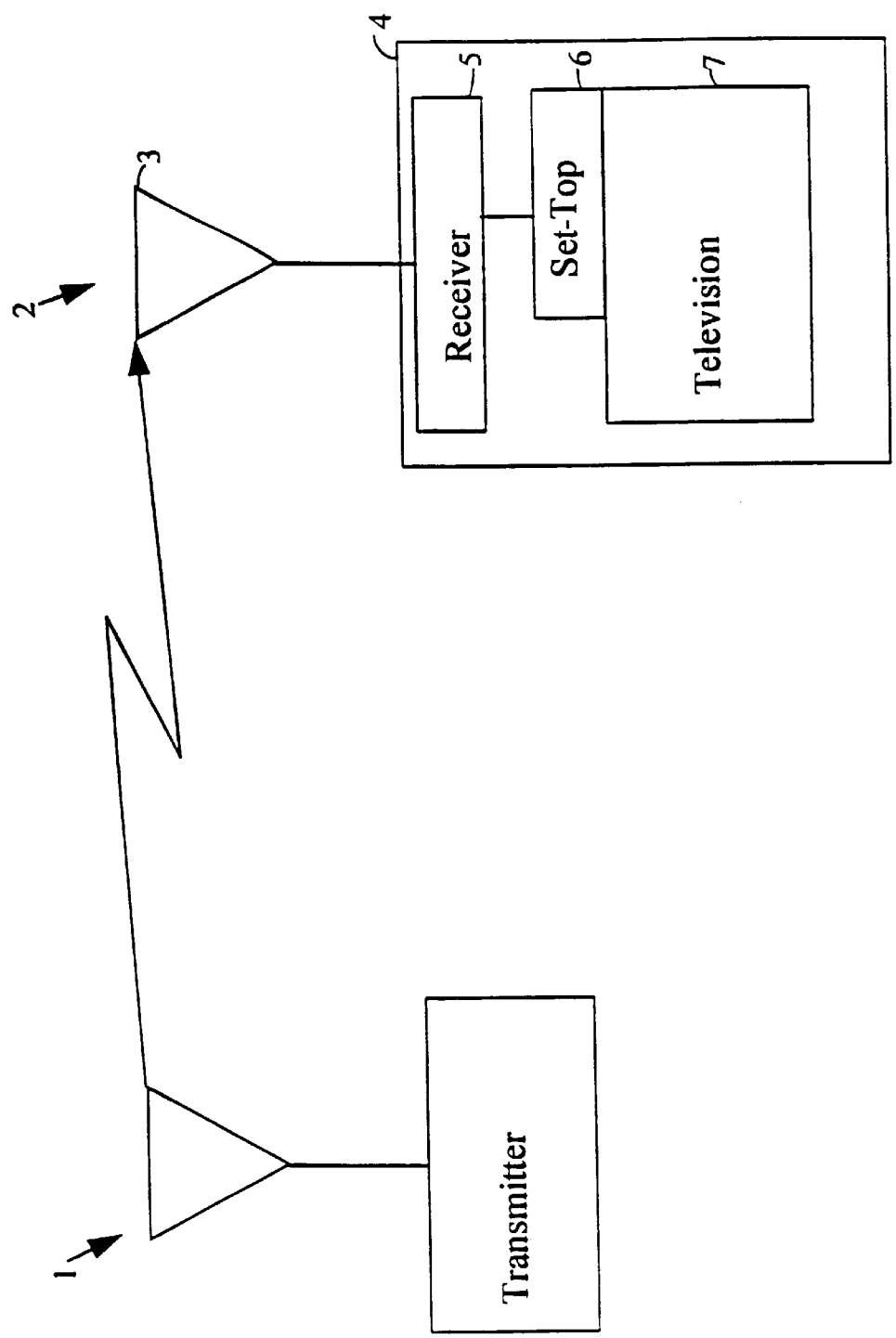
FIG. 1 is a block diagram of a conventional wireless cable system.
Figure 2:
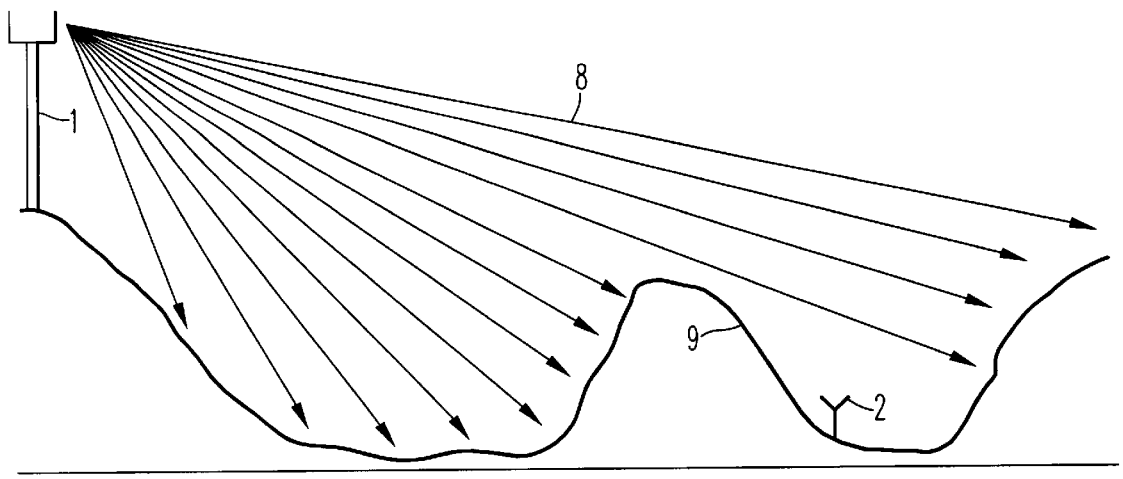
FIG. 2 is an example wireless cable scenario with blockage due to a hill.
Figure 3:
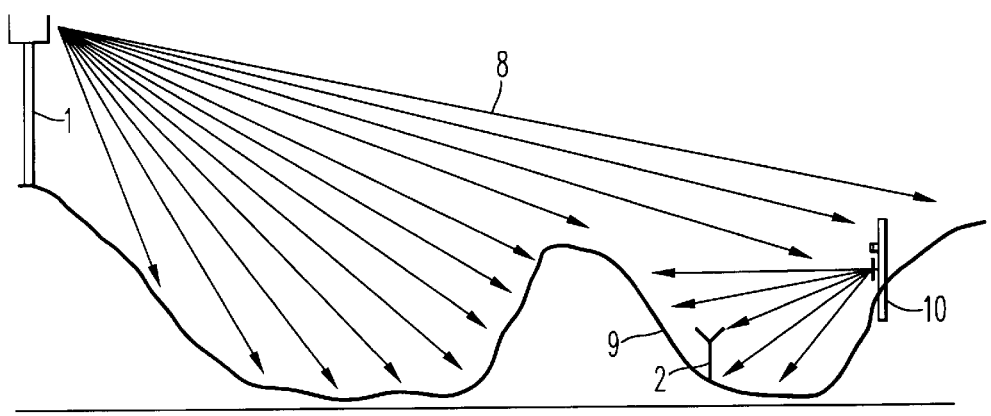
FIG. 3 is an example wireless cable system with blockage due to a hill and a booster to overcome the blockage problem.
Figure 4:
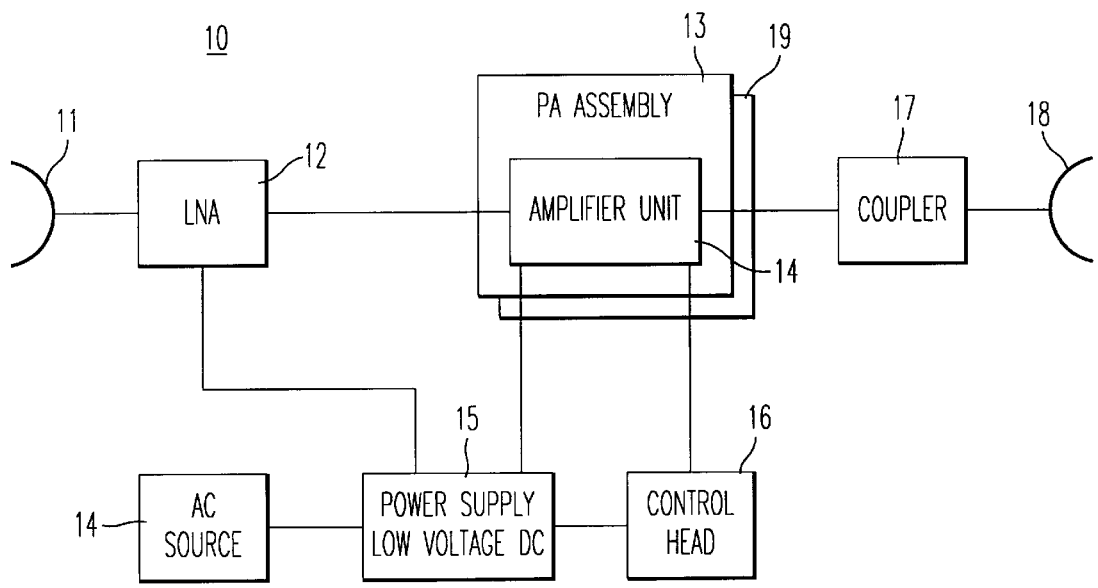
FIG. 4 is a block diagram of a conventional broadband MMDS booster.

An input antenna 105 couples radio frequency (RF) energy in the MMDS frequency band (see FIG. 6 for a description of the various frequency bands used in MMDS, wireless cable) transmitted from a main MMDS transmitter 1 (FIG. 1). The antenna 105 is a two meter parabolic reflector antenna having a gain of 30 dBi (decibels relative to an isotropic radiator). This size antenna helps to spatially isolate the modular broadcast booster system 100 such that undesired energy from other transmitters, boosters, and reflections off objects arriving from directions other than a direction in which the main transmitter 1 is located are not picked-up. The input antenna 105 focuses the RF energy from the main transmitter 1 and provides the FR energy to a redundant low noise amplifier (LNA) 110.

The redundant LNA 110 (shown in more detail in FIG. 7) preselects and amplifies the input signal provided from the antenna 105. While redundant drivers are shown, in the interest of cost and time-to-market, a single driver may also be used. The output of LNA 110 is provided to a driver A 115 via a connection 111 and to a driver B 120 via a connection 112. The output of the LNA 110 is provided to both of the drivers 115, 120 so as to enhance system reliability.

The driver A 115 and the driver B 120 (which are described in more detail in reference to FIGS. 8–9) perform similar functions in that they provide variable attenuation, provide power to the redundant LNA 110, and provide level control for the modular broadband booster system 100. The drivers A and B 115, 120 do not simultaneously process the signal provided by the redundant LNA 110, but rather only one of the drivers 115, 120 drives (i.e., provides an amplified signal to) the remainder of the modular broadband booster system 100, while the other driver 120, 115 drives a load impedance (i.e., is not used to process the signal). The drivers 115, 120 are arranged in a master/slave architecture which they use to determine which of the drivers 115, 120 will drive the modular broadband booster system 100 and which will drive the load.

Figure 10:
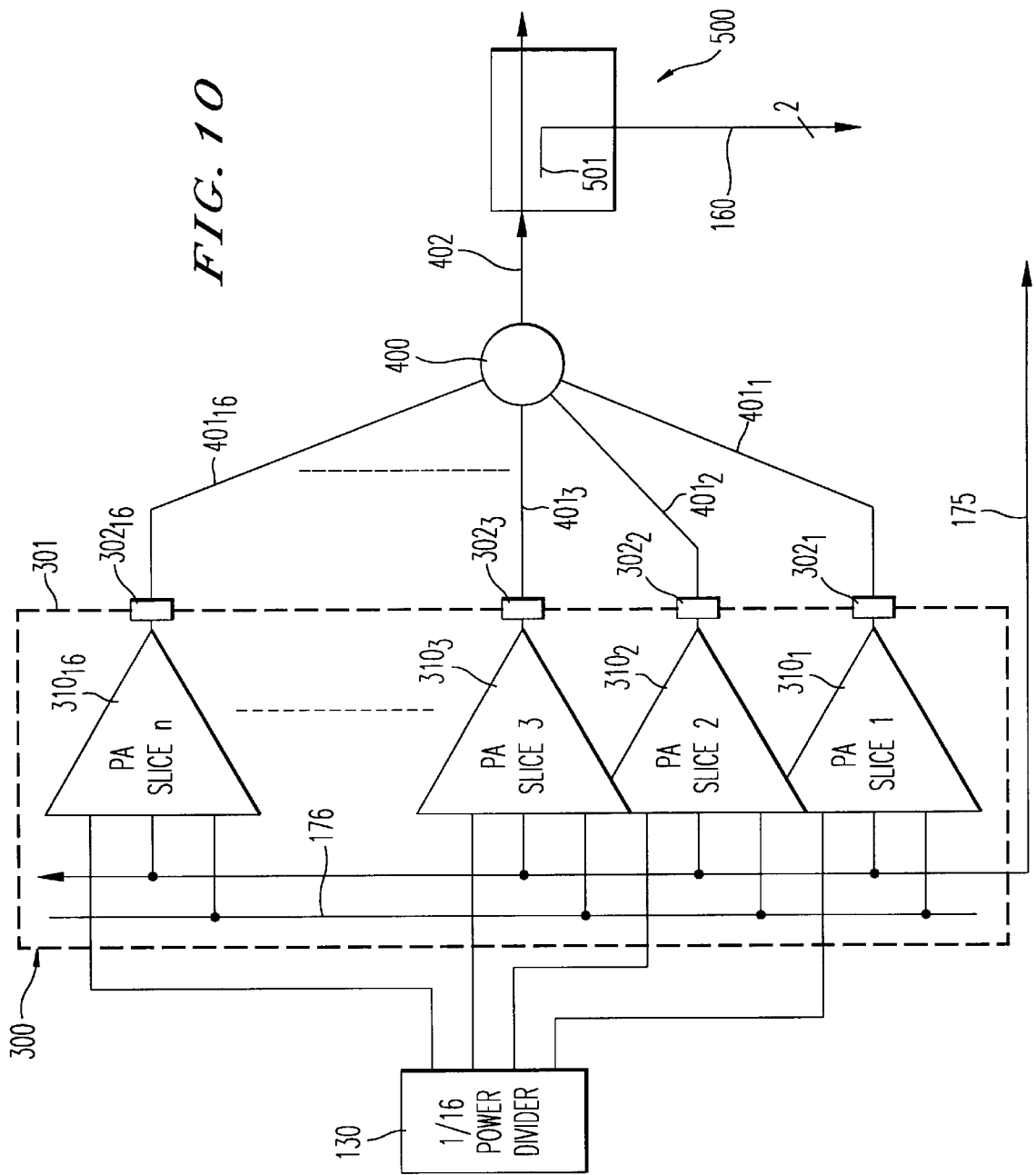
FIG. 10 is a detailed block diagram of a power divider, modular power amplifier, radial combiner, and output coupler of the first embodiment.

Assuming the driver A 115 is active (master), the output of the driver A 115 is passed to a 1/16 power divider 130 (see FIG. 10). The power divider 130 divides the incoming signal in 16 ways by using a sixteen way splitter. However, more generally, the modular broadband booster system 100 may be configured to divide the input signal in N ways and subsequently process the divided signal in N corresponding signal paths. Nonetheless, in the illustrative embodiment, the signal from the driver A is divided by the power divider 130 in 16 ways, such that each of the 16 output signals of the 1/16 power divider 130 have a proportionate 1/16th, not accounting for approximately 13 dB of insertion loss, of the input signal power. The 1/16 power divider 130 is a 0° hybrid splitter of a Wilkinson splitter structure.

A modular power amplifier 300 (described in more detail in reference to FIGS. 10–27) receives each of the 16 divided signals from the 1/16 power divider 130 and individually amplifies the divided signals on 16 separate signal paths. Each signal path normalizes a respective input signal to 20 dBm, amplifies the respective signal by 27 dB, and outputs one of 16 output signals at a level of 47 dBm. The input level and output levels, however, are adjustable by an automatic level control (ALC) process.

An N-way (16-way in the present embodiment) radial combiner 400 (described in more detail in reference to FIGS. 28, 29 and 37c) accepts the 16 amplified signals as fed by 16 respective semi-rigid lines 401 (also discussed in reference to FIG. 10) having a length of 25.4 cm and in the range of 21 cm to 30 cm, and spaced at increments of ½ of the wavelength of a center of the MMDS band, such that each of the respective lines are isolated from one another. The radial combiner 400 combines the 16 respective input signals and provides a single output 402 which is preferably a ⅞ inch rigid copper transmission line (i.e., a tube-like waveguide) via an EIA bullet connector. The radial combiner 400 provides a uniformly matched input impedance for each the respective 16 inputs. Accordingly, if an individual one of the 16 PA modules or ("PA slices 310") in the power amplifier 300 fails, the failed modules are removed and the radial combiner 400 remains stable and reflections from the active N−1 power amplifier modules does not damage either the radial combiner or the power amplifier 300. Furthermore, when an individual power amplifier module fails, the total output power of the modular broadband booster drops only by 0.3 dB relative to the power when all 16 power amplifier modules PA slices are functioning.

The amplified signal output from the radial combiner 400 is input to an output coupler 500, via single output 402, which couples the energy and prepares the amplified output energy for transmission from the modular broadband booster system 100 to the receiver 2 (FIG. 1). The output coupler 500 also samples (as discussed in reference to FIG. 10) the total energy (forward and reflected power) provided by the radial combiner 400 and respectively provides the sampled total energy to the driver 115, 120 in the form of a DC voltage (e.g., 1.4 VDC) via a pair of sample lines 160. The samples provided on the sample lines 160 provide information about whether there is mismatch between the output coupler 500 and the radial combiner 400, and also whether the drivers 115, 120 should adjust their output powers as part of the ALC process so as to control the output power level for the broadband booster system 100.

The output coupler 500 forwards the coupled signal to a diplexer 540 (also discussed in reference to FIGS. 30–32) which combines a first signal from an MDS transmitter 520, which provides two 6 MHZ channels (as shown in FIG. 6), with a second signal which is provided from the output coupler 500. The diplexer 540 first bandpass filters the first signal and the second signal, and then combines the two signals to provide a single output (which contains signal energy in the MDS and ITFS/MMDS/OFS frequency bands) to an output antenna 550.

The MDS transmitter 520 receives its input signals from a line 621 which is connected to an external source, but alternatively can be provided from the LNA 110 (coupling connection not shown) because the antenna 105 will also couple the MDS frequency band.

The driver A 115, driver B 120, modular power amplifier 300, and MDS transmitter 520 are all connected via a GNET serial multidrop network 175 conforming to an RS-485 standard and following a protocol developed and marketed by Coactive Aesthetics Inc. A selected data structures used by the modular broadband booster system 100 to communicate over the GNET 175 are discussed with respect to FIG. 5C. While this GNET RS-485 network 175 is preferred, other buses including VMEbus, VXIbus, etc., could be used as well. The GNET provides a system bus within the Modular Broadband Booster System 100 and is used for passing control signals, sensor signals and monitoring signals to the several components of the modular broadband booster system 100.

Connected to and controlling the GNET 175 is a redundant system controller 200 (also discussed in reference to FIG. 33), which is a circuit board based on a Motorola MC68HC11F4FN micro-controller. Like the drivers 115, 120, the system controller need not have redundant features. The redundant system controller 200 has a plurality of inputs 210 for receiving signals from scaling amplifiers used in monitoring various system parameters. The redundant system controller 200 also includes a plurality of outputs 202 for providing control signals to the various components of the modular broadband booster system 100.

A user interface 205 (also discussed in reference to FIG. 33) connects to the redundant system controller 200 and is used by local operators of the modular broadband booster system 100 to view the status of the booster system 100, and to input specific control commands to the booster system 100. More particularly, the user interface 205 permits a user to input data into the system for adjusting control parameters, maintenance parameters, controlling the system for turning the system on/off) and for printing data if desired.

A slave controller and system I/O interface device 250 connects to the GNET 175 and provides a second system monitoring station, ancillary to the redundant system controller 200, and provides remote accessing control through a network 265 and a public switched telephone network (PSTN) 260. Alternatively, the slave controller and I/O 250 could perform the functions of the redundant system controller 200, or vice versa. The remote accessing control feature allows the modular broadband booster system 100 to report status information, fault information, sensor information and system related information to a central network management system (e.g., a Sun Microsystems Sparc 20 Workstation operating a Hewlett Packard HP Openview® application) which controls a number of different broadband booster systems 100 which make up a MMDS network. Accordingly, through the slave controller and system I/O interface 250, the central network management system (located at the main transmitter 1, FIG. 1) controls various features of the modular broadband booster system 100 (such as incrementally increasing or decreasing power, monitor system health, etc.), thereby enabling dynamic network resource reallocation and reconfiguration, and negating a conventional need for providing on-site operations personnel.

Figure 34:
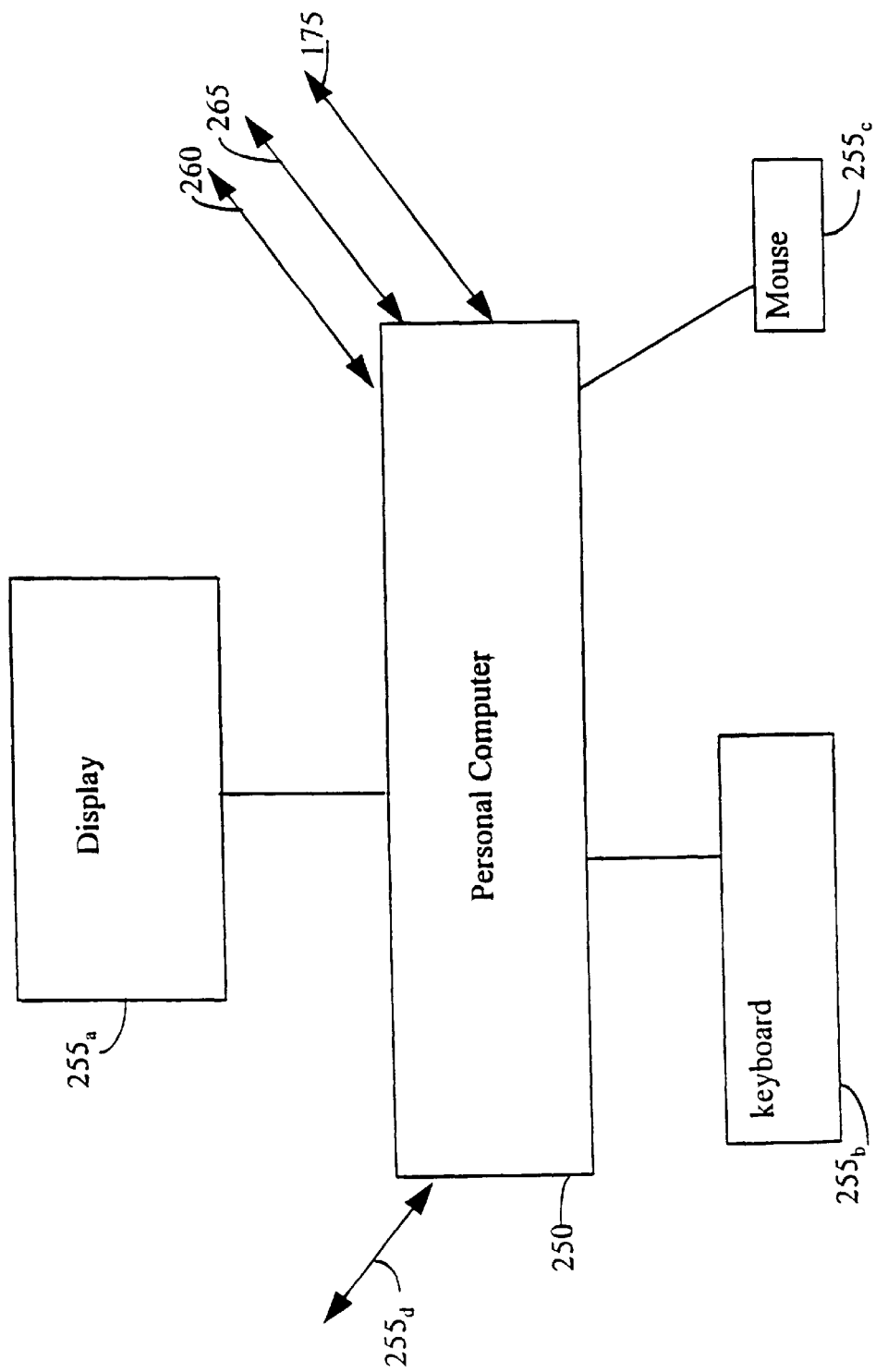
FIG. 34 is a perspective view of a slave controller and system input/output interface.

The slave controller and system I/O interface 250 also discussed in reference to FIGS. 34–35b is a Packard Bell 120 MHz Pentium™ computer using the Microsoft Windows NT operating software, although other CPU-based systems and operating systems would be adequate in light of the present description. The slave controller and system I/O interface 250 includes a network port for connecting to a network 265, examples of which include a fiber distributive data interconnect (FDDI), an Ethernet, an integrated-services digital network (ISDN, which is preferred), asymmetrical digital subscriber line (ADSL), Firewire (IEEE 1394), Universal Serial Bus (USB), and an RJ-11 jack for connection to a public switched telephone network (PSTN) 260.

A central network manager (also discussed in reference to FIG. 36) is located at the main transmitter 1 (FIG. 1) and employs a Sun Microsystems Sparc 20 Workstation operating a Hewlett Packard HPOpenview® network management application. Additionally, an authorized user employing a conventional personal computer can remotely access the booster system 100 via the PSTN 260. The slave controller and system I/O interface 250 recognizes the entry of the network manager and the remote user and permits them to receive information as contained in a management information base (MIB), which is unique to the particular MMDS network that uses the booster systems 100. Accessing MIB information and remotely controlling the booster system 100 is accomplished via simple network management protocol (SNMP) "GET," "SET," and "TRAP" commands.

The slave controller and system I/O interface 250 includes a user interface 255 which is a cathode ray tube (CRT) display, a keyboard, a mouse or the like for a data entry device (see FIG. 34).

Figure 5B:
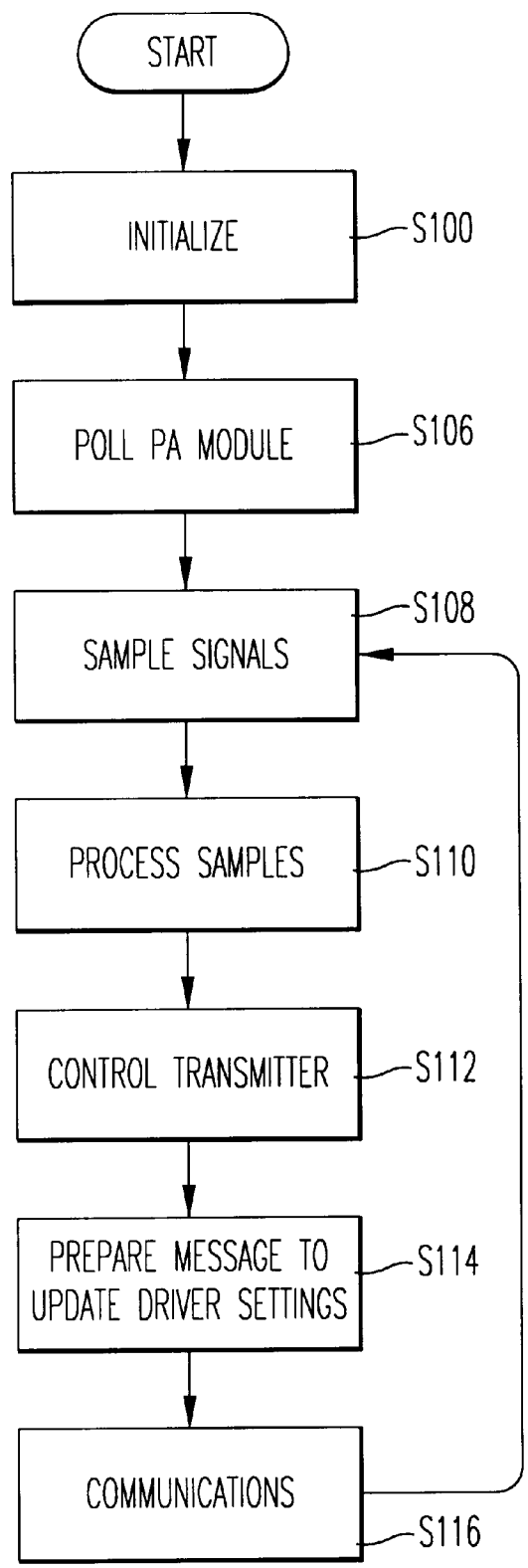
FIG. 5B is a flowchart of a control process performed by a redundant system controller according to the first embodiment.

FIG. 5B is a flowchart of a process implemented by the redundant system controller 200 (FIG. 5A) that is one component of the system-level automatic level control of the system 100 (FIG. 5A). The process starts in Step S100 where the redundant system controller 200 is initialized by retrieving specific initialization values and initializing other processors in the system 100. The process then proceeds to Step S106 where the redundant system controller 200 polls respective PA modules in the modular power amplifier 300 so as to determine the operational status of each of the PA modules. Based on the results of the polling step S106, the redundant system controller 200 identifies a number "N" of operational PA modules that will be used later for determining a system output power range in which the system 100 should operate. While the process illustrated in FIG. 5B shows the control flow for a power-up sequence, the step S106 may also be performed in response to an interrupt request or a message from an individual PA module indicating that a change in an operational status has occurred.

The process subsequently proceeds to Step S108 where samples are obtained from respective components of the system 100 (such samples of fan speed, open door status, respective states of the PA modules, etc.). The process then proceeds to Step S110 where processes are performed on the respective samples in order to determine respective operational states of the respective components in the system. Based on the results of Step S110, the process proceeds to Step S112, where the redundant system controller 200 executes control over the transmitter system based on the results of the Step Silo. Sequential to Step S112, or coincident therewith, the redundant system controller 200 prepares a message to be sent to the driver 115, 120, reporting the results of the polling step S106. In particular, the redundant system controller 200 forms a message held in a register implemented in semiconductor (or the like) that indicates the number of operational PA modules and later sends the message, in step S116, to the driver 115, 120, where the number "N" is used to adjust a system output power according to the number of operational PA modules. The structure of the message will be described with respect to FIG. 5C.

After Step S112, the process proceeds to Step S114 where the redundant system controller 200 prepares a message that contains the number "N" of operational power amplifier modules. Subsequently, in Step S116, the process sends the message and additional messages to other system components so as to exert control and monitor the status of the respective components. The process then returns to Step S108 where additional samples are taken. Consequently, the redundant system controller performs a main loop that includes Steps S108, S110, S112, S114, and S116, and continues in the main loop until an interrupt or priority message is received that requires the redundant system controller 200 to temporarily exit the main loop.

Figure 5C:
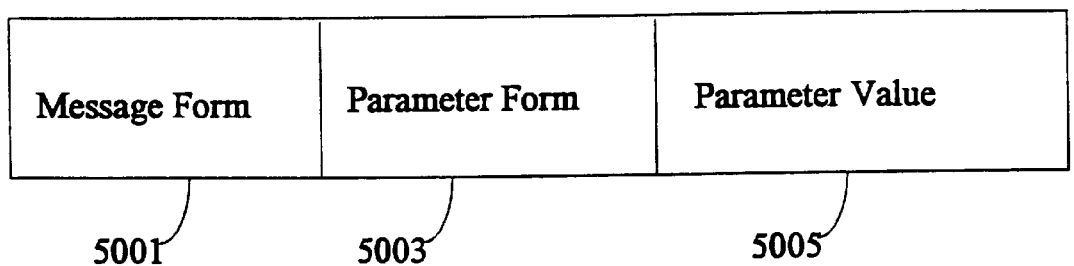
FIG. 5C is an illustrative diagram of a data structure of a transmission frame used to hold and convey message information within the modular broadband booster system.

FIG. 5C shows a data structure of a message in the form of a transmission frame that is formed by the redundant system controller 200 and other processors for communicating information amongst the respective processors in the system 100. In the illustrated data structure, each transmission frame includes a first data field 5001 that is one byte in length and defines a form of a message that is to be transmitted from one element in the system 100 to another element. Adjacent to the first field 5001 is a second data field 5003 that is one byte in length and defines a form of a parameter conveyed by the message. At the end of the transmission frame, a two-byte third data field 5005 is formed and includes a parameter value that is associated with the form of the parameter held in the second data field 5003. While the data structure described above defines a transmission frame that is four bytes in length and having three fields, other message conventions may be used. A first alternative includes a transmission frame having two data fields defining the message type and parameter in the first field and the parameter value in the second field. A second alternative includes a first transmission frame that defines a type of message to be received followed by one or more additional frames that carry one or more updated parameter values.

The transmission frame illustrated in FIG. 5C is used by the redundant system controller 200 to convey the polling result of Step S106 (FIG. 5B) to driver 115, 120. In this case, the redundant system controller 200 forms the transmission frame of FIG. 5C in a semiconductor memory register. The first data field 5001 indicates the message is of a "set parameter" type; the second data field 5003 indicates that the parameter to be set is the number "N" of operational PA modules that are active in the modular power amplifier 300; and the third data field includes a value indicative of the number "N" of operational PA modules. The driver 115, 120 receives and stores the message in memory, and analyzes the contents of the respective data fields 5001, 5003, 5005 so as to determine the number of operational PA modules. As will be discussed with respect to FIG. 9B, the driver 115, 120 determines the expected system output power that should be observed based on the number of operational PA modules and, if necessary, adjust an input power so as to keep the system output power within a predetermined range. The data structure of FIG. 5c is similarly used to convey status messages, control message and other messages between any of the processors in the system 100.

FIG. 6 shows the frequency bands processed by the modular broadband booster system 100. Channels within the MMDS (wireless cable) structure are divided generally into three groups, F1, F2, and F3. The first group, F1, includes two 6 MHZ channels identified as MDS1 and MDS2 which provide a multi-point distribution service. The channels in the F1 frequency band are processed and amplified by the MDS transmitters 520. (FIG. 5A). The second group of channels F2 are non-contiguous with the frequency band F1 and includes 20 ITFS 6 MHZ channels and 8 MMDS 6 MHZ channels. The third group of channels, F3, include three 6 MHZ channels that are interspersed between ITFS channels G1–G4, and identified as OFS H1, H2, and H3. The frequency bands F2 and F3 are amplified by the drivers 115, 120, the 1/16 power divider 130, the modular power amplifier 300, the radial combiner 400 and the output coupler 500, as shown in FIG. 5A. Each of the 33 channels shown in FIG. 6 is capable of holding a single 6 MHZ National Television System Committee (NTSC) analog television signal or several digital television signals. If desired, the invention may be specifically constructed for the above-frequencies and NTSC signal, although the invention may also be constructed for other frequencies and types of signals, as desired (e.g., personal communication system, PCS, head-end transmitter applications and the like).

Figure 7:
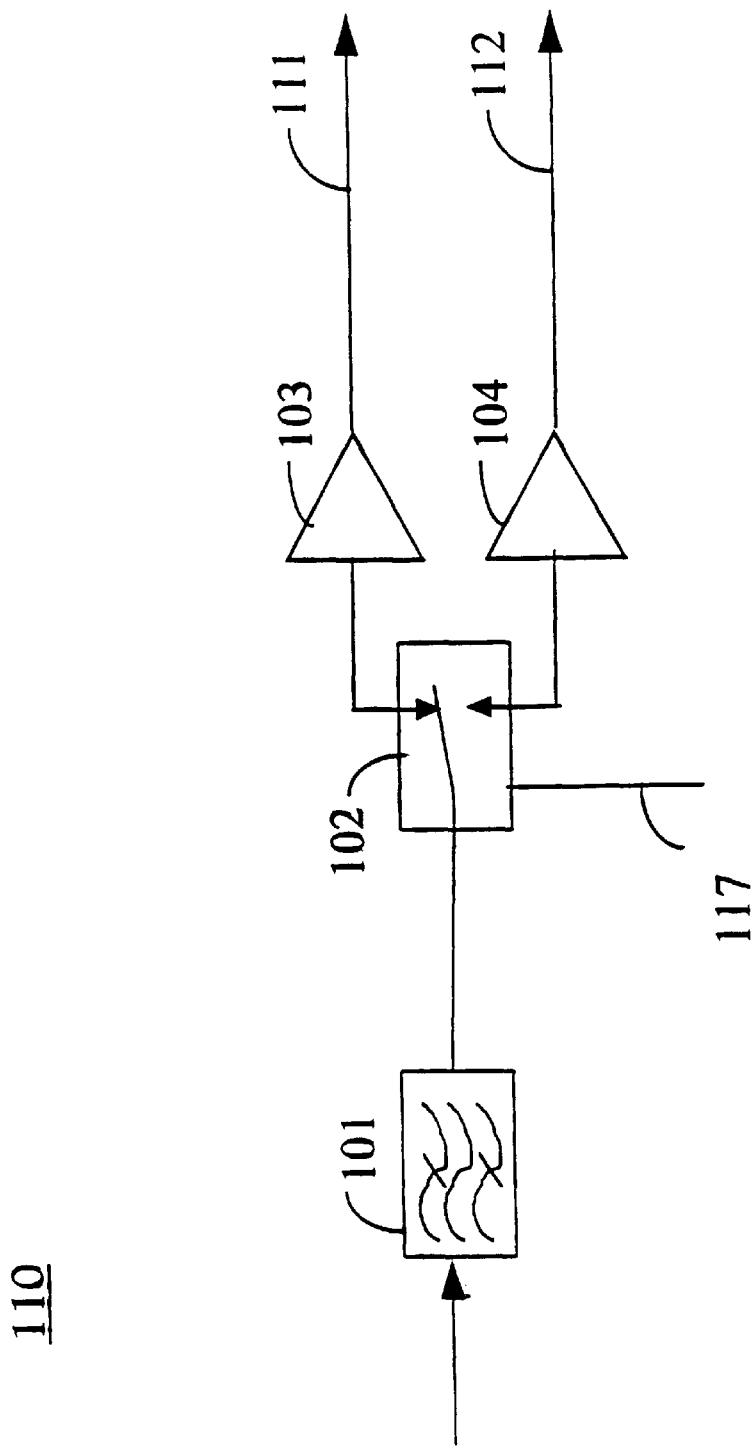
FIG. 7 is a block diagram of a redundant low noise amplifier.

FIG. 7 is a block diagram of the redundant low noise amplifier (LNA) 110. Signals input through the input antenna 105 (FIG. 5A) are passed through a preselection filter 101 which is centered around the MMDS frequency band (see FIG. 6) and excludes out-of-band interference. An output of the preselection filter 101 is passed through a switch 102 which is controlled by a line 117, originating from the drivers 115, 120. Toggling the switch 102 enables/disables, respectively, a first amplifier 103 and a redundant second amplifier 104 (although only one amplifier is required in the present embodiment). The amplifiers 103 and 104 are LNAs which boost the input RF signal by several dB and set a noise figure of the broadband booster system 100 to a low level such that the input RF signal will not become corrupted by noise produced within the broadband booster system 100. Because only one of the drivers 115, 120 is a master, at any given time, and has authority to control the LNA 110, there is no risk of the drivers 115, 120 sending conflicting signals over the line 117 (as will be discussed with respect to FIG. 9A. The two LNA amplifiers 103, 104 provide an additional level of redundancy in the booster system 100 architecture. Redundancy is desired because the LNA 110 is located at a top of a support pole, adjacent to the antenna 105 (FIG. 1), and thus is not easily accessible and repairable. Furthermore, unlike conventional booster systems, the booster system 100 not need to go off the air if an LNA amplifier 103, 104 fails because the other LNA amplifier 104, 103 is available on hot-standby status.

Figure 8:
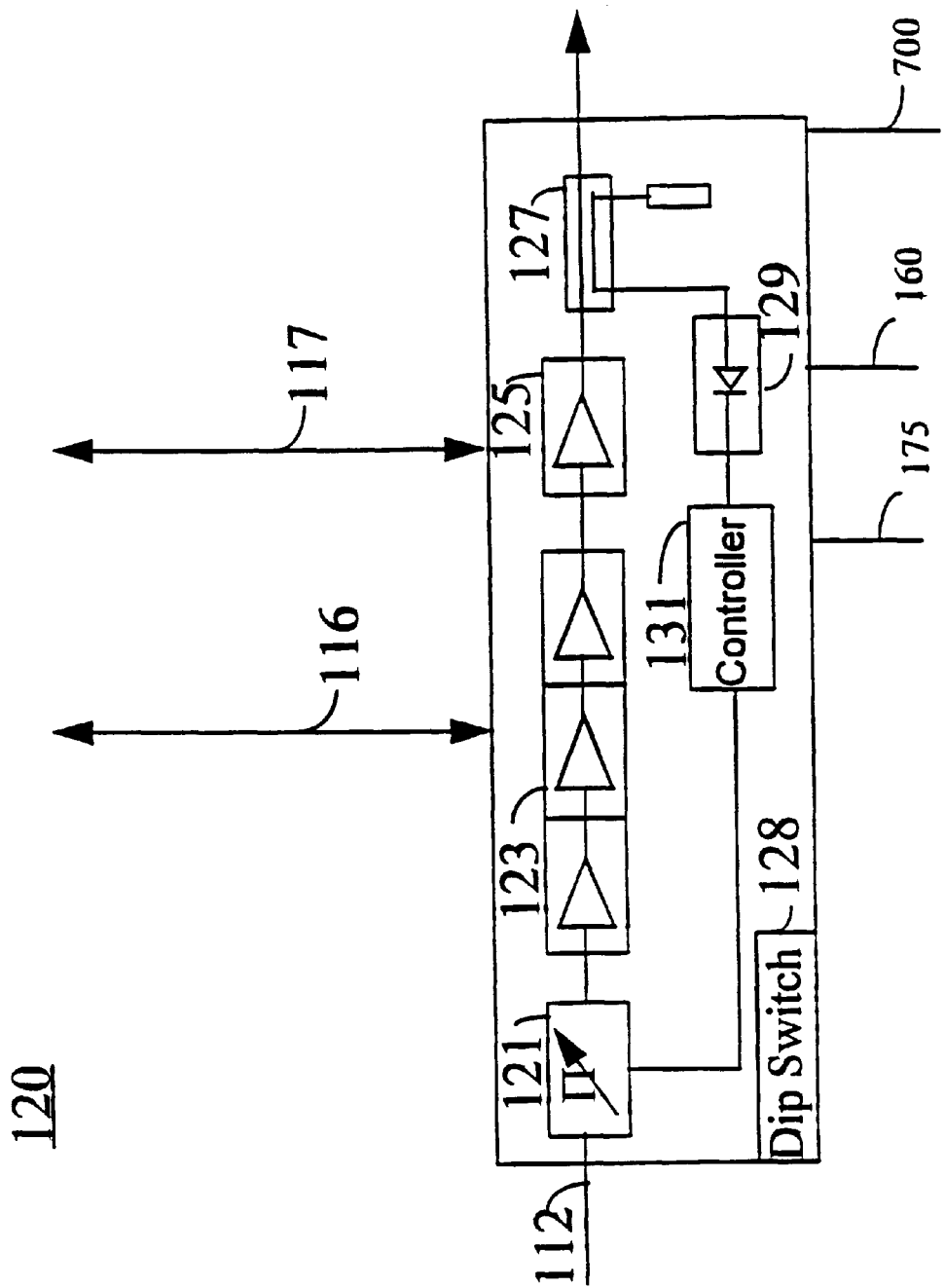
FIG. 8 is a block diagram of a driver circuit.

FIG. 8 shows the driver B 120 in more detail, which has the same structure as the driver A 115 although not shown in FIG. 8. An input 112 provided by the redundant LNA 110 (FIG. 5A) is input to a variable attenuator 121 which cooperates with a first gain stage 123 and a second gain stage 125 to provide a fixed gain setting of about 25 dB when combined with the LNA 110 assembly. An output of the gain stage 125 is fed through a sense port 127 which senses the output signal level and feeds the output signal level back through an envelope detector 129. The envelope detector 129 detects the output power from the driver B 120 and provides it to a MC68HC11F4FN controller 131 on a microcontroller board. The controller 131 adjusts the variable attenuator 121 by comparing the output of the envelope detector 129 with a stored threshold value held in memory on the microcontroller board, thereby allowing the driver B 120 to output a signal at a constant power level. The controller 131 also adjusts the variable attenuator 121 in response to information about a number of operational PA modules sent from the redundant system controller 200 (FIG. 5A) via the GNET serial bus 175, and feed back line 160, such that the output power of the modular broadband booster system 100 is controlled at the system level. A sampled signal (including forward and reflected power information) is fed back from the output coupler 500 (FIG. 5A) on line 160 so that if the sampled output power is less than a minimum threshold, which is held by the controller 131, the driver B 120 can adjust its attenuation and output a higher signal level (as will be discussed with respect to FIG. 9B, for example). Power is supplied to the drivers 115, 120 through line 700.

A control line 116 is used to coordinate master/slave status between the driver B 120 and the driver A 115. A set of signals corresponding to which of the drivers 115, 120 becomes the master and which becomes the slave are passed over the line 116 as well as other information including a remote turnoff capability which allows each of the drivers 115, 120 to turn off the other driver 120, 115. The line 116 is used to transfer fault information between the drivers 115, 120, RF output power measurements and an input power detection signal which is used to determine whether or not the LNA 110 is operating properly. Each of the input power detection and RF power monitoring and fault indicator signals are "cross-coupled" in that the signals are shared between the two drivers 115, 120.

The drivers 115, 120 include a dip switch 128 used to set one of the two drivers 115, 120 to be designated as the master upon initialization and the other designated as the slave. On power-on, reset, or another initialization event, the controller 131 checks a setting on the respective dip switch 128 to determine whether that driver 115, 120 is a master or a slave. When one of the drivers 115, 120 determines it is the master it begins performing a role of sending control signals to the LNA 110 and to the divider 130.

Because the drivers 115, 120 are redundant and coupled to one another, they are capable of switching from a slave state to a master state when the slave determines the master has failed. If, for example, the driver B 120 is initially the slave, but later determines that the driver A 115 has in some way failed, the driver B 120 issues a turnoff command through line 116 which turns off the master state of the driver A 115. Thus, the driver B 120 becomes the master and is capable of controlling the LNA 110 and driving the divider 130.

Figure 9A:
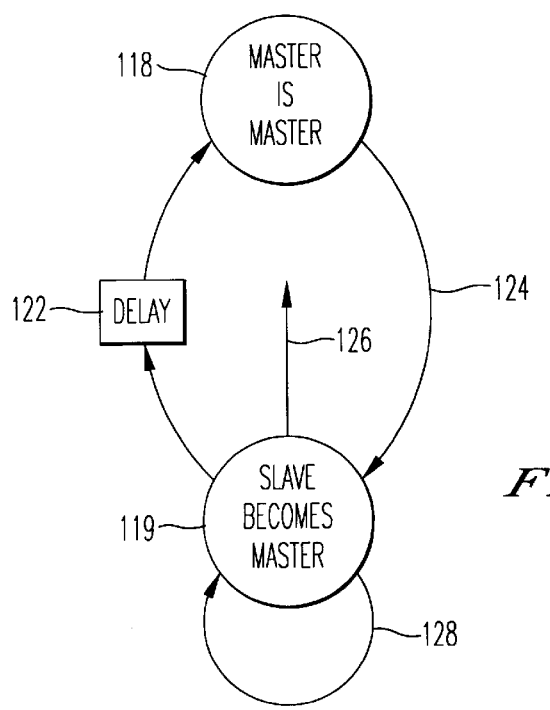
FIG. 9A is a state diagram illustrating transfer of master and slave control between two driver circuits.

FIG. 9A illustrates a control flow between the driver A 115 and the driver B 120. It is first noted, however, that the state diagram and the drivers 115, 120 will function to arbitrate master and slave status regardless of whether the GNET 175 network serial bus is functioning properly or not. In FIG. 9A, an initial state upon power reset is shown as state 118, where the respective driver 115, 120 (FIG. 8) which has been designated (by the dip switch, FIG. 8) as being the master, recognizes that it is the master. Once the selected driver determines it is the master, it is free to select one of the amplifiers 103, 104 in the LNA 110 (FIG. 5A) to amplify the input signal provided by the antenna 105.

Also in the state 118, the designated slave executes a software process which effectively monitors an RF power, an input power detection signal, and all fault signals issued by the respective master. Provided that the slave determines that each of the signals coming from the master is normal, the slave will remain the slave. However, suppose that the RF power fails in the master as evidenced by an input detection signal dropping below a given threshold. Under these circumstances, the slave will determine, upon detecting this drop, that the master driver has failed in some way. In response, the slave will turn off the master by issuing a turnoff signal 126 through the line 116. The master status then transfers (as indicated by arrow 124) to the former slave and the state of the drivers 115, 120 changes to state 119. In essence, this transfer of status from master to slave becomes a slave "revolt" and will occur when any combination of the three signals (RF power, input power detection, and fault signals) are determined by the slave to be abnormal. The slave will continue to monitor its own input signal 128 until it determines that the input signal is absent. If the slave does determine the input signal is absent, the slave will relinquish control back to the original master (i.e., return to state 118). However, in returning the master status to the original master, the slave will first be delayed by a delay 122 for a certain predetermined amount of time in order to prevent a rapid transfer of master and slave status between the drivers 115, 120 when no RF signal is present. Suppose there is actually no RF signal present, perhaps because the transmitter 1 of FIG. 1 is damaged, the delay 122 prevents the respective drivers 115, 120 from endlessly transferring the master status back and forth between the drivers 115, 120 as they attempt to diagnosis why no signal is being input from the antenna 105 and LNA 110. The delay 122 prevents the master status from rapidly transferring between the drivers 115, 120, but rather requires a fixed period of time (e.g., 0.5 seconds) before transferring master status back to the original master.

Figure 9B:
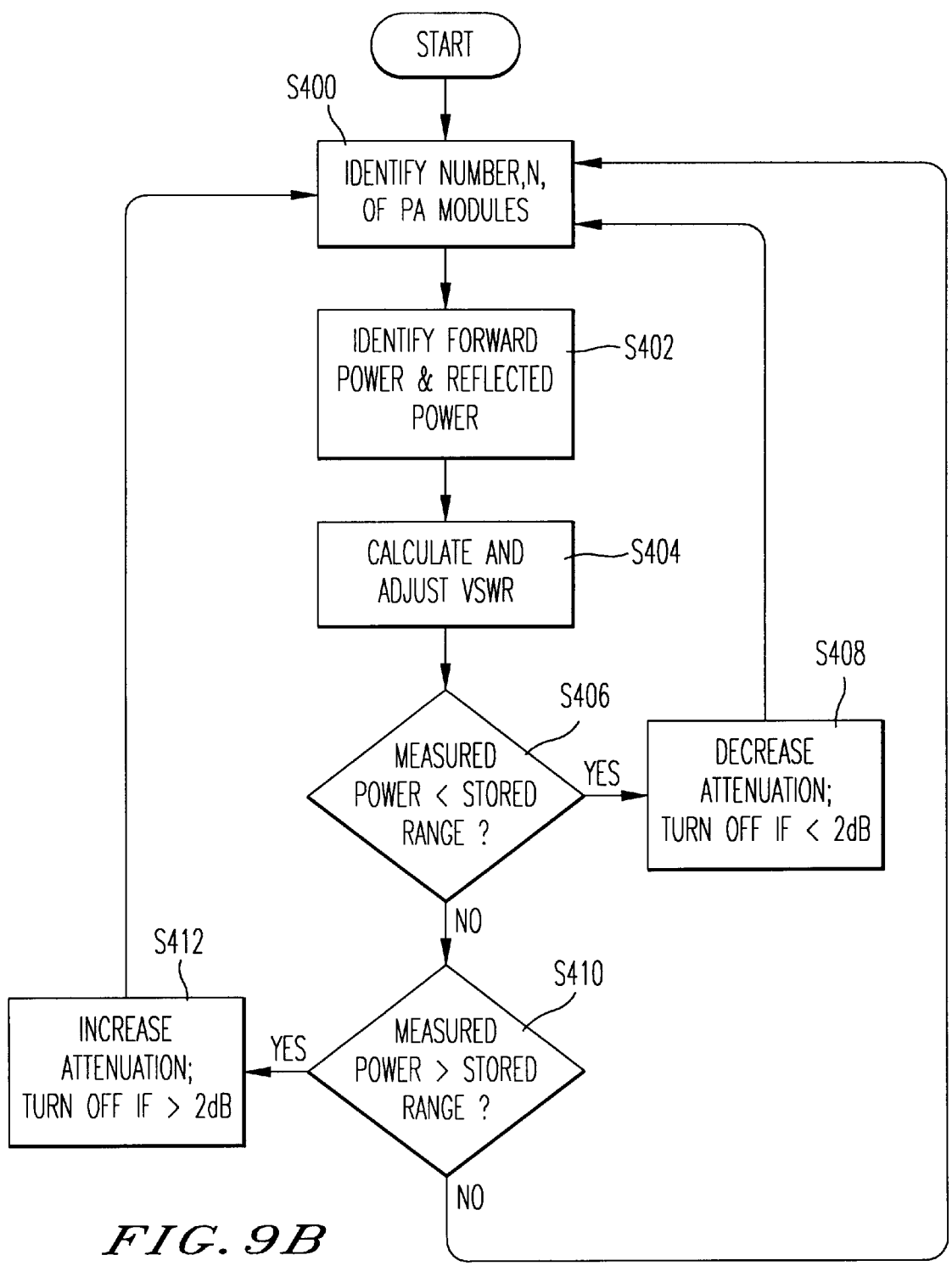
FIG. 9B is a flowchart of a system level automatic level control process that controls an amount of RF output power based on a number of operational power amplifier modules.

FIG. 9B is a flowchart illustrating a process implemented in the driver controller 131 (FIG. 8) which adjusts an overall power of the transmit system, based on a number of functioning PA modules, and an amount of forward and reflected power observed by a power sampler 501 in the output coupler 500. While the process of FIG. 9B is performed by the drivers 115, 120, the process may alternatively be implemented on another controller such as the redundant system controller 200. The process begins in Step S400, where the controller 131 analyzes a message sent from the redundant system controller 200, where the message contains an indication of the number "N" of operational PA modules. Alternatively, the controller 131 may itself identify which of the respective PA modules are operating by polling the respective PA modules or monitoring respective status conditions of the PA modules. In Step S400, the controller 131 analyzes a third data field 5005 (FIG. 5C) of the message and identifies the number "N" of PA modules that are presently in a transmit state and otherwise contribute to the total system output power.

After Step S400, the process proceeds to Step S402 where the forward and reflected power from the output coupler 500, as detected by a power sampler 501 (FIG. 10), are monitored. The power sampler 501 (FIG. 10) is calibrated by a factory calibration procedure, or another suitable calibrating technique, so as to provide a 1.4 VDC signal when all of the PA modules are functioning. For example, when 16 PA modules are functioning, a composite single carrier output power is 200 W, which in turn produces a 1.4 VDC signal from the power sampler 501. If less than 16 PA modules are functioning, then a less than 1.4 VDC signal will be produced. The process then proceeds to Step S404, where the VSWR is calculated by the controller 131 based on the forward and reflected power measurements provided by the power sampler 501. If the calculated VSWR exceeds a predetermined threshold (e.g., 20%) for a predetermined amount of time (e.g., 1 minute), the controller 131 sends a fault message to the redundant system controller 200 (FIG. 5A), notifying the redundant system controller 200 that a potentially damaging amount of reflected power has been observed so that the redundant system controller 200 may take corrective action.

After Step S404, the process proceeds to Step S406 where an inquiry is made regarding whether the measured forward power is less than a range that is stored in memory (internal or external to the controller 131). A separate range of output power is stored in the memory for different numbers of N, such that the range of acceptable output powers associated with N=16 will be greater than the range associated with N=15, 14 . . . . If the response to the inquiry in Step S406 is affirmative, the process proceeds to step S408, where the controller 131 sends an adjustment signal to the adjustable attenuator 121 so as to decrease the attenuation (which is normally about 3 dB within a range of 0 dB to about 15 dB) by an amount that will bring the measured output power into a middle of the range associated with the number N of operational PA modules. However, if the measured power is more than 2 dB below the middle of the range, the controller 131 sends a fault signal to the redundant system controller 200, so that redundant system controller can take corrective action and turn the entire system off, if necessary. After Step S408, the process returns to Step S400 where the controller once again checks for the number of operational PA modules.

If the response to the inquiry in Step S406 is negative, another inquiry is made in Step S410 regarding whether the measured forward power is greater than a predetermined number in the stored range associated with the number N of operational PA modules. If the response to the inquiry in Step S410 is affirmative, the process proceeds to Step S412 where the controller 131 causes the amount of attenuation imparted by the attenuator 121 to be adjusted by an amount that makes the measured power fall in the middle of the range associated with the number N of operational PA modules. Similarly, if the output power exceeds a predetermined amount, e.g., 2 dB, the controller 131 issues a fault message to the redundant system controller 200 to take corrective action and perhaps power-down the system. Subsequently the process returns to Step S400.

FIG. 10 illustrates the modular, reconfigurable architecture of the modular power amplifier 300 and its interconnection with the 1/16 power divider 130, the radial combiner 400, and the output coupler 500. Preferably 16 signals are output from the 1/16 power divider 130 and accepted by the modular power amplifier 300. While 16 signals are preferred, the modular broadband booster system 100 is capable of employing a N-way divider 130, a N-way modular power amplifier 300, and a N-way radial combiner 400. The modular power amplifier 300 includes a power amplifier housing assembly 301 which is two chassis, although one housing or more than two housings would be sufficient, and 16 power amplifier "slices" (PA slices), $310_1$–$310_{16}$. The inventors coined the term "slice" because when placed next to one another in a chassis, the PA modules resemble slices of bread in a bread loaf.

Each of the PA slices $310_1$–$310_{16}$ are constructed identically, and provide independent amplification paths for input signals applied thereto. The PA slices $310_1$–$310_{16}$ communicate with other components of the booster system 100 via the GNET serial bus 175 which provides two-way communication between the individual PA slices $310_1$–$310_{16}$ and other components of the modular broadband booster system 100. A local bus 176 provides an internal communication path within the modular power amplifier 300. The local bus 176 is a serial peripheral interface (SPI) bus because the SPI bus is closely associated with Motorola Corporation's MC68HC11F4FN microcontrollers, which are the preferred microcontroller (FIGS. 14 and 19) used in each of the PA slices $310_1$–$310_{16}$. However, other local bus structures and microprocessors would be suitable. The local bus 176 and the GNET serial bus 175 connect to the individual PA modules $310_1$–$310_{16}$ via circuit board connectors used for connecting boards to buses and backplanes.

The amplified output signals from the PA slices $310_1$–$310_{16}$ are passed through the power amplifier housing assembly 301 and provided to a set of respective connectors $302_{1-16}$, which are mounted on the power amplifier housing assembly 301. Connecting to each of the respective connectors $402_1$–$402_N$ is a corresponding semi-rigid line $401_1$–$401_{16}$ which connect the respective PA slices $310_1$–$310_{16}$ to the radial combiner 400. Each of the semi-rigid lines $401_1$–$401_{16}$ is preferably a Teflon dielectric cable and having a specified length corresponding to the MMDS frequency range, MMDS bandwidth and mechanical packaging constraints for packaging the PA slices $310_1$–$310_{16}$ proximate to the radial combiner 400. The length of each of the semi-rigid lines $401_1$–$401_{16}$ is set such that individual PA slices $310_1$–$310_{16}$ may be removed from the power amplifier housing assembly 301 if for some reason that particular PA slice fails. Accordingly, each of the semi-rigid lines $401_1$–$401_{16}$ is desirably within the range of 21 cm to 30 cm in length and preferably 25.4 cm.

Figure 37C:
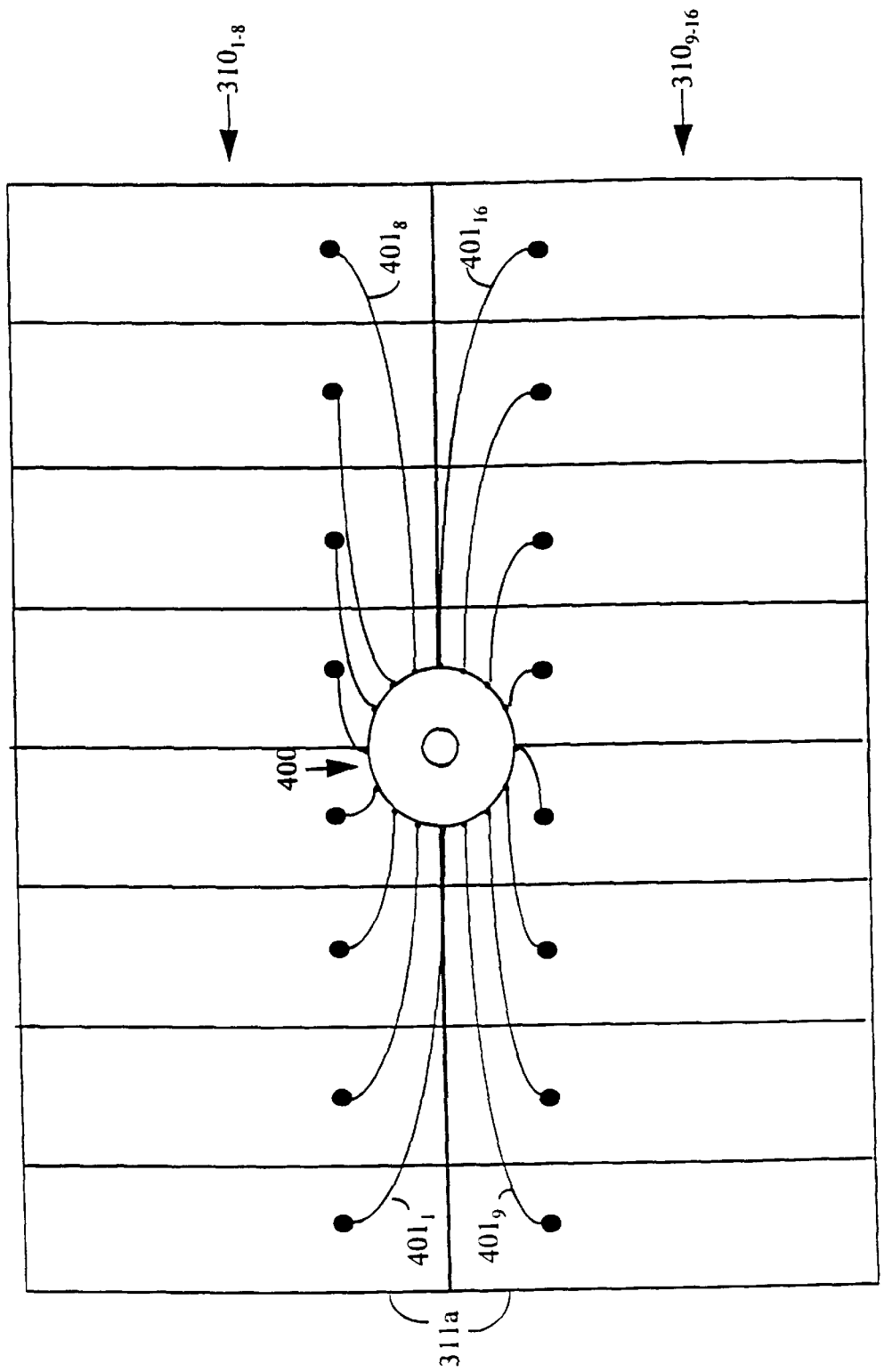
FIG. 37c is a back view of sixteen rack-mounted PA slices and a radial combiner.

The low end of the semi-rigid line length range is primarily based on mechanical considerations where, each of the PA slices 310 are mounted in an equipment rack 900 (discussed with respect to FIGS. 37a, 37b, and 37c), and the radial combiner 400 is mounted behind the PA-slices 310 in the rack 900 (FIGS. 37b and 37c). The length of the semi-rigid lines $401_1$–$401_{16}$ must be sufficiently long in order to connect the radial combiner to the individual PA slice modules. In order to reduce the length of the semirigid lines $401_1$–$401_{16}$, PA slices $310_{9-16}$ are mounted "up-side down" in the rack 900, as shown in FIGS. 37a, 37b and 37c. This permits semi-rigid lines $401_{9-16}$ to be placed closer to the radial combiner 400 than if PA slices $310_{9-16}$ were mounted "right-side up". When the PA slices $310_{1-16}$ are positioned as shown in FIGS. 37a–37c, the length of 25.4 cm for the semi-rigid lines $401_{1-16}$ is sufficient to connect each of the PA slices 310 to the radial combiner 400.

The upper end of the desirable range of the semi-rigid line lengths is established by a phase length restriction of each of the semi-rigid lines 401 such that a maximum output power is delivered by each of the semi-rigid lines 401. In order to deliver a maximum output power, a phase length of 1.86 cm in each of the Teflon dielectric cables should be set to correspond with a center of the MMDS band (2.593 GHz). Because 1.86 cm is too short of a length to connect each of the PA slices 310 to the radial combiner 400, a phase length of each of the cables must be increased in increments of the phase length of each of the semi-rigid lines 401, where the phase length at 2.593 GHZ is 3.93 cm, and is ½ of the wavelength at 2.593 GHz. Thus, the desired length of each semi-rigid line 401 is set to 6 wavelengths plus the offset of 1.86 cm so as to provide maximum output power from each line. If the cable lengths were made too long, a phase rotation of frequencies at an upper end of the MMDS frequency band (i.e., 2.686 GHz) and at the low end of the MMDS frequency band (2500 MHZ), would be offset from optimal power matching conditions and create a risk of high VSWR developing at the connections between the PA lines 310 and the corresponding semi-rigid lines 401. Because each of the semi-rigid lines 401 is optimized for the center frequency 2.593 GHz, as the length of the semi-rigid lines 401 increases, the absolute amount of phase offset at the high frequency (2686 MHZ) and the low frequency (2500 MHZ) also increases by a proportional amount. It is undesirable for the absolute amount of phase offset for the upper frequency and the lower frequency to be significant because an observed voltage standing wave ratio (VSWR) will become substantial for significant phase offsets and thus will create the possibility of a voltage breakdown at a connection between each of the PA slices 310 and the semi-rigid lines 401.

The combination of the fixed input impedance of the radial combiner 400, the modularity of the power amplifier 300 and semi-rigid lines 401, and an ability to control power level and number of modules, via a local system controller or a remote network controller, allows the booster system 100 to be reconfigured for various applications. In particular, the above combination permits the booster system 100 to degrade gracefully, such that should one of the respective PA slices $310_1$–$310_{16}$ fail, the booster system 100 can operate with only 15 or fewer of the PA slices $310_1$–$310_{16}$ operating, which in the case of N=16, results in a loss of about 0.3 dB in output power. For example, suppose the PA slice 1 ($310_1$) fails, its failure will be detected at the module level (i.e., the PA slice 1 will detect a fault condition), at the system level (i.e., the Redundant System Controller 200, FIG. 5A, will detect the fault condition), and at the network level (i.e., the MMDS network controller that controls the booster system 100 via the Network 265, FIG. 5A, will detect the failure). The initial fault condition will be transmitted as a fault signal and issued through the GNET serial bus 175 where the redundant system controller 200 (FIG. 5A) will, for example, turn off the PA slice 1 ($310_1$). Alternatively, a technician by viewing a front panel display and I/O (FIG. 13) on PA slice 1 ($310_1$) showing that the PA slice has failed (e.g., perhaps by producing an abnormally low output power as a result of one of several power field effect transistors failing), can locally turn off PA slice ($310_1$) and remove the failed slice while each of the other PA slices $310_2$–$310_{16}$ are still functioning. Furthermore, the network manager can detect and control the status of the PA slice 310, via the network 265. The ability to support "hot-swapping" of PA slices 310 is a direct result of the arrangement of the radial combiner 400, lengths of the semi-rigid line 410, addition of a processor on each PA module and positioning of the PA slices $310_{1-16}$ with respect to the radial combiner 400, which combine to minimize VSWR to each of the functioning PA slices 310 when a failed PA slice is removed.

In contrast to conventional combiners, such as Wilkinson combiners, the present system permits individual ones of the PA slices $310_1$–$310_{16}$ to be removed from the chassis 301 while the other PA slices 310 are still functioning (i.e., the PA slices 310 are "hot swappable"). With conventional combiners combining two or more high power amplifiers, all of the high power amplifiers must be turned off in order to replace a failed high power amplifier. Furthermore, in the conventional combiner, there would be a substantial risk of personal injury and risk of damaging the other power amplifiers and the combining network due to a development of high, breakdown-level voltages on respective connections to the power amplifiers and the Wilkinson combiner. In contrast, the modular shown in FIG. 10 will not develop breakdown voltages at the radial combiner 400 and a set of connectors $302_{1-16}$, and thus, damage results to other components in the power amplifier module 300 or the radial combiner 400, when one or more of the PA slices 310 are removed from the power amplifier housing assembly 301. Accordingly, the length and number of the semi-rigid lines 401, the number of inputs to the radial combiner cavity 400, will be specific, in this particular embodiment, to the MOS frequency range (FIG. 6).

The output coupler 500 accepts a single high power (about 800 W peak envelope power) input from the radial combiner 400 and prepares a high power output signal for transmission from an output antenna 550 (FIG. 5A) after first matching an output impedance of the radial combiner 400 with the output antenna 550. The output coupler 500 includes a power sampler 501 which samples the total available power and reflected power at the output coupler, although a bidirectional coupler may be used to sense reflected power and forward power and provide the forward and reflected power measurements to the drivers 115, 120. The output of the power sampler 501 is divided and distributed to the drivers 115, 120 through the feedback lines 160.

Figure 11:
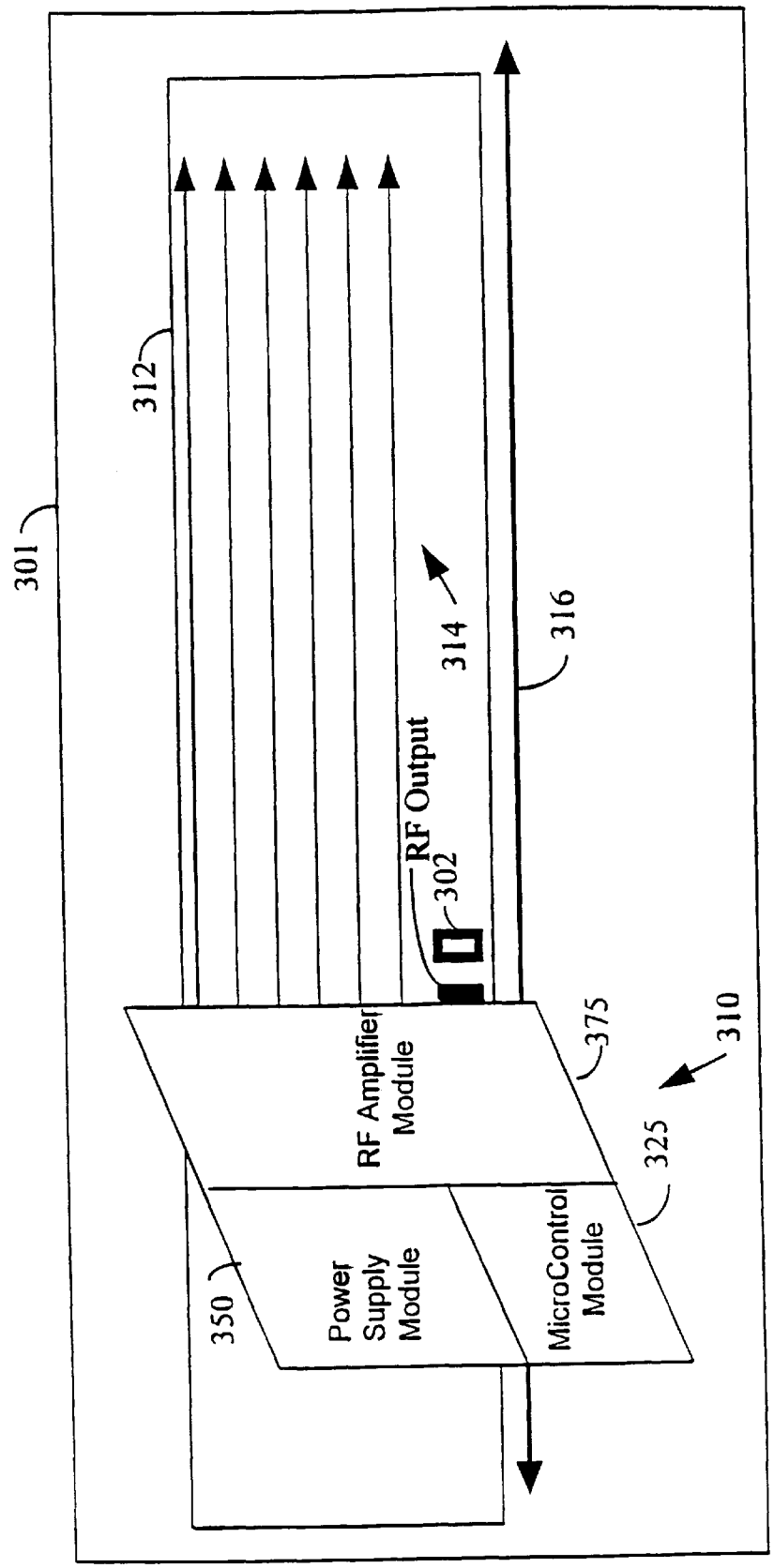
FIG. 11 is a perspective view of a PA slice interfacing to a backplane.

FIG. 11 illustrates how an individual one of the PA slices 310 connects to a backplane 312, both of which reside in the power amplifier housing assembly 301 (FIG. 10). The backplane 312 provides both structural and electrical connections for the PA slice 310. The PA slice 310 plugs into the backplane 312 by an operator inserting the PA slice 310 into the power amplifier housing assembly 301 and pressing the PA slice 310 onto backplane connectors (not shown). Once connected, the PA slice 310 is electrically interfaced with the backplane 312. Other slices (see FIG. 13) will attach to the backplane 312 in a similar manner as the slice 310 shown in FIG. 11.

The backplane 312 includes a plurality of signal, control, power, and ground lines 314 which include: differential SPI serial communication lines; differential SPI address lines; GNET RS-485 serial lines; control master reset and standby lines; digital ground lines; analog ground lines; and +25 volts and +9 volts direct current (DC) voltages. Each of the signal, control, power and ground lines 314 are available to each of the PA slices 310 that connect to the backplane 312. The slice 310 also connects to line 316 which provides 220 volts rectified alternating current (AC) from which the slice 310 derives its own power used to perform the amplification process.

The slice 310 includes three modules: a RF amplifier module 375, a microcontroller module 325, and a power supply module 350 which includes a switching power supply. Combining a RF amplification circuit (e.g., the RF amplifier module 375) with digital logic (microcontroller module 325) and switching power supply on a single circuit board is contrary to conventional RF amplifier design practice because it is very difficult to prevent the RF signals from becoming corrupted by electromagnetic interference (EMI) created by the switching power supply and digital logic, as preventing the high power RF signals from disrupting digital logic circuitry. However, in order to provide the reconfigurability, reliability, and modularity offered by the booster system 100, the inventors determined it was preferable to combine the power supply module 350, microcontroller module 325, and RF amplifier module 375 in a single PA slice 310 assembly. However, to preserve the integrity of digital signals passed along the backplane 312, the output high power output from the RF amplifier module 375 is not passed through the backplane 312, but rather is received by I/O connectors 302 (e.g., push-on semi-rigid SMA-type connectors) formed in the power amplifier housing assembly 301. Each of the PA slices 310 amplifies the frequency range of 2500 MHZ to 2686 MHZ (F2 and F3 from FIG. 5A) of the MMDS frequency band.

Figure 12:
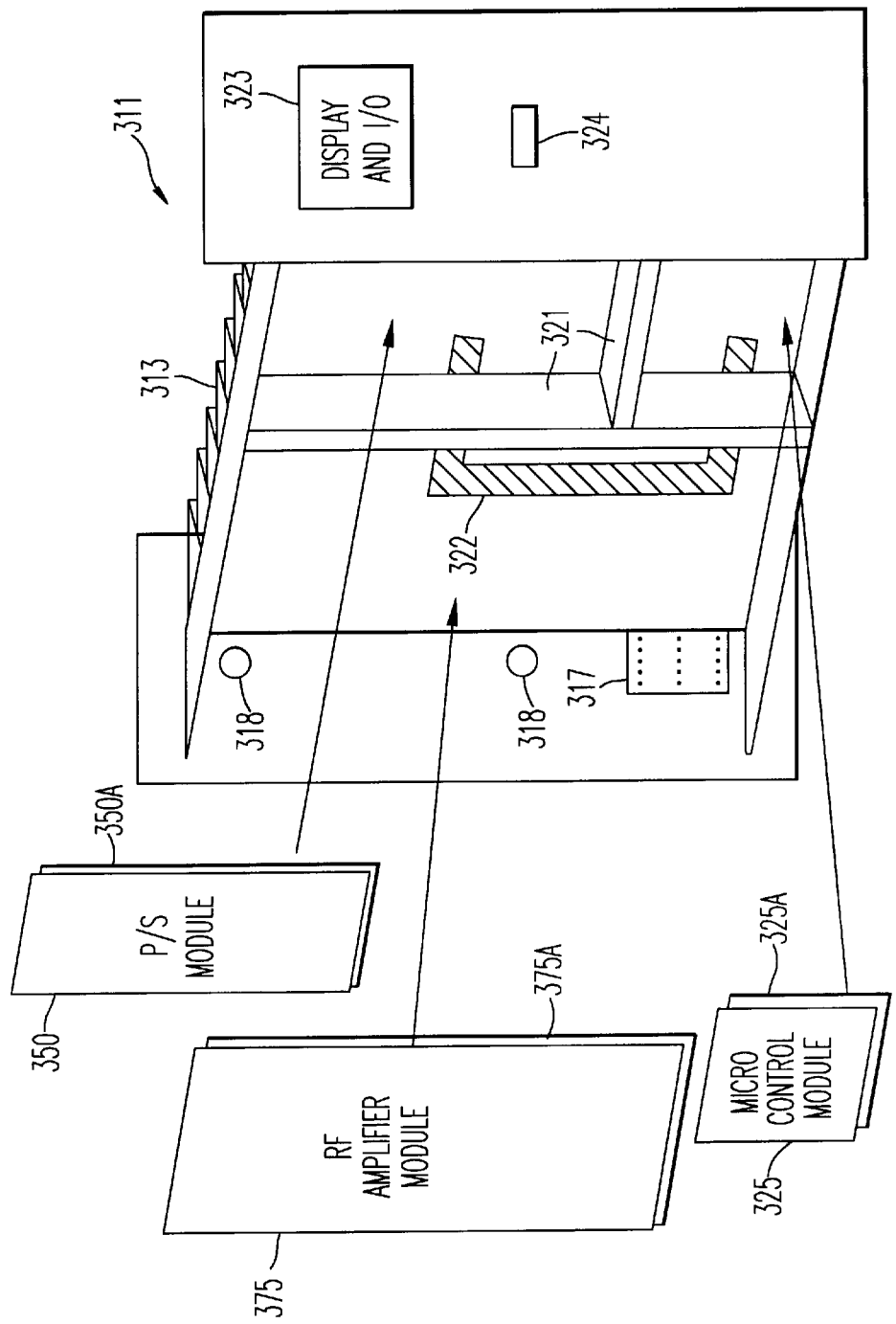
FIG. 12 is an exploded diagram of a PA slice.

FIG. 12 shows the mechanical and electromagnetic interference (EMI) structural architecture for the PA slice 310. A housing assembly 311 includes a front panel display and I/O 323 which is used by an operator as a local user interface. A display portion of the front panel display and I/O 323 is a LED, although an LCD, plasma, CRT and other displays would be suitable for providing more detailed information about the specific PA slice 310. An I/O portion of the front panel display and I/O 323 is a 12 position flexible membrane touch panel used to input data and control signals to the specific PA slice 310. The housing assembly 311 also includes an interlock enable/disable switch 324, which is used by a local operator to disable the PA slice 310 before removing or inserting the PA slice 310 into the power amplifier housing assembly 301 (FIG. 10). The interlock enable/disable switch 324 prevents an operator from inadvertently being injured or damaging the PA slice module by removing the module from the power amplifier housing assembly 301 while power is applied to the PA slice module. The housing assembly 311 also includes a heat sink 313 formed on a back portion of the assembly 311 for dissipating heat from the PA slice 310. As an additional feature, a front metallic cover plate covers the assembly 311 such that the modules 325, 350, and 375 are enclosed.

The housing assembly 311 includes EMI isolation shields 321, preferably aluminum, but other materials are possible, which divide an internal space of the housing assembly 311 into three compartments for respectively hosting the RF amplifier module 375, the power supply module 350, and the microcontroller module 325. The EMI isolation shields 321 provide electromagnetic shielding between the respective modules and thus help reduce contamination of the RF signal when passed through the RF amplifier module 375. Likewise, radiated emissions of digital and power supply noise are confined within their respective compartments. A pair of I/O connectors 318 and a backplane connector 317 are provided on a back portion of the assembly 311 for providing RF, digital and power connections to other system components.

As an added measure of EMI protection, within a surface of the assembly 311, a milled EMI isolation channel 322 is formed for receiving intermodule wiring harnesses. The milling is approximately 2–3 mm deep and has approximately the same width as the wiring harnesses (which varies in the preferred range of 0.1 cm to 2.1 cm) which fit therein. Each of the respective modules 350, 375, and 325 include a flexible EMI isolation shield (preferably made from a Kapton flex material) which is laminated to a back portion of each of the respective modules 325, 350, 375. The lamination portions 350A, 375A, and 325A, as shown in FIG. 12, are made of the KAPTON flex material and provide a high amount of EMI isolation from the digital signals passed between the respective modules and sent through the wiring harnesses disposed in the milled EMI isolation channels 322. In addition to the EMI advantages, the milled EMI isolation channels 322 allow the harness to be recessed into the assembly 311 such that the modules 325, 350, and 375 have respective flat surfaces on which to lie. This arrangement provides a stronger mechanical connection between the modules 325, 350, and 375 and the assembly 311, as well as a flat surface for positioning the EMI isolation shields 321 so as to prevent gaps in which EMI can leak between respective module compartments.

Figure 13:
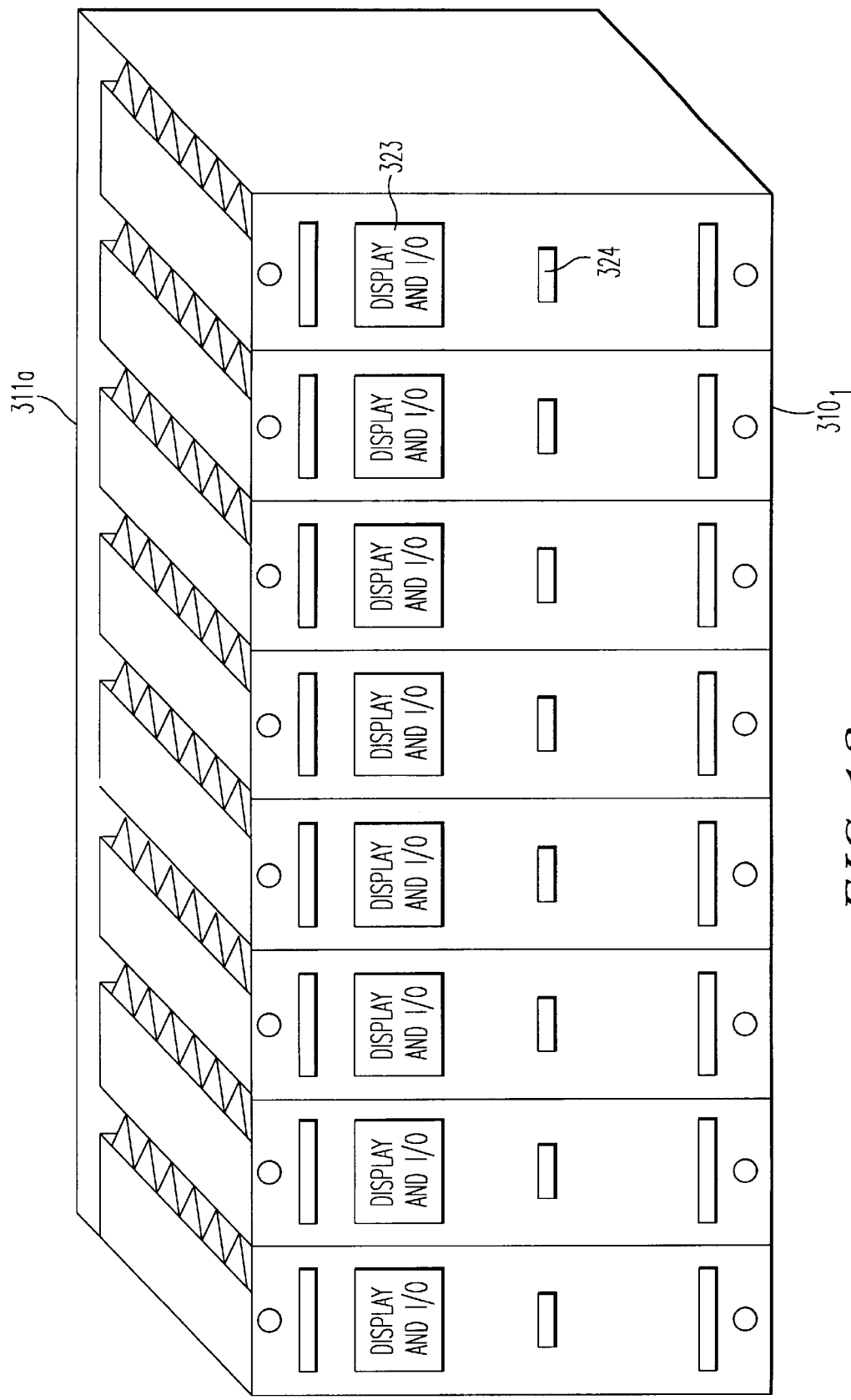
FIG. 13 is a perspective view of several PA slices in a chassis.

FIG. 13 shows the PA slice $310_1$ next to seven other of the PA slices $310_{2-8}$. Each of the respective PA slices are placed within a subchassis 311A which is suitable for holding 6 U (i.e., "U" being an industry standard measurement of circuit board size) circuit boards. From FIG. 13 it is clear that if one of the PA slices 310 fail, and a fail (or fault) message is displayed on its corresponding display 323 (e.g., by illuminating an LED), a service technician is provided with a clear indication of which of the failed PA modules has failed. Once the technician identifies the PA slice which has failed, the technician will first press the interlock switch 324 which removes power from the PA slice $310_1$. Once the power is turned off, the technician may easily slide the respective failed assembly 310 from the subchassis 311A and replace the failed PA slice $310_1$ with a new PA slice 310. This maintenance operation can be performed while each of the other PA slices 310 continue to function. Thus the modular broadband booster system 100 need not be turned off in order to replace an individual PA slice 310. A similar subchassis 311 is utilized with the PA slices $310_{9-16}$. In order to minimize the length of the semi-rigid lines 401, the up/down orientation of one subchassis 311A is opposite to that of the other rack (see FIGS. 37a–37c). However, if the length of the lines 401 is not an issue, (e.g., for other frequency bands) it will not be necessary to have one rack upside-down as compared to the other.

Figure 14:
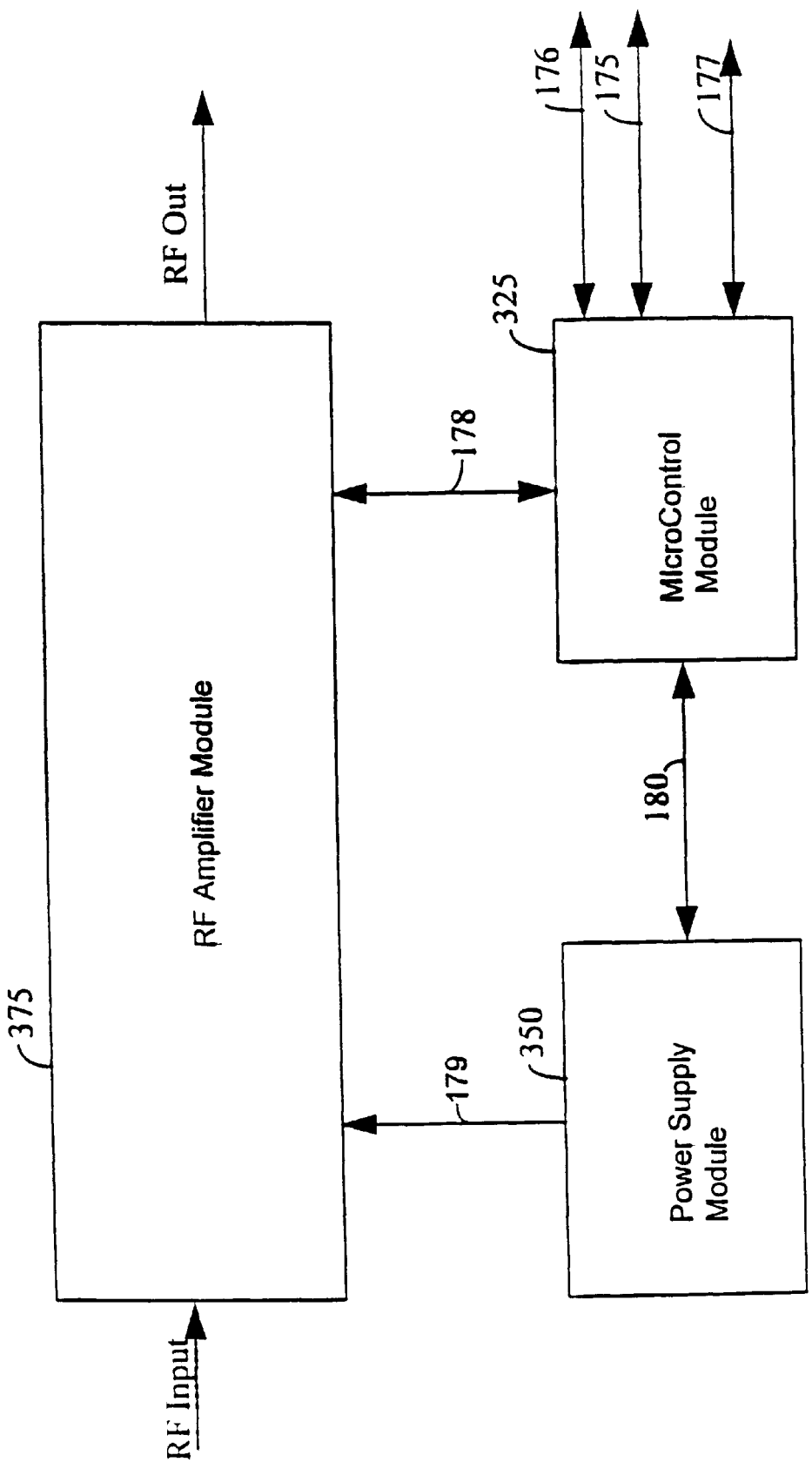
FIG. 14 is a block diagram of a PA slice.

FIG. 14 is a block diagram showing respective control and signal interconnections between the RF amplifier module 375, the power supply module 350, and the microcontroller module 325 for a particular PA module 310. The RF amplifier module 375 accepts an RF input signal and outputs an amplified RF output signal (RF out), and the power supply module 350 and the microcontroller module 325 do not directly process the RF input signal. Rather, the RF amplifier module 375 communicates with the microcontroller module 325 through an amplifier control harness 178 (see FIG. 16). Similarly, the RF amplifier module 375 communicates with the power supply module 350 via an amplifier power supply harness 179 (see FIG. 16). Communications between the microcontroller module 325 and the power supply module 350 are performed via a power supply control harness 180 (see FIG. 15).

As shown in FIG. 14, the microcontroller module 325 is also configured to communicate to other modules in the modular broadband booster system 100 via the SPI bus 176 and the GNET serial bus 175. Operation of the display and I/O 323 (FIG. 13) is performed through a RS-232 bus 177, although illuminating a LED in response to a fault condition is achieved by a hardwired connection to the microcontroller module 325.

Figure 15:
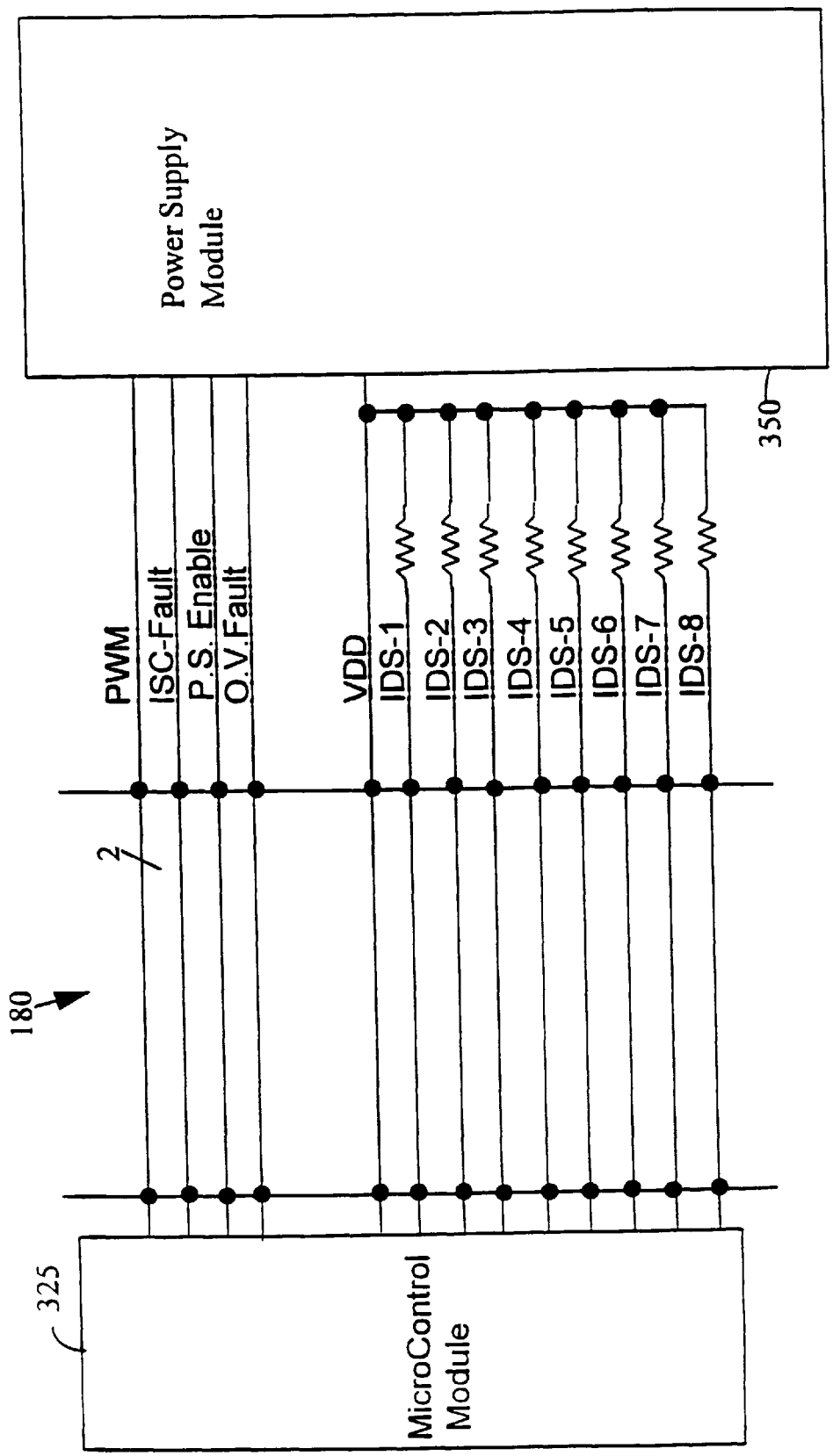
FIG. 15 is a block diagram showing an interconnection harness between a microcontroller module and a power supply module on a PA slice.

FIG. 15 shows a more detailed diagram of the power supply control harness 180. Individual lines within the power supply control harness 180 includes a pair of complementary pulse width modulation lines (PWM), a short circuit current fault indication line (ISC-Fault), a power supply enable line (P.S. Enable), and an open voltage (O.V. Fault) fault line. The PWM lines are used by the microcontroller module to send complementary controllable PWM signals to the power supply module 350 in order to control a switching frequency and a duty cycle of (which determines on/off times) for switching on and off the field effect transistors (FETs) used the power supply module 350. The ISC-fault line sends a status message to the microcontroller module 325 informing the microcontroller module 325 of a perceived short circuit in the power supply module 350 or a load connected to an output of the power supply module 350. Similarly, the O.V. fault line is used to relay a status message to the microcontroller module informing the microcontroller module 325 of a perceived overvoltage condition in the control module 325. The P.S. Enable line is used enable/disable the power supply at the board level (via the control module 325), at the system level (via the redundant system controller 200, FIG. 5A), or at the network level (via the network 275).

In addition to the above mentioned control and status lines, the power supply control harness 180 includes monitoring signal lines. The respective current drain to source lines (IDS-1 . . . IDS-8) are used by the microcontroller module 325 to monitor a current draw from individual amplifier FETs in the RF amplifier module 375 (see, FIG. 17). While eight current drain to source lines are preferred, others may be added or subtracted according to the number amplifiers used in the RF amplifier module 375. The IDS 1–8 lines provide information to the microcontroller module 325 which enable the microcontroller module 325 to directly manipulate eight corresponding VGS 1–8 control lines (discussed in more detail with respect to FIG. 16). Each of the respective IDS 1–8 lines include a resistor therein which is used to sense the respective current flow through a corresponding one of the IDS 1–8 lines. Thus the microcontroller module 325 is capable of monitoring the voltage supplied by the power supply module 350 and respective current drawn on each of the lines IDS-1 . . . IDS-8, which will be used by the microcontroller module 325 to automatically adjust the respective output levels of individual amplifier FETs in the RF amplifier module 375.

Figure 16:
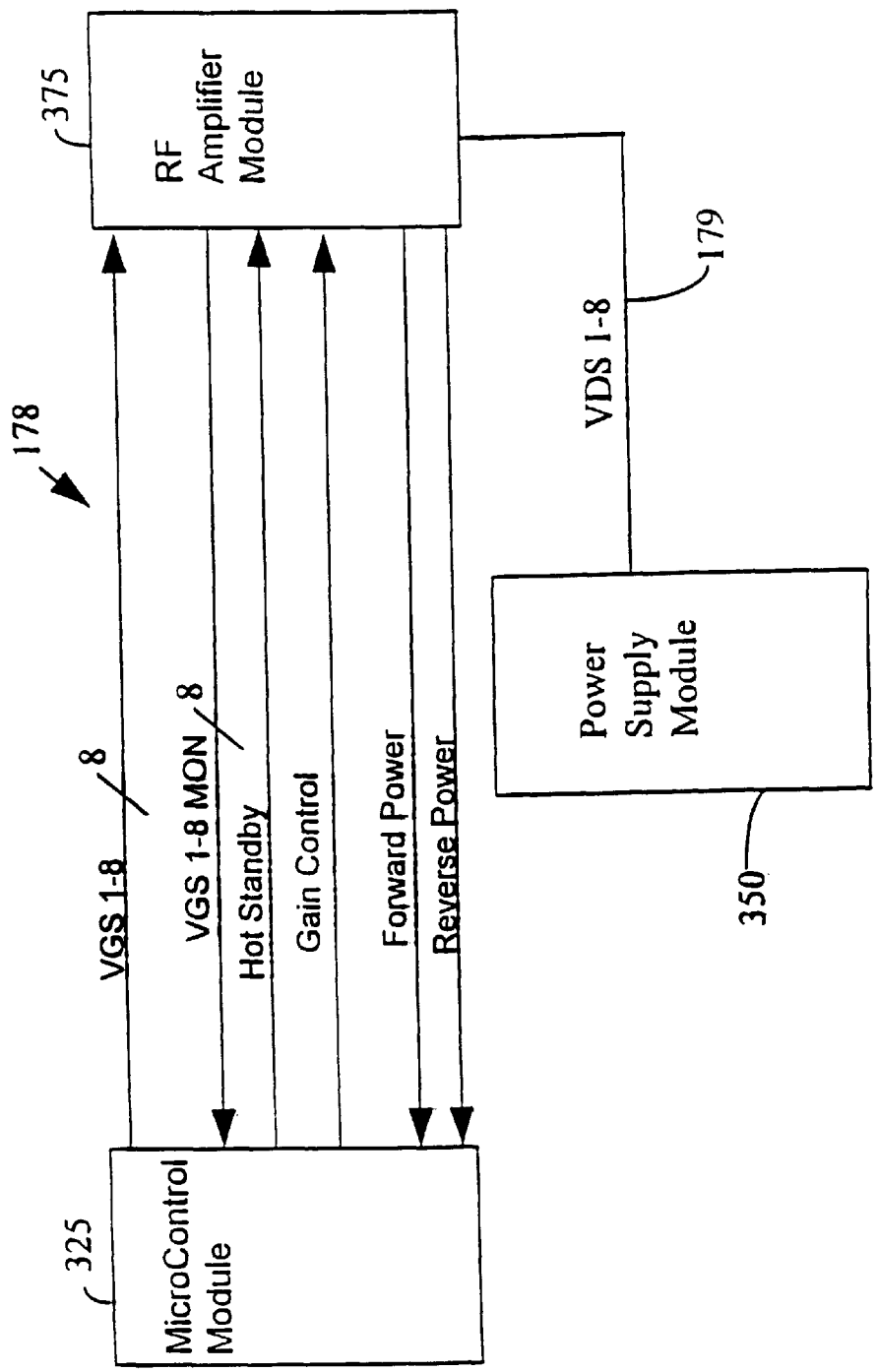
FIG. 16 is a block diagram illustrating a wiring control harness between a microcontroller module and an RF amplifier module, and a control harness between the RF amplifier module and a power supply module.

FIG. 16 is a more detailed diagram of the amplifier control harness 178 and the power supply control harness 179. The amplifier control harness 178 includes eight control signal lines VGS1–8 for controlling, respectively, a voltage between a gate and a source of amplifiers in the RF amplifier module 375 (see FIG. 17 and FIG. 18). Each of the lines VGS1–8, is used to send a control signal from the control module 325 to the RF amplifier module 375 in order to independently control up to eight independently controlled amplifiers used within the RF amplifier module 375. (Of course, other techniques such as multiplexing control signals will reduce the number of lines required). Furthermore, eight other signal paths, VGS1–8 MON, carry to the microcontroller module 325 monitoring signals for each of the voltage gate to source signals for the amplifiers in the RF amplifier module 375.

The amplifier control harness 178 also includes a hot standby line, and a gain control line. The hot standby line carries a control signal from the control module 325 to the RF amplifier module 375 in order to place the RF amplifier module in a hot standby state (as will be discussed with respect to FIG. 20A), or to turn the RF amplifier module 375 on or off. When the RF amplifier module 375 is in the hot standby state, no RF energy is output from the RF amplifier module 375. VDS voltages (discussed in more detail with respect to FIG. 17) are applied to the respective amplifiers in the RF amplifier module 375, each of which provide a corresponding output that is monitored by the microcontroller 325 and used to bias the respective VGS 1–8 signals (see FIG. 17 for more detail) in order to automatically adjust an output signal level at each of the amplifiers in the RF amplifier module 375. Once each of the respective output levels is adjusted, the RF amplifier module is brought "on-line" without risk that its respective output power level will be inconsistent with the output signal levels provided by the other PA slices 310 (assuming the other PA slice 310 are functioning properly).

The amplifier control harness 178 also includes a gain control signal line that is used by the control module 325 to control an overall amount of gain applied to the input RF signal by the RF amplifier module 375. Controlling the gain amongst the PA slices 310 enables each slice 310 to output signals having powers consistent with the other PA slices. The consistent output power from each PA slice suppresses intermodulation distortion (which is a problems when non-linear amplifiers amplify plural signals at different frequencies), and avoids signal compression which would be present if all of the PA slices 310 did not output the same power levels.

The amplifier control harness 178 further includes a forward power signal line and a reverse power signal line which are used by the microcontroller module 325 to monitor the output signal from the RF amplifier module 375. The microcontroller module 325 uses the forward power and the reverse power to determine the coupling efficiency of the RF amplifier module to the radial combiner 400 (FIG. 5A), measure voltage standing wave ratio (VSWR), and other figures-of-merit.

The power supply module 350 provides eight VDS lines (VDS1–8) in the power supply control harness 179. Each of the VDS1–8 lines provides an independent voltage path to individual amplifiers used in the RF amplifier module 375. By providing independent voltage paths, risk is minimized of one failed amplifier within the RF amplifier module 375 affecting the performance of the other amplifiers in the RF amplifier module 375. Also, the insertion of sense resistors (see FIG. 15) permit the respective IDS values for individual amplifiers in the RF amplifier module 375 to be monitored.

Figure 17:
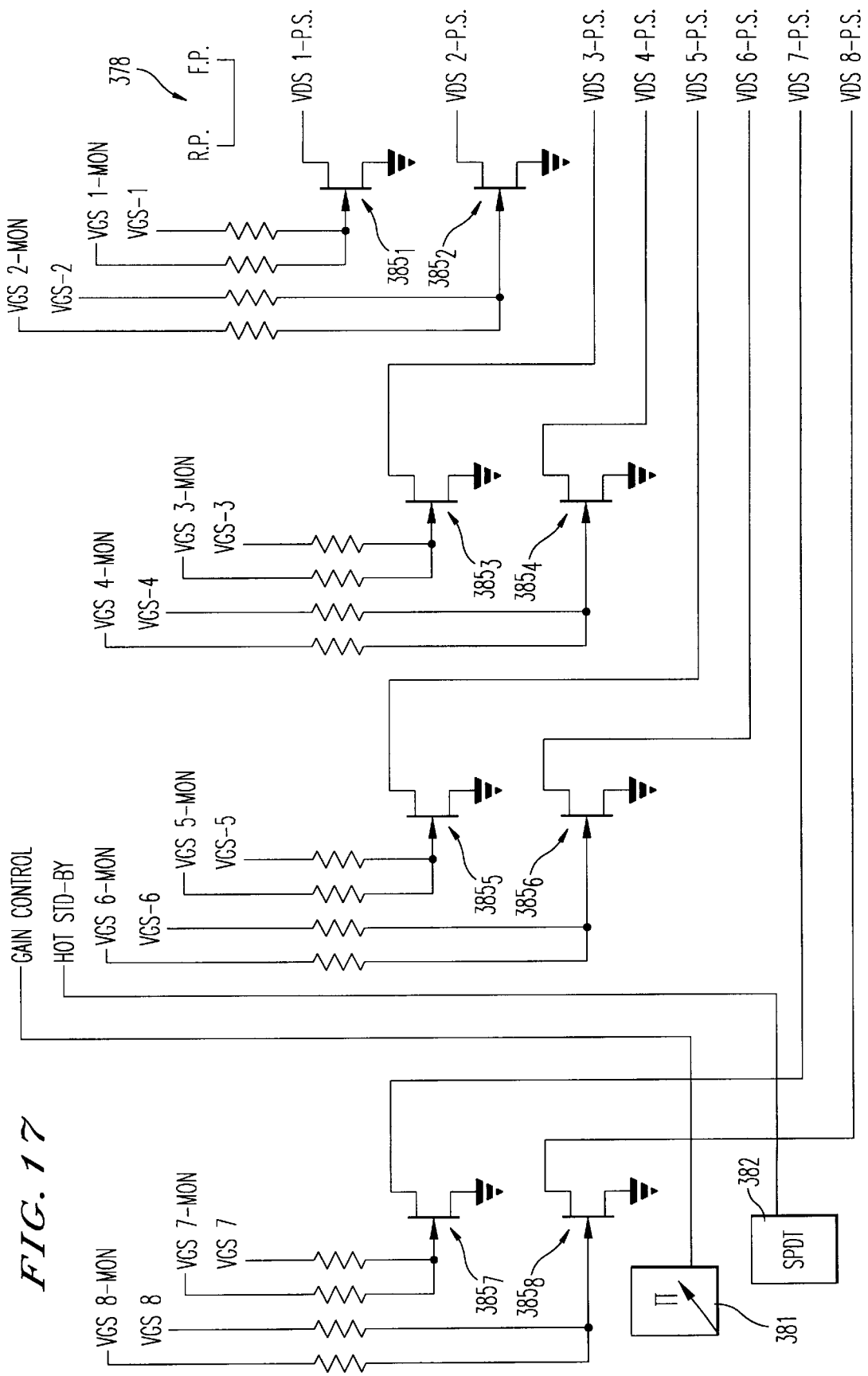
FIG. 17 is a block diagram of signal and control lines in a power amplifier module.

FIG. 17 illustrates how each of the voltage gate to source lines (VGS1–8) respectively, are used to bias individual ones of amplifiers 385, as shown in FIG. 17. FIG. 17 shows an embodiment where five amplifiers $385_{3-4}$ and $385_{6-8}$ are used as part of a three-stage amplification chain. Three other amplifiers labeled $385_{1-2}$ and $385_5$ in FIG. 17, could be added to supplement performance if desired. Each Ids (i.e., each amplifier's drain to source current) is adjustable by adjusting a voltage gate to source control signal $VGS_{1-8}$, which is controlled by the microcontroller module 325 as applied through a bias circuit (shown as a resistor in FIG. 17. A corresponding set of monitoring signals lines VGS1–8 MON are used by the microcontroller module 325 to monitor the bias voltage on each of the amplifiers $385_{1-8}$ present in the RF amplifier module 375. Each of the voltage supply lines VDS 1–8 is applied to respective ones of the eight amplifiers $385_{1-8}$ as shown in FIG. 17. Thus, should one of the amplifiers fail, power is not necessarily removed from the other amplifiers 385.

The microcontroller module 325 monitors each of the respective VGS1–8 lines with VGS 1–8 MON lines, as well as the reflected power (R.P.) and the forward power (F.P.) through a pair of monitoring lines R.P. and F.P. as shown in FIG. 17. The monitoring lines R.P. and F.P. are provided by the directional coupler 378 (e.g., a surface mount microstrip coupler manufactured by Mid-Atlantic Corp.) which is placed at the RF signal output of the amplifier module 375.

The overall output level of the RF amplifier module 375 is adjusted by varying a signal level on a gain control line, as applied from the microcontroller module 325. The signal level on the gain control line adjusts an attenuation setting on a variable attenuator 381 such that an input signal level is normalized to 20 dBm before passing through the fixed gain amplifiers 385 which output an output signal at 47 dBm.

On/off and hot standby modes of the RF amplifier module 375 may be controlled from the microcontroller module 325 by sending a signal to the single pole double through (SPDT) switch 382 via the hot standby control signal line. When in the hot standby mode (as will be discussed with respect to FIG. 21), the individual amplifiers 385 have their VGS and signals varied so as to avoid damaging the FETs in the PA module. During the hot-standby mode, no energy is output from the RF power amplifier 375.

Figure 18:
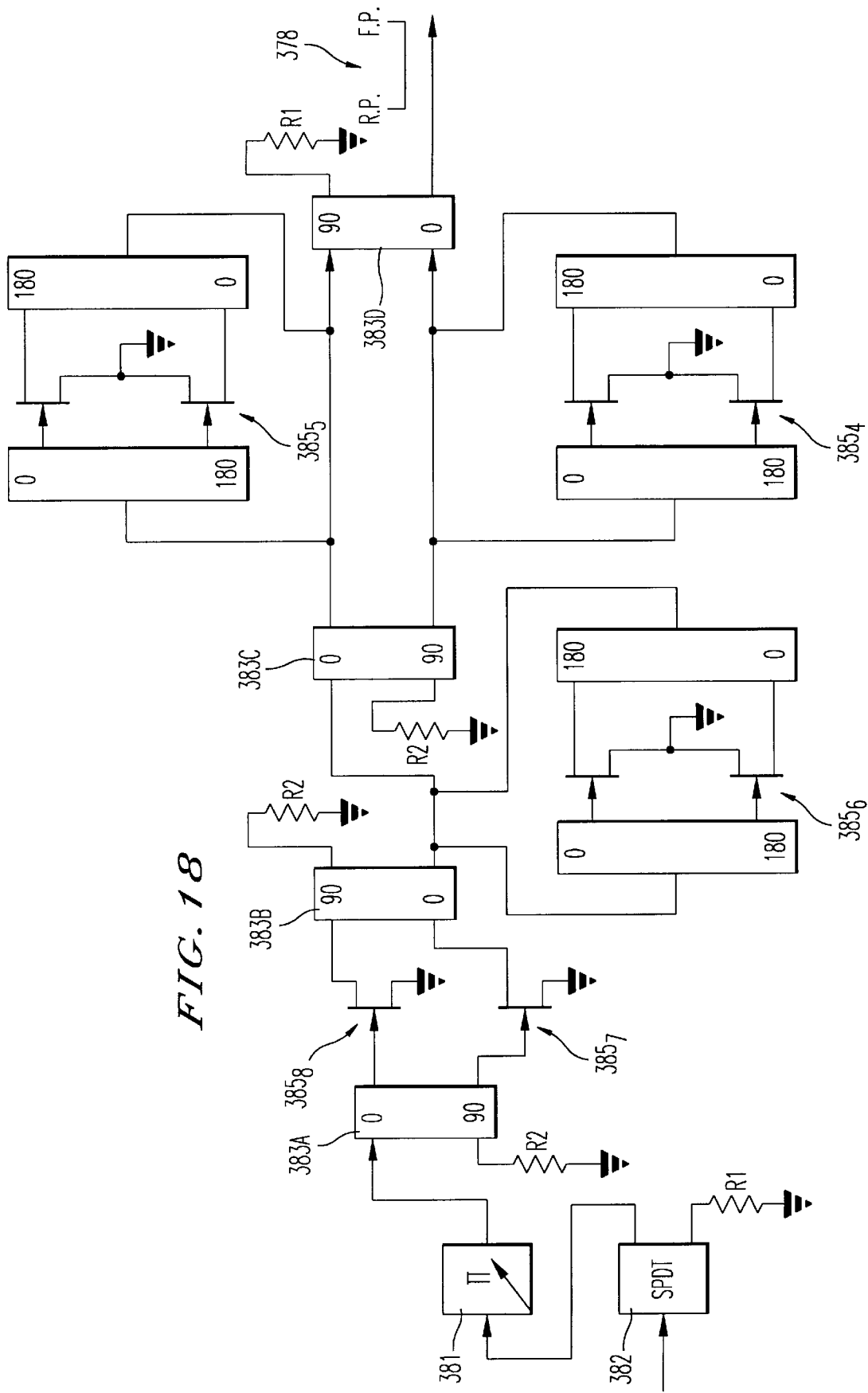
FIG. 18 is a block diagram of a signal flow path in a power amplifier module.

FIG. 18 shows a three-stage amplifier/coupling architecture used in the RF amplifier module 375. The five amplifiers $385_{4-8}$ are configured in three stages. The amplifier pair $385_{7-8}$ provides a first stage of amplification that cooperates with the amplifier $385_6$, which provides a second stage of amplification. These two stages of amplification provide 18 dB of gain. Amplifiers $385_{4-5}$ provide an additional 10 dB of gain to provide a system gain of about 28 dB. In contrast to single stage amplifiers, this tri-stage amplification architecture provides both broad bandwidth and constant linearity over 300 MHZ bandwidth with a 0.1 dB to 0.2 dB ripple through the band. By driving each of the amplifiers $385_{4-8}$ well beneath its specified operational range, linearity throughout the amplification process is preserved and intermodulation distortion products are suppressed. For example, the second stage amplifier $385_6$ is a FLL310 GaAs amplifier manufactured by Fujitsu which is rated for 30 watts. However, by backing-off the output power of the amplifier $385_6$ to 5 watts, exceptional linearity is preserved. Amplifiers $385_{7-8}$ are of the type 2XFLL171, and in contrast to conventional design practice, these two amplifiers are used together in the first stage of amplification in order to get a large bandwidth (e.g., 300 MHZ) and flat ripple through the pass band. This is accomplished by sharing the first stage of amplification between two amplifiers $385_{7-8}$, which are each backed off by over 5 dB from their maximum operational rating and combining the outputs of the respective amplifiers using a 90° hybrid 383B. The Amplifiers $385_{4-5}$ are of a type 2XFLL310, which are push-pull GaAs amplifiers manufactured by Fujitsu. These amplifiers are preferred for the third amplification stage because when configured to provide a fixed gain of about 10 dB, they can provide an output signal power of 47 dBm (peak power) in the frequency range of 2 GHz and higher, with only ±1.0 dB of gain flatness, and third order intermodulation products that are down −43 dBc.

The first stage amplifiers $385_{7-8}$ are fed from a 20 dBm input signal passed through a first 90° hybrid 383A. The first 90° hybrid 383A receives an input signal from the variable attenuator 381 which in turn is fed from the switch 382. The first 90° hybrid 383A appropriately divides the input signal into two isolated component parts which are then amplified by the first stage amplifiers $385_{7-8}$. Aside from the signal splitting function, the first 90° hybrid 383A provides a fixed input and output impedance of 50Ω such that input impedances are consistently matched in each of the three stages of amplification in the RF amplifier module 375 for each of the PA slices $310_{1-16}$. Consistent 50Ω matching between successive amplifier stages minimizes reflections in the signal path such that consistent signal coupling efficiency is exhibited for each amplifier stage in each of the PA slices 310. Resistor R2 connects to the 90° hybrid in order to provide isolation between the two signals output from amplifiers 385$_{7-8}$.

A second hybrid 383B combines the respective outputs from the first stage amplifiers 385$_{7-8}$ and provides a 50Ω output to the second stage amplifier 385$_6$, which amplifies the signal to provide a constant level output of about 37 dBm at the second stage of amplification.

A third 90° hybrid 383C accepts and splits the signal output from the second stage amplifier 385$_6$ into two separate signals. These two separate signals are passed to the third stage push-pull amplifiers 385$_{4-5}$ which further amplify the RF signal by about 10 dB (accounting for hybrid losses) and provide two respective inputs to a fourth 90° hybrid 383D. The fourth 90° hybrid 383D combines these respective amplified output signals into a single RF output signal having a power level of 47 dBm and a source impedance of 50Ω.

The RF output signal is sensed by the directional coupler 378 which is a surface mount strip-line directional coupler manufactured by Mid-Atlantic Corporation and used to sense a forward power and reflected power at the output of the RF amplifier module 375.

During normal operation, when the RF amplifier module 375 is placed in a transmit state, the microcontroller module 325 will continue to monitor the respective output power levels by comparing the respective measured Ids signals from the amplifiers and 385$_{4-8}$ with ideal Ids values stored in memory in the microcontroller module 325. By performing these measurements and adjustments concurrent with normal transmit operations, the microcontroller module 325 can compensate for signal level variations caused by temperature variation and amplifier aging in each of the respective amplifiers 385$_{4-8}$.

The adjustable attenuator 381 is set at a specific value during manufacturing and predelivery evaluation where each of the gain stages in the drivers 115, 120 and RF amplifier module are characterized. The value is set such that the output of the adjustable attenuator is 20 dBm when provided with a signal from the respective drivers 115, 120 (FIG. 5A) which typically provide signals of 32 dBm. By normalizing the input signal to 20 dBm for each of the PA slices 310, the output of each PA slice 310 will also be normalized because the output levels of each stage of amplification will constantly be monitored and adjusted by the microcontroller module 325.

Thus, for the modular broadband booster embodiment, when the respective outputs of 16 PA slices 310 are combined, the modular broadband booster system 100 provides a minimum of 800 watts peak envelope power (PEP) and typically 1 kw PEP.

Figure 19:
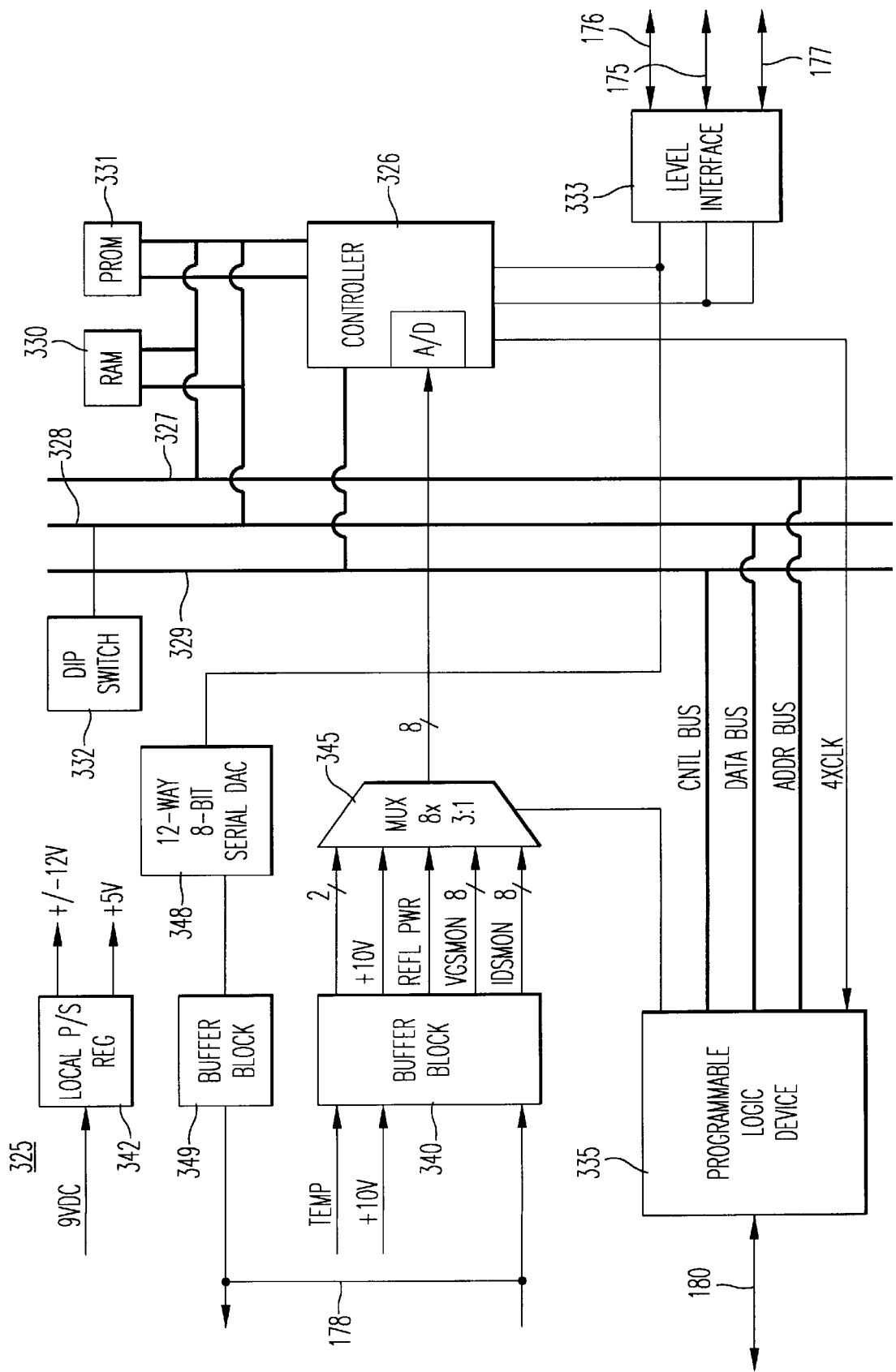
FIG. 19 is a block diagram of a microcontroller module.

FIG. 19 shows a detailed architecture of the microcontroller module 325 for a given one of the PA slices 310. The microcontroller module 325 is based on a controller 326 which is preferably a Motorola MC68HC11F4FN microcontroller, having eight analog to digital (A/D) converters. The controller 326 interfaces with a random access memory (RAM) 330 used for holding dynamic program variables such as flags used for program status, state variables, management information base (MIB) values, etc. The controller 326 also includes a programmable read only memory (PROM) 331 which is used to store program variables such as a setting value for the adjustable attenuator 381 (see FIG. 17), and ideal Ids values which will be used to compare with the IDS MON signals from the respective amplifiers 385 (FIG. 18) in the RF amplifier module 375 (FIG. 18). The microcontroller module 325 includes a dip switch 332 which holds initial switch settings used by the controller 326 in order to determine its respective state during initialization. More particularly, the dip switch 332 holds a controller "address" which allows the controller 326 to identify itself while communicating over the local bus 176, and over the GNET serial bus 175. During pre-delivery evaluation, the dip switch 332 will be initially set to have an address setting of, for example, "1" if used in the PA slice 310 assigned a first slot in a chassis 311A (see FIG. 13).

Signals communicating over the local bus 176, the GNET serial bus 175, as well as the RS-232 bus 177, which connects the controller 326 with the display and IO 323 (FIG. 13), have their voltage levels adjusted by a TTL level interface 333 to normal TTL logic levels.

The controller 326 communicates with the power supply module 350 (FIG. 16) via a programmable logic device (PLD) 335. Signals communicated over the amplifier control harness 180 are passed through the PLD 335 and routed through a control bus 329, a data bus 328 and an address bus 327 of the microcontroller module 325. The controller 326 also communicates with the RF amplifier module 375 (FIG. 16) through a buffer block 340 and a buffer block 349. Signals received from the amplifier control harness 178 are passed through the buffer block 340 which appropriately scales and buffers the respective signals received from the amplifier control harness 178. In addition, the buffer block 340 accepts other signals such as a 10 volt monitoring signal and various sensor signals such as temperature sensor signals (TEMP). Each of the signals input to the buffer block 340 is buffered, using tri-state buffers, then forwarded to a multiplexer 345 which multiplexes the respective input signals onto eight separate lines under the control of the PLD 335. Once multiplexed, the signals distributed on the eight lines are passed to the eight A/D converters in the controller 326 where they are digitized and subsequently analyzed by the controller 326.

Signals output from the controller 326 and sent through the amplifier control harness 178 are passed through a 12-way, 8-bit serial digital-to-analog converter (DAC) 348, which converts each of the digital signals output from the controller into an analog format and passes them through the buffer block 349, which then sends the buffered analog signals to the amplifier control harness 178.

Power for the microcontroller module 325 is derived from the 9 volt DC power line received from the backplane 312 (FIG. 11). A local power supply regulator 342 converts the input 9 volt DC power signal into a ±12 volt DC regulated power source and a +5 volt DC regulated power source, each of which are used to power the components on the microcontroller module 325.

Figure 20A:
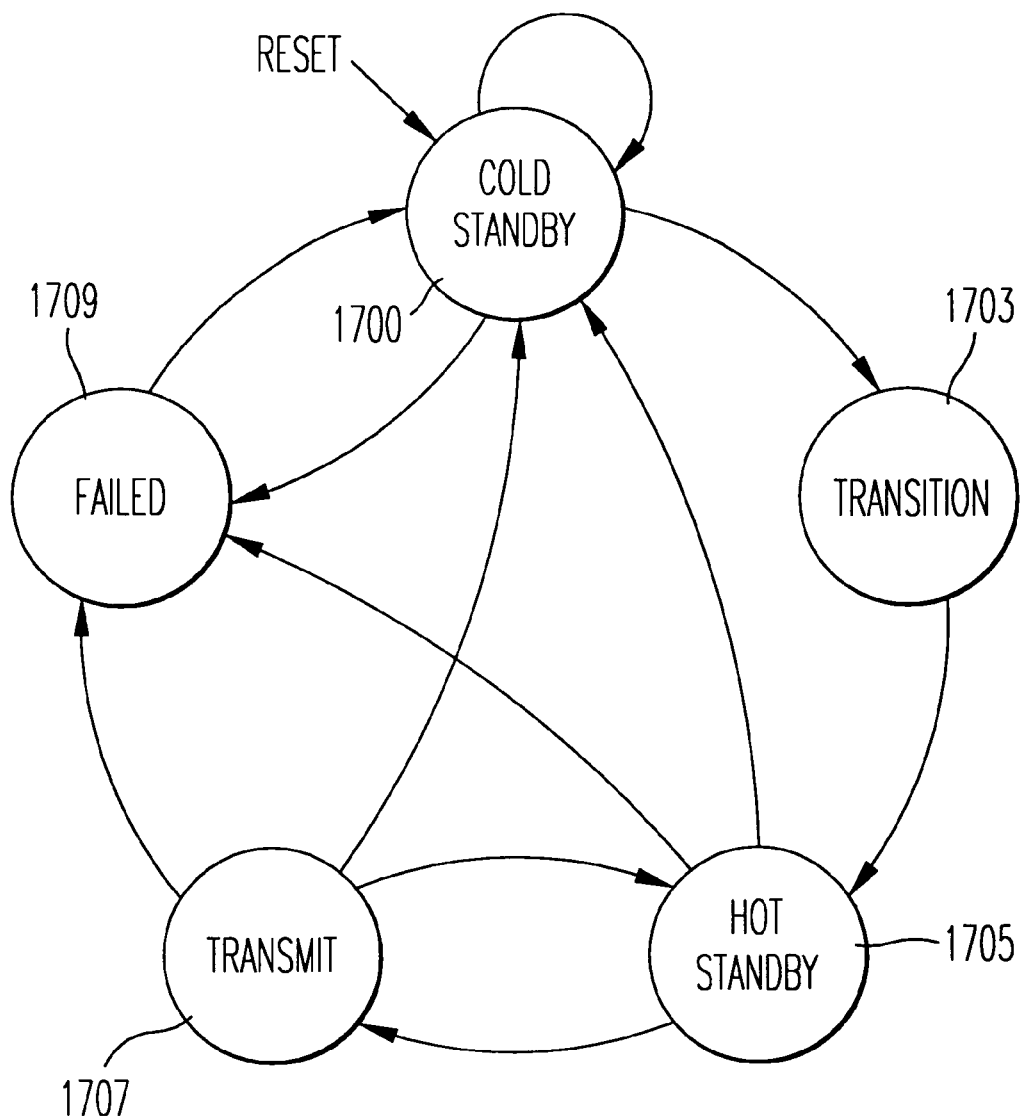
FIG. 20A is a state diagram implemented in computer software in respective controllers of individual power amplifier modules.

FIG. 20A illustrates a state diagram implemented by the controller 326 (FIG. 19) and defining five active states in which the respective PA modules 310 may operate. Upon receiving a reset signal, the controller 326 enters a cold standby state 1700. In this cold standby state, the PA module has its respective FET amplifiers turned off and Vdd set near 0 V (i.e., turned off). The controller 326 will remain in the cold standby state 1700 until it receives a transition signal, indicating that an interlock for the PA module has been closed and the PA module is to move into a hot standby state 1705, via a transition state 1703. Accordingly, in the transition state 1703, the respective FETs are configured to follow a specific power up sequence, as will be discussed with respect to FIG. 21. Once powered up and stabilized, the controller 326 transfers the PA module 310 from the transition state 1703 to the hot standby state 1705. The hot standby state 1705 is defined as the respective FET amplifiers being powered on (i.e., Vdd being 10.6 V and Vgs set so as not to pinch off the FET), although an input switch 382 (FIG. 18) being placed in an open position. Accordingly, in the hot standby state 1705, the PA module does not contribute to the RF power that is output from the output coupler 500.

If while in hot standby state the PA module receives a transmit signal, the PA module transfers from the hot standby state 1705 to a transmit state 1707 by closing the switch 382 so that the PA module does contribute to the total RF output power. Similarly, if in the transmit state 1707, the PA slice module receives an instruction to return to the hot standby state 1705, the switch 382 will open and the PA module with return to the hot standby state 1705. Also, while in the hot standby state 1705, the PA module will return to the cold standby state 1700 if instructed to do so, or enter a failed state 1709 if the controller 326 identifies a fault condition. Similarly, while in the transmit state 1707, the controller 326 may detect a failure and enter the failed state 1709, or transfer back to cold standby state 1700 if instructed to do so.

While in the failed state 1709, the processor 326 recognizes that a fault condition has occurred and can only transfer out of the failed state 1709 by correction of the fault condition. While in the failed state 1709, the processor will attempt to transition to the cold standby state 1700 a predetermined number of times at predetermined intervals. However, if while in the cold standby state 1700, the fault condition continues to exist, the PA module will return to the failed state 1709. The PA module will remain in the failed state and a fault light will be illuminated on the front panel of the failed PA module if the PA module is unsuccessful in transitioning to the cold standby state 1700 after a predetermined number of attempts.

Figure 20B:
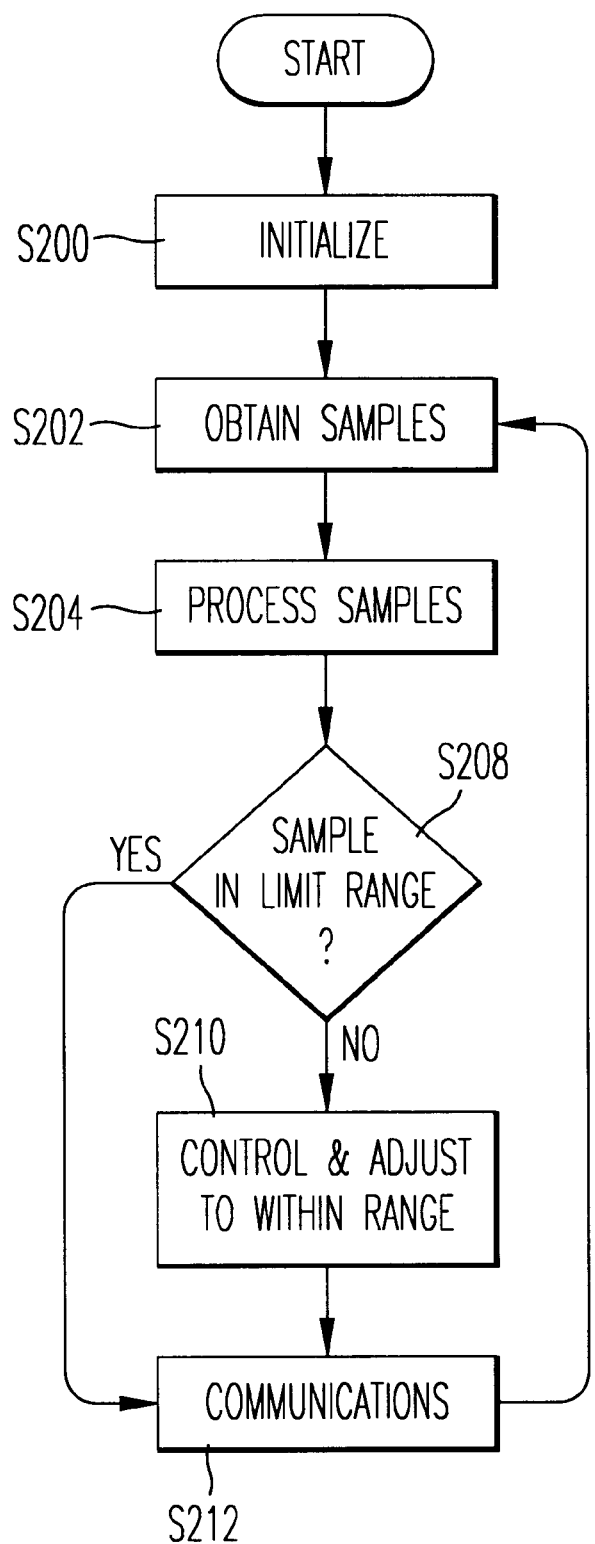
FIG. 20B is a flowchart of an automatic level control process performed at the module level on respective of the power amplifier modules.

FIG. 20B is a flowchart of a process implemented by the controller 326 in the PA module 310 for performing automatic level control at the board level. The process begins in Step S200 where the controller 326 is initialized (which also may be implemented with an interrupt routine, for example). As part of the initialize Step S200, the control voltages for the respective FETs are ramped-up in a predetermined manner by first lowering Vgs (to about −3.2 V) so as to pinch-off the FETs, and while pinched-off ramping up Vdd to about 10.6 V. Subsequently, Vgs is increased to about −0.9 V after Vdd is ramped-up and stable. The process then proceeds to Step S202 where samples from the monitored signals, such as VGS 6-MON, as shown in FIG. 17, are obtained. The controller 326 then processes the respective samples in Step S204 by converting the samples into digital values so as to facilitate comparing them with stored digital values. The process then proceeds to Step S208 where an inquiry is made for each digital value regarding whether the digital value is within a predetermined range of values stored in memory that correspond to the sample under investigation. If the response to the respective inquiries in step S208 are affirmative, then the process proceeds to Step S212 where any appropriate communications from the PA module (such as a message containing the measured value) is formed and transmitted from the PA module, and then the process returns to Step S202 after all of the samples have been evaluated. However, if the result in Step 208 is negative, the controller 326 controls and adjusts the respective adjustable parameter (e.g., respective Vdd or Vgs) to within the predetermined range of values and then the process proceeds to Step S212 and then Step S202.

Figure 21:
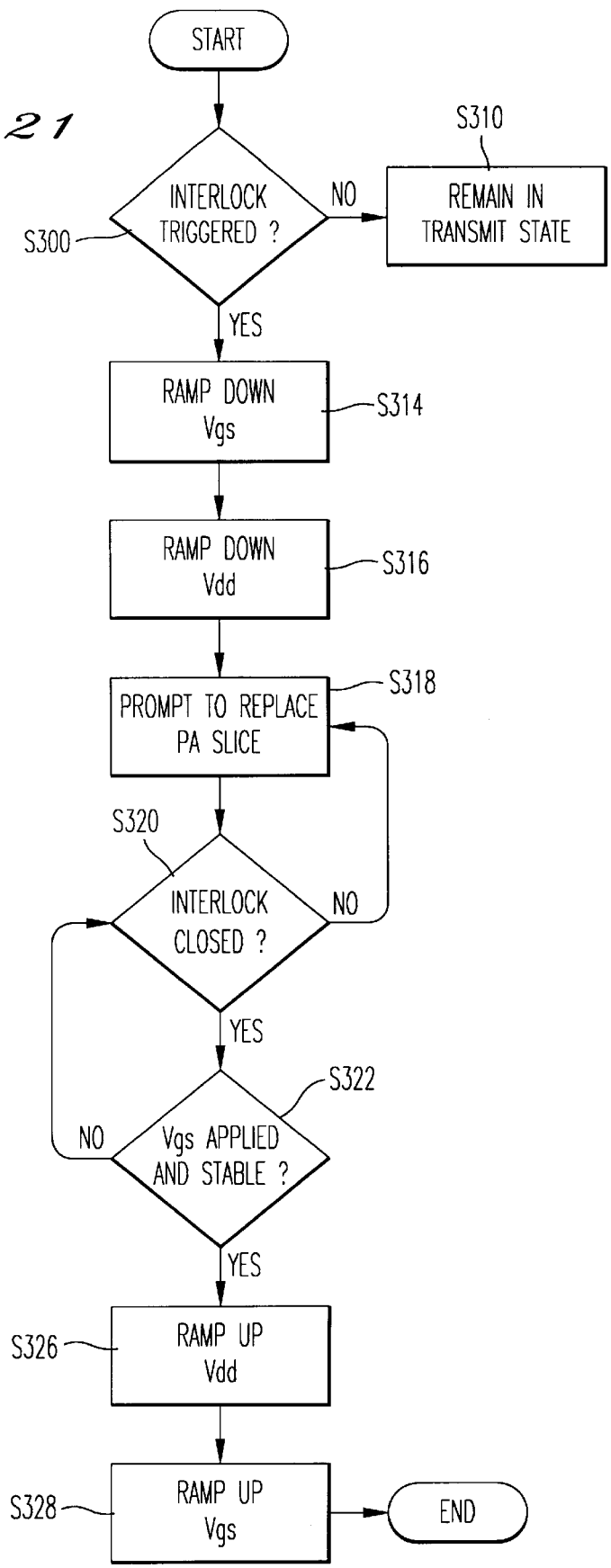
FIG. 21 is a flowchart of a hot-swap process used to replace selected of the power amplifier modules while other the power amplifier modules remain in a transmitting state.

FIG. 21 is a flowchart of a "hot swap" process which is enabled by the presence of the respective controllers 326 in the PA modules. The process begins in Step S300 where an inquiry is made regarding whether a normally closed interlock on a PA module that hosts the subject controller 326 is triggered (i.e., change close to open status or a message indicated a status has changed). If the response to the inquiry in Step S300 is negative, the PA module remains in an transmit state as indicated in Step S310. However, if the response in Step S300 is affirmative, the process proceeds to Step S314, where the respective values Vgs are ramped down so as to pinch-off the FETs and thereafter, in Step S316, Vdd is ramped down so as to turn off the respective transistors. Subsequently, the process proceeds to Step S318 where a prompt message is sent to the redundant system controller 200 (FIG. 5) and the front panel of the PA module, prompting a technician to replace the PA module. Because the RF power has now been removed from the PA module and due to the structure of the modular power amplifier 300 and radial combiner 400, this PA module may safely be removed/replaced even though the other PA modules remain in a transmit state.

After Step S318, the process proceeds to Step S320 where the same controller on the PA module (or another controller if a new PA module has been inserted) inquires whether the interlock for the PA module is closed. If the response in S320 is negative, the process returns to Step S318 where the technician is prompted to replace the PA module. However, if the response to Step S320 is affirmative, the process proceeds to Step S322 where an inquiry is made regarding whether the Vgs has been set to pinch off the respective FETs. Thus, if the response in Step S322 is negative, the PA module remains in a transition state and the process returns to Step S320. However, if the response in Step S322 is affirmative, Vdd is ramped up to 10.6 volts and the process then proceeds to Step S328 where the Vgs may then be increased from about −3.5 volts to about −0.9 volts so as to activate the FET.

Figure 22:
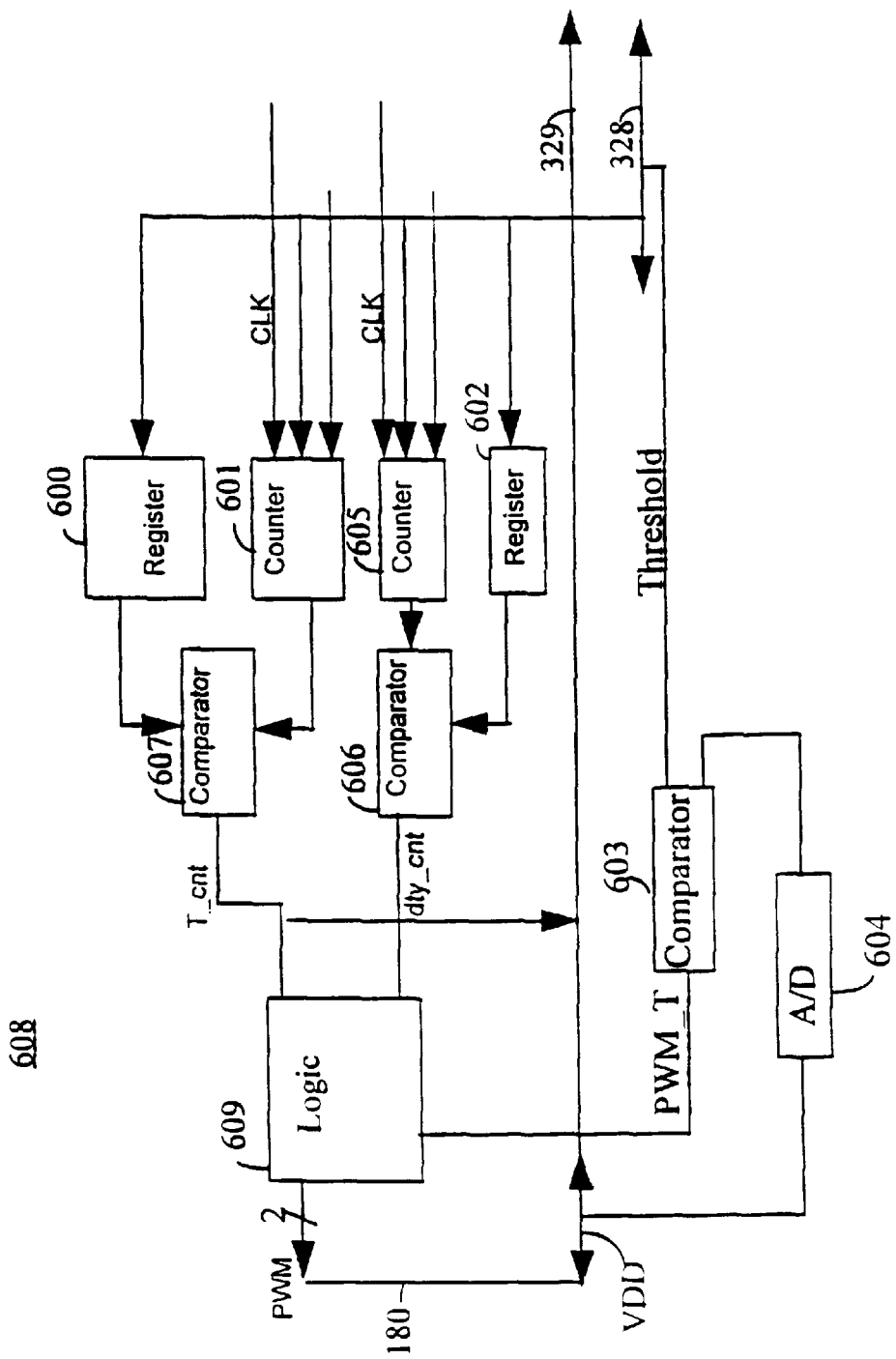
FIG. 22 is a block diagram of a pulse width modulation signal generating circuit.

FIG. 22 is a block diagram of a pulse width modulation (PWM) circuit 608 embodied within the programmable logic device 335 (FIG. 19) and controlled by a computer-based software process implemented in the controller 326 (FIG. 19). An output of the PWM circuit 608 provides an adjustable complementary pair of PWM signals that are passed over the power supply control harness 180 to the power supply module 350. The PWM signals are used by the power supply module 350 to control a switching frequency and duty cycle of a switching power supply that employs switching power FETs resident within the power supply module 350. Alternatively, in the interest of simplifying the system architecture, a power supply using commercial off-the-shelf components may be used.

The PWM circuit 608 receives the data bus 328 and the control bus 329 from the controller 326 (FIG. 20A). The PWM circuit 608 outputs the PWM signals on the power supply control harness 180, and receives from the power supply module 350 a VDD feedback signal on the power supply control harness 180.

The PWM circuit 608 includes a first register 600 used to hold a terminal count value loaded over the data bus 328 from the controller 326 (FIG. 19). This terminal count value will determine a lower bound on the switching frequency of the PWM signals (about 60 kHz). A first counter 601 receives a frequency seed value from the data bus 328, which is used to define an upper bound on the switching frequency of the PWM signals produced by PWM circuit 608. The counter 601 also receives from the controller 326 a clock input (CLK).

At the beginning of a PWM cycle, the counter 601 will sequentially count from its initial frequency seed value (e.g., 0) at a rate determined by the CLK signal (e.g., a 14.7 MHZ clock). The counter 601 outputs its accumulated value to a comparator 607 which compares the terminal count value, 245, stored in register 600 with the accumulated output of the counter 601. When the accumulated value in counter 601 equals or exceeds that of the stored value in register 600 the comparator 607 will output a signal T_CNT as a logic high (i.e., +5V). The T_CNT signal is provided to a logic block 609 and to the control bus 329. When the T_CNT signal is a logic high, it resets the accumulated count value in the counter 601. Thus, the time duration between successive logic high pulses on the T_CNT signal line defines the switching frequency of the PWM output signals from the circuit 608.

The PWM circuit 608 also includes a second counter 605, a register 602, and a comparator 606, combined to provide a "dty_cnt" (duty count) signal which defines a duty cycle of the PWM signals. The register 602 is initially provided with a duty cycle seed value, 32, via the data bus 328 as provided from the controller 326. The duty cycle seed value will determine an upper bound on the duty cycle of the PWM signals output from the PWM circuit 608. Updating the duty seed cycle value is accomplished by overwriting the old value stored in the register 602. The counter 605 receives an initial duty cycle value, 0, from the databus 328. In response to an external clock signal (CLK), the counter 605 will sequentially count from the initial duty cycle value.

At the beginning of a PWM signal period, the counter 605 will begin counting from the initial duty cycle value and output its accumulated value to a second comparator 608 which compares the accumulated count value from counter 605 with the duty cycle seed value stored in the register 602. The comparator 606 outputs a logic high dty_cnt signal when the accumulated count value in the counter 605 is equal to or greater than the stored duty cycle seed value from the register 602. The comparator 606 will continue to output a logic high dty_cnt signal until the counter 605 is reset to its initial value, as triggered by the T_cnt logic high signal. Thus, when the comparator 607 outputs a logic high T_cnt signal, both the counter 601 and the counter 605 are reset to their initial value. The controller 326 may also initialize a reset event independent of the T_cnt value by issuing a reset signal over the control bus 329.

The PWM circuit 608 also includes a comparator 603 which compares a threshold voltage, 10.7 volts, set by the controller 326 (FIG. 19) to a fed-back VDD voltage from the power supply control harness 180 (FIG. 20A), which is digitized by an A/D converter 604. An output of the comparator 603 is a signal PWM_T which is applied to the logic block 609. The logic block 609 derives the complementary PWM signals in response to receiving the PWM_T signal, the dty_Cnt signal and the T_Cnt signal. The PWM_T signal is used by the logic block 609 to truncate the duty cycle of the PWM signals, as discussed below and also with respect to FIG. 23.

The logic block 609 uses combinatorial logic (although a software process may be used) to produce the PWM output signals based on the T_cnt, dty_cnt and PWM_T input signals. A first one of the PWM output signals will have a logic high value when the T_cnt signal, the dty_cnt signal, and the PWM_T signal are at a logic low. The first PWM output signal will have a logic low value whenever the PWM_T signal is high, whenever the dty_cnt signal is a logic high and the T_cnt is a logic low, or whenever the T_cnt is a logic high. The other PMW output signal will have logic levels that are complementary to that of the first PMW output signal.

The controller 326 will use the fed-back VDD signal provided by the power supply module 350 as an indicator for whether and how to adjust the terminal count value in register 600, the frequency seed value in counter 601, the duty cycle seed value in register 602 in the initial duty cycle value in the counter 605 in order to provide a constant VDD output. The PWM_T signal provides control for reducing the PWM duty cycle and thus, reducing the level of VDD output from the power supply module 350.

Figure 23:
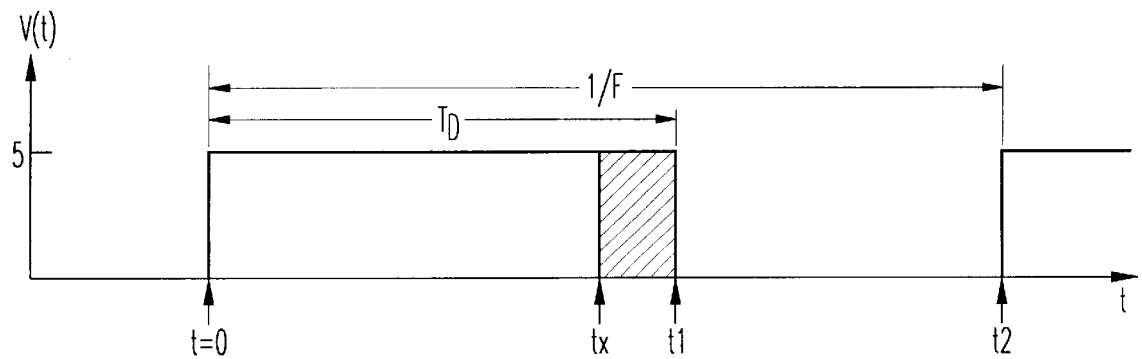
FIG. 23 is an illustrative pulse width modulation signal diagram.

FIG. 23 provides a description of how the PWM signals are shaped by the respective T-cnt, dty_cnt, and PWM_T signals. FIG. 23 is a timing diagram showing the time-based characteristics of the first PWM signal output from the PWM circuit 608. The x-axis of the graph represents time and the y-axis represents voltage. At a time t=0 a reset signal has just been issued and each of the counters 601, 605 has just been reset to their initial values. Accordingly, the first PWM signal transitions to a logic high state (+5V) because both the dty_cnt and the T_cnt will return to a logic low after a reset event, and it is presumed that the measured Vdd value does not exceed the threshold value. Assuming the value of Vdd does not exceed the threshold voltage, the first PWM signal will remain in the logic high state for a time duration $T_D$. Then, at a time t1, the dty_cnt signal transitions to a logic high and the logic block 609 responds by changing the output to a logic low. The first PWM signal will remain at a logic low until a time t2 which signifies the beginning of the next cycle of the first PWM signal in response to the T_cnt signal resetting the counters 601, 605.

Assuming the value of Vdd does exceed the threshold voltage, the PWM_T signal will truncate the duty cycle of the PWM signals output from the logic block 609. More particularly, for the exemplary PWM signal shown in FIG. 23, the first PWM signal is truncated for a duration of time t1–tx where t1 is a time when the dty_Cnt signal transitioned to a logic high and tx is a time when the PWM_T signal transitioned to a logic high. The PWM_T signal will normally be at a low voltage because the VDD signal will be beneath the threshold signal, set at 10.7V. However, when the VDD signal raises above the threshold signal, the comparator 603 will output a logic high signal at a time tx, which will cause the logic block 5609 to truncate the PWM signal.

FIG. 23 shows the first PWM signal after having been truncated at time tx. As shown in FIG. 23, the normal duty cycle of a time duration $T_d$ has now been reduced to a time duration equivalent to t1–tx. The overall period (1/F) is not affected by the truncation of the duty cycle.

Figure 24:
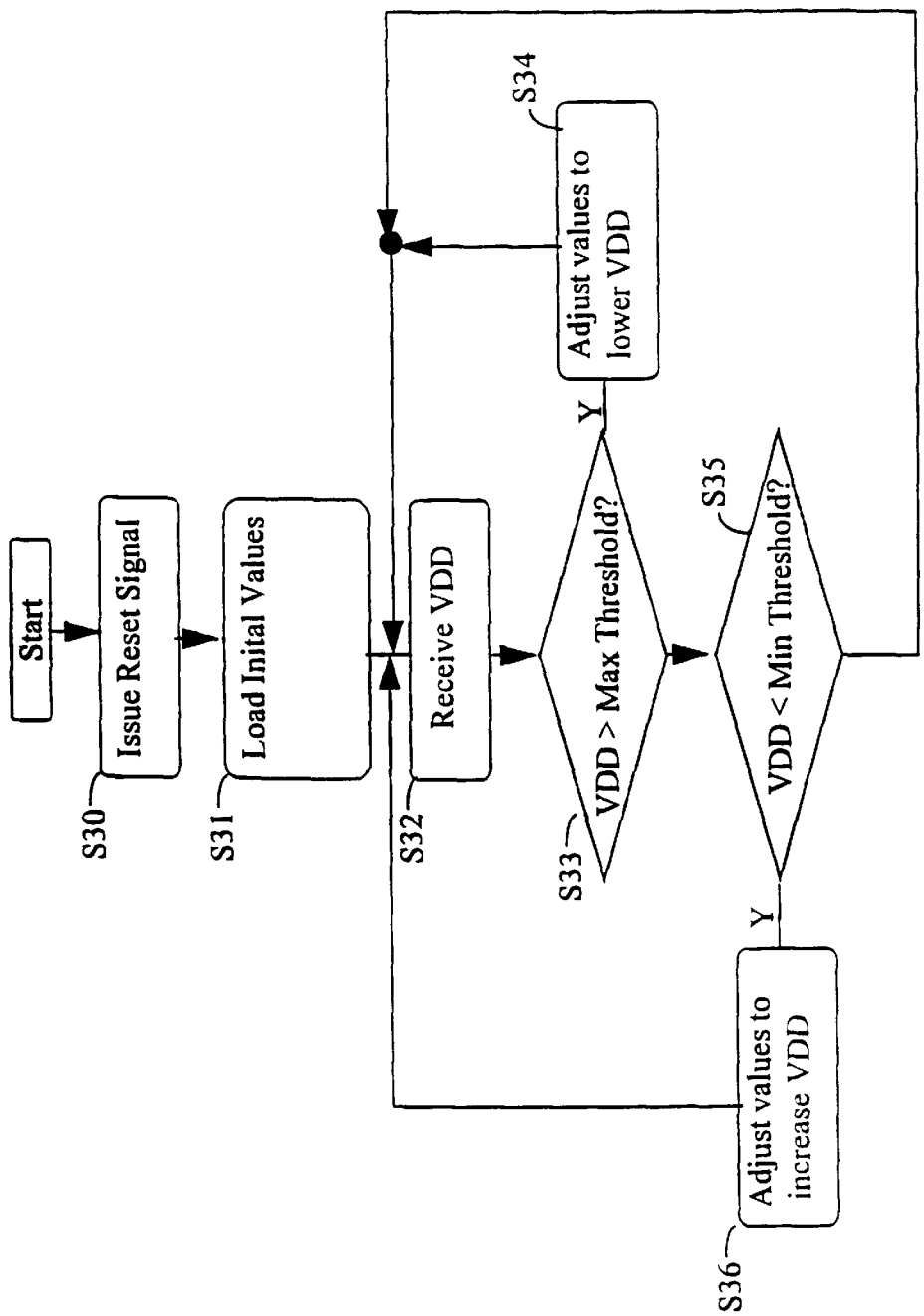
FIG. 24 is a flowchart of a process for monitoring and adjusting an output of a power supply module.

FIG. 24 illustrates a process for controlling and adjusting the output power from the power supply module 350. The process begins in a Step S30 where the microcontroller module 325 issues a reset signal to reset each of the stored values in the PWM circuit 608. The process then flows to a Step S31 where an initial terminal count value is loaded into the register 600, and the initial frequency seed value is loaded into the counter 601, the initial duty cycle seed value is loaded into the register 602, and the initial duty cycle value is loaded into the counter 605. Once each of the initial values have been respectively loaded, the process flows to Step S32 where a value of VDD is received from the VDD feedback line.

The received VDD signal is compared in a Step S33 against a stored maximum threshold voltage value. If the received VDD signal is greater than the maximum threshold value, the process proceeds to a Step S34, but if not, the processes proceeds to a Step S35. In the Step S34, respective ones of the terminal count value, the frequency seed value, the duty cycle seed value, and the initial duty cycle value are adjusted in order to lower the VDD. For example, the VDD value can be lowered by placing a larger duty cycle seed value into the register 602 because the larger duty cycle seed value lowers the duty cycle. The VDD value can be increased by placing a lower duty cycle seed value into the register 602 because it lengthens the duty cycle of the first PWM signal. The value of VDD is affected by the duty cycle because the duty cycle determines the duration for which switching transistors used in the power supply will remain active. The longer the transistors stay active the more current they will pass to a charging capacitor. If the process flows from the Step S33 to the Step S35, the Step 35 inquires whether VDD is less than a minimum threshold. If an affirmative response is received, the process flows to Step S36 where selected ones of the terminal count value, the frequency seed value, the duty cycle seed value, and the initial duty cycle value, are adjusted in order to increase the VDD signal. The duty cycle seed value will be decreased by 10% in order to increase the resulting duty cycle of the first PWM signal output from the PWM circuit 608. If a negative response is received from the inquiry in Step S35, the process returns to Step S32 where VDD is monitored once again.

Figure 25:
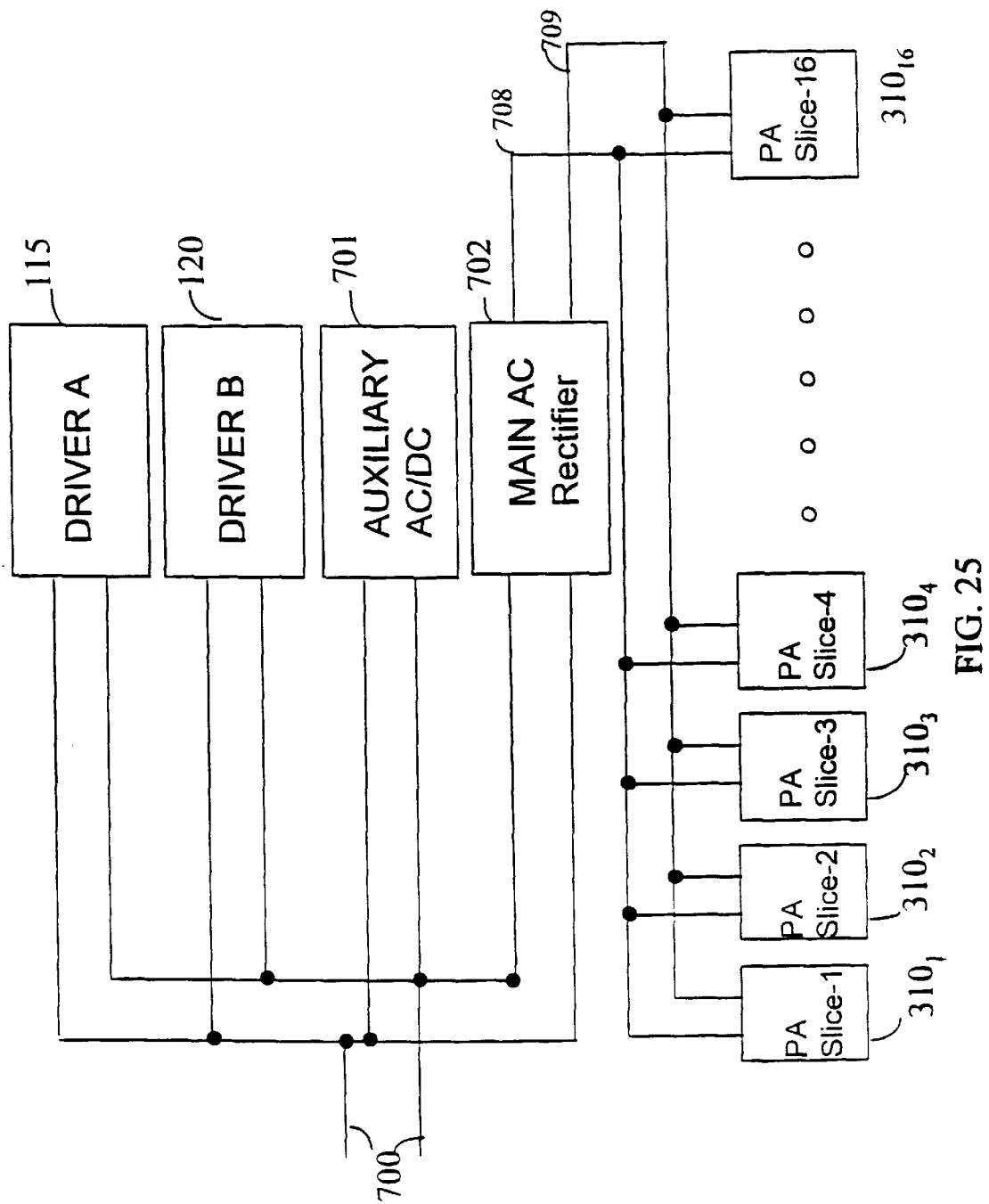
FIG. 25 is a block diagram illustrating a distributed power architecture.

FIG. 25 is a block diagram that illustrates the distributed power supply architecture for the modular broadband booster system 100. A power source of single phase 220 volts alternating current (AC) is available from an input 700 to each of the driver A 115, the driver B 120, an auxiliary AC/DC converter 701, and a main AC rectifier circuit 702. The driver A 115 and the driver B 120 derive their own power from the input 700. The auxiliary AC/DC converter 701 produces the +9V and +12V power lines supplied on the backplane 312 (FIG. 11) of the modular power amplifier 300 (FIG. 5A). The main AC rectifier circuit 702 converts the 220 volt AC input into a 220 volt Haversign pulses that are distributed to each of the PA slices 310$_{1-16}$ (FIG. 10).

It is preferable to distribute power to each of the PA slices 310$_{1-16}$ in this way because it allows distributed power factor correction between the PA Slices 310 in order to minimize harmonic disturbances that the modular broadband booster system 100 imparts to a commercial power grid that supplies power to the modular broadband booster system 100. Also, because each of the PA slices 310$_{1-16}$ include their own housing assembly 311 (FIG. 12) with cooling fins 313 serving as heat sinks, there is no single dominant heat source which may effect negatively the reliability of the system. Additionally, if one of the individual power supplies on the PA slices 1110$_{1-16}$ fails, the entire system does not fail. Moreover, if one of the power supply modules 350 on a given PA slice 310 fails, the overall system output power (RF power) is only reduced by 0.3 dB because the radial combiner 400 (FIG. 10) is still capable of accepting inputs from N−1 functioning PA slices 310.

Figure 26:
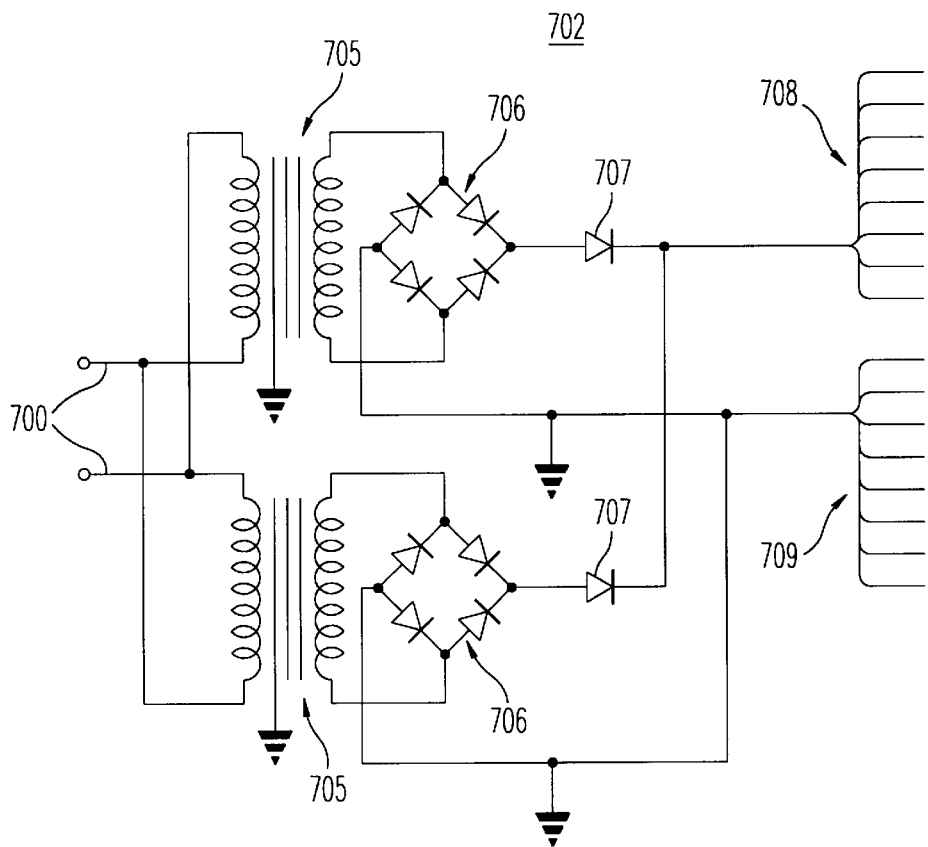
FIG. 26 is a schematic diagram of a main alternating current/direct current converter circuit.

FIG. 26 is a schematic diagram of the main AC rectifier circuit 702. The input 700 provides 220 volt AC at 32 amps to a pair of one-to-one isolation transformers 705. Each of the respective isolation transformers 705 are provided for redundancy such that if one should fail the other is available as a hot standby. A pair of rectifier assemblies 706 accepts the 220 VAC and produce rectified 220 volts at 2.5 amps respectively. The rectified 225 volt signals are passed through the respective cross coupled diodes 707, which further block AC signals as well as reflected waves. The output of cross coupled diodes 707 is are Haversign pulses which are then provided by a terminal 708 to the respective PA slices 310 (FIG. 25). Similarly, the main AC rectifier circuit 702 provides grounds terminals 709 to the PA slices 310 (FIG. 25).

Figure 27:
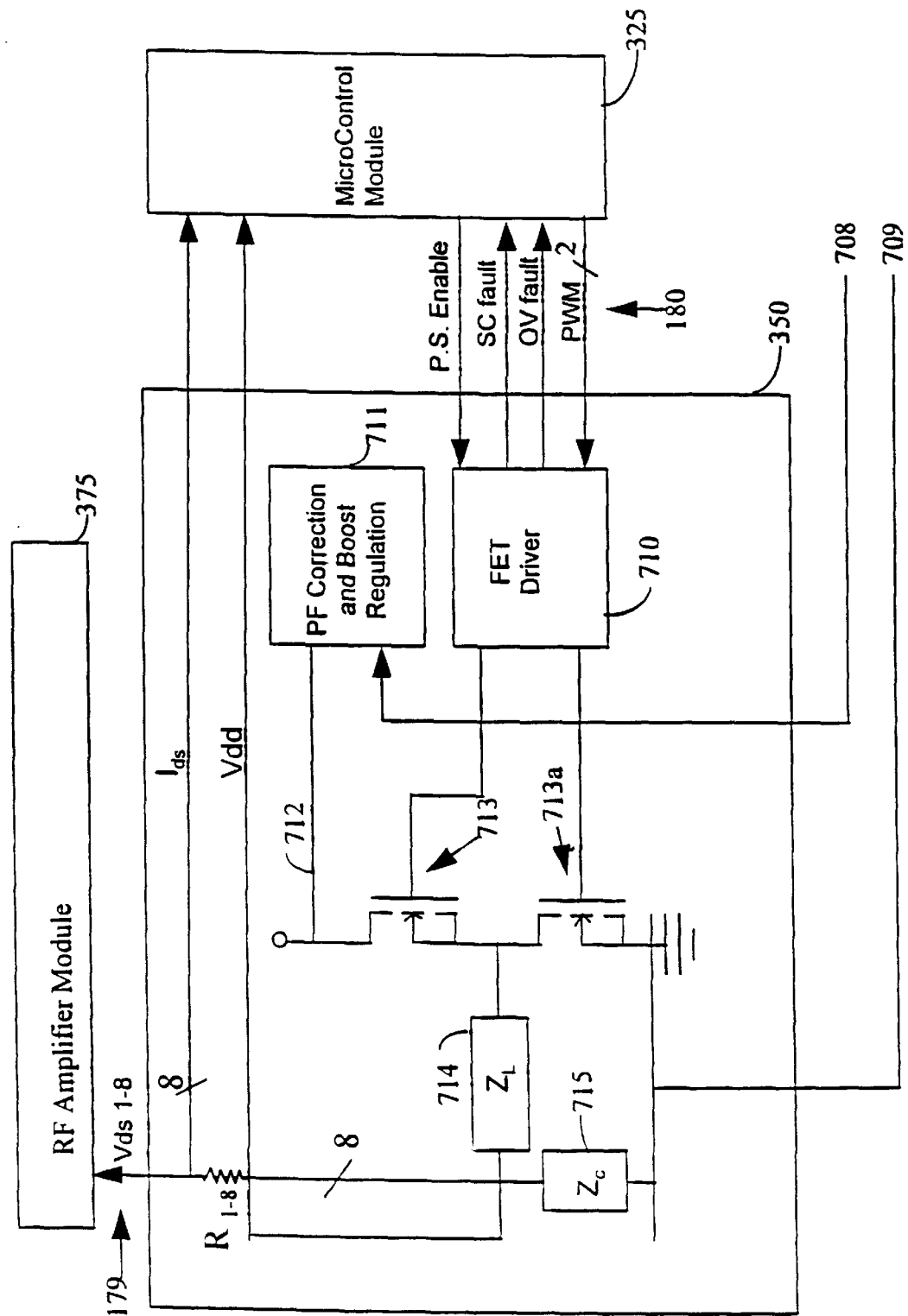
FIG. 27 is a block diagram of a power supply module interfacing with a microcontroller module and a RF amplifier module on a PA slice.

FIG. 27 is a schematic diagram of the power supply module 350 used in each one of the PA slices 310. The power supply 350 includes a field effect transistor (FET) driver circuit 710, a power factor correction and boost regulation circuit 711, a pair of power switching FETs 713, 713*a*, a load resistor 714 and a load capacitor 715. The Haversign pulses are provided via connector 708 from the main AC rectifier circuit 702 (FIG. 26) and passed to the power factor correction and boost regulation circuit 711. In response, the power factor correction and boost regulation circuit 711 adjusts the power factor (i.e., active power to apparent power ratio) of the input power to 0.95. Once corrected, the input power is then boosted to a level of 300 volts unregulated DC provided to a source of the switching FET 713. A gate of the switching FET 713 is controlled by the FET driver circuit 710 which receives and forwards the PWM signals provided by the microcontroller module 325. The first PWM signal switches the switching amplifier 713 on and off such that small pulses of the 300 VDC unregulated power are provided to the capacitor load 715 through the load resistor 714. The second PWM signal switches a low-side FET 713*a*. The capacitor load 715 accumulates the charge from the small pulses such that 10.5 volts are developed with respect to ground, 709. An FET 713*a* serves to protect the power supply module 350 from an overvoltage condition by providing a drain of FET 713 a path to ground during an overvoltage condition.

The voltage developed on the capacitor 715 is provided as a feedback signal VDD which is passed to the microcontroller module 325 through the power supply control harness 180 so the VDD can be monitored and adjusted by the microcontroller module 325.

Each of the eight lines connecting to load capacitor 715 include a set of respective sense resistor $R_{1-8}$ used to measure the current drain to source (Ids) of each of the currents drawn from the respective GaAs FET amplifiers 385 (FIG. 17). The output of each of the respective resistors $R_{1-8}$ correspond to the voltage lines VDS 1–8 P.S., as shown in FIG. 17.

In order to further promote the reliability of the power supply module 350, the microcontroller module 325, upon being notified of the fault in the power supply module 350, can alert a local operator through a front panel display and I/O device 323 (FIG. 13) so appropriate maintenance action may be taken.

Additionally, the microcontroller module 325 can also alert remote terminals by sending an error message over GNET 175 to the redundant system controller 200 (FIG. 5A). The redundant system controller will then dispatch a command through the slave controller and system I/O interface 250 (FIG. 5A), which will then issue an SNMP trap message (described in more detail with respect to FIG. 35*a* and FIG. 35*b*) informing the network manager, via the network 265 (FIG. 5A) precisely what is the nature of the perceived problem and which power supply module is failing or failed. Accordingly, the remote network management system may then place the PA slice 310 in a hot standby mode, turn the failed module off, or require that it continue to operate until it fails completely.

Figure 28:
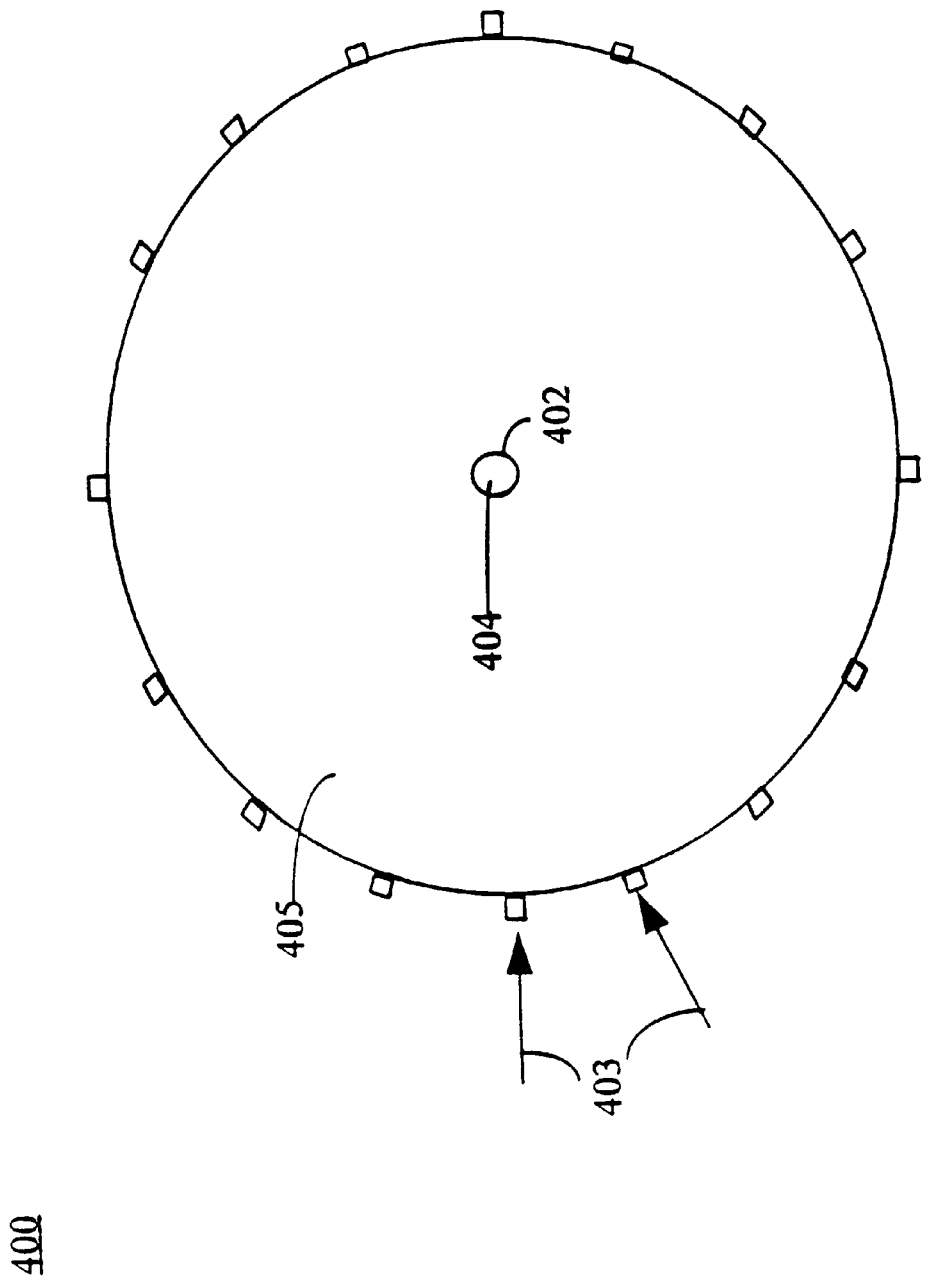
FIG. 28 is a schematic diagram of a radial combiner.

FIG. 28 is a plan view of the radial combiner 400 (FIG. 5A). The radial combiner includes a set of 16 inputs 403, e.g., SMA female connectors which receive the 16 semi-rigid lines 401 (FIG. 5A). However, if N PA slice modules 310 are used in the modular power amplifier 300 (FIG. 5A) then an N-way radial combiner 400 having N inputs 403 would be used. The function of the radial combiner is to provide a matched summing network for each of its N inputs and offer a graceful degradation feature such that the combiner network will not fail even if driven with only a subset of N input signals.

Each semi-rigid line 401 connects to corresponding inputs 403 of the radial combiner 400 (as shown in FIGS. 37b and 37c). The radial combiner is configured so each semi-rigid line 401 sees a 50Ω impedance. Adjacent ones of the semi-rigid lines 401 are input to corresponding adjacent inputs of radial combiner inputs 403. Each of the semi-rigid lines are isolated from one another by fixed resistance R (not shown) in accordance with the inherent impedance characteristics of the radial combiner 400.

Energy coupled into a given input 403 of the radial combiner 400 is passed through a waveguide section formed between two opposing radial plates 405 (only the top plate is visible in FIG. 28), which are separated by 3.11 inches and have an outer diameter of 4 inches, into a central cavity portion 404 formed in a central portion of radial combiner 400. At the central cavity portion 404, each of the N signals input through the inputs 403, are summed in power and jointly exit as a single RF output signal through an output 402.

The respective size of the outputs port 402, the opposing plates 405, the inputs 403, and the waveguide portions, are made consistent with the disclosures of U.S. Pat. No. 5,128,628 (Marks et al.), which is incorporated herein by reference; U.S. Pat. No. 4,956,614 (Baril), which is incorporated herein by reference and U.S. Pat. No. 4,812,782 (Ajioka), which is incorporated herein by reference; and made to support the preferred frequency range of 2.5 GHz to 2.686 GHz.

Because of the unique structure and electrical integration of the radial combiner 400 into the modular broadband booster system 100, an individual one of the PA slices 310 may be turned off using switch 324 and extracted from the chassis 311A without fear of damaging adjacent PA slices $310_{2-n}$. Furthermore, as a further guard against unforeseen potential reflections from the radial combiner 400 to an individual PA slice 310 output, the directional coupler 378 (FIG. 17) on each PA slice 310, and the sample port 501 (FIG. 10) after the radial combiner output are capable of sensing an impedance mismatch between the slice module 310, semi-rigid line 401, and radial combiner 400. When a mismatch is detected in response to the signals provided by either the directional coupler 378 or the sample port 501, the microcontroller modules 325 in the respective PA slices 310 and or drivers A, B 115, 120 will terminate operation when the amount of forward power or reverse power reflection from the PA slice output is greater than a certain predetermined threshold. Alternatively, the redundant system controller 200 (FIG. 5A) will detect the mismatch and shut down the problematic PA slice 310. Furthermore, the network manager may shut down the problematic PA slice when the network manager checks the modular broadband booster system's MIB (see discussion regarding FIGS. 35a, 35b and 36) and sees an attribute value indicating the particular PA slice 310 is experiencing extraordinary forward or reverse power reflections.

When an individual PA slice 310 fails, or is moved off-line for any reason, the redundant system controller 200 (FIG. 5A) issues a command to the driver controller 131 via the GNET data bus 175. The drivers 115, 120 adjust a required output power in order to compensate for a lower level of performance necessitated by the failure or removal of the PA slice 310. If an adjustment were not made, the automatic level correction function provided by the drivers 115, 120 in response to the sampled output single fed back from the output coupler 500 on the line 160 would attempt to overdrive the modular power amplifier 300 even though one of the PA slices 310 failed. Thus, when the drivers 115, 120 recognize that one of the PA amplifier slices 310 have failed or have been taken off-line, the ALC control provided by the drivers 115, 120 strive to provide an output power commensurate with a modular power amplifier 300 having only 15 PA slices 310.

Figure 29:
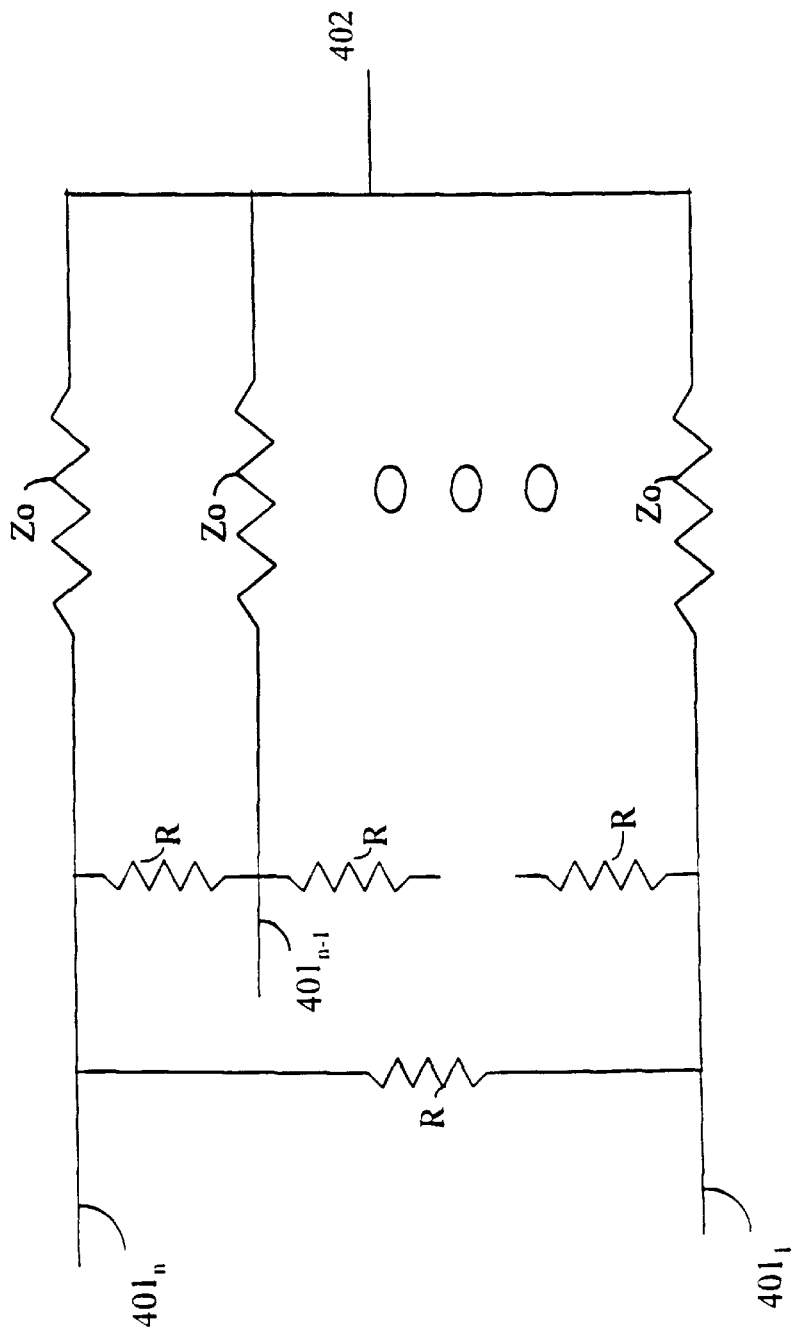
FIG. 29 is a schematic diagram of an equivalent circuit for a radial combiner.

FIG. 29 shows an equivalent circuit for the radial combiner 400. Each semi-rigid line $401_{1-n}$ observes an input impedance $Z_o$ (50Ω). The signals provided through the respective semi-rigid lines $401_{1-n}$ are summed at the output port 402 (also shown in FIG. 28). Because each of the individual semi-rigid lines 401 are appropriately sized (i.e., within a range of 21 cm to 30 cm), a fixed resistance exists between adjacent ones of the lines $401_{1-n}$. If, however, each of the semi-rigid lines 401 are not appropriately sized (e.g., perhaps the semi-rigid lines are too lengthy such that the RF energy at 2686 MHZ is rotated in phase by 0.25λ from the center frequency 2593 MHZ) a voltage developed on R will become excessively large. Thus, there will be a substantial risk of a short circuit (e.g., arching) developing between the outputs of adjacent PA slice modules 310 and their corresponding connections 302 (FIG. 10) to the semi-rigid lines 401 when an individual one of the PA slice modules 310 is either removed from the chassis 311A or for some reason develops an impedance mismatch with the radial combiner 400.

Figure 30A:
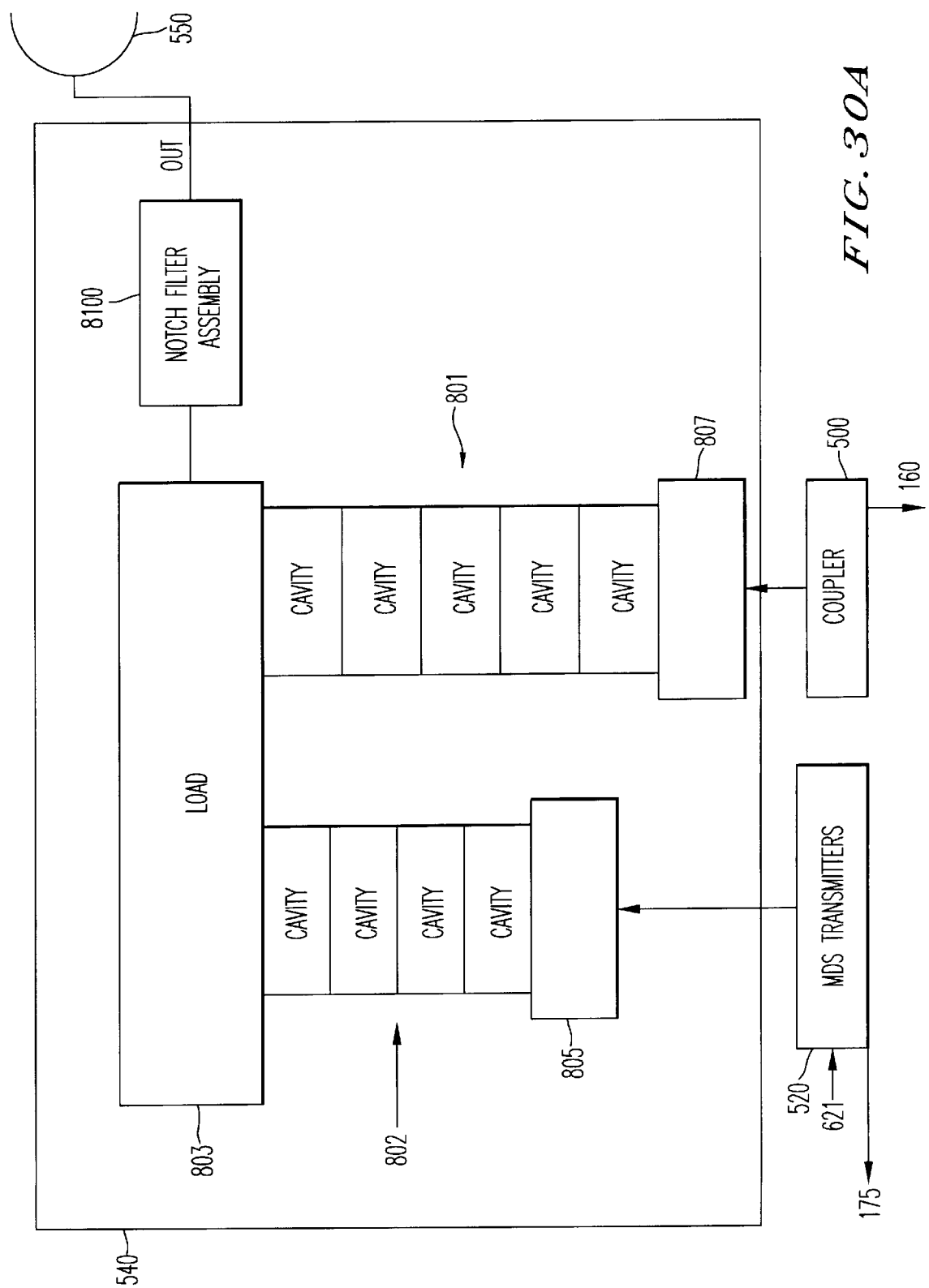
FIG. 30a is a block diagram of a diplexer.

FIG. 30a illustrates the diplexer 540 which excepts inputs from the MDS transmitters 520 (FIG. 5A) and the output coupler 500 and produces a combined, bandpass filtered output to the output antenna 550. The diplexer 540 combines the RF energy from the MDS frequency band (i.e., the F1 band from FIG. 6) with the RF energy from the ITFS/MMDS/OFS frequency band (i.e., the F2 and F3 band in FIG. 6, which is-non-contiguous with the MDS frequency band). The MDS transmitter 520 inputs its MDS RF energy into an input 805 which couples the MDS RF energy into a plurality of resonant cavities 802 (e.g., four), each of which is optimized in size (i.e., capable of supporting transmission modes) MDS frequency band and thus bandlimits RF energy outside of the MDS frequency band. Stacking the cavities 802 one after another, sharpens a pair of bandstop skirts (e.g., at high and low edges of the MDS band), thereby further suppressing out-of-band emissions, including intermodulation products. A filter such as that disclosed in co-pending U.S. patent application Ser. No. 08/818,896, entitled "Dielectric Resonator Filter Configured to Filter Radio Frequency Signals in a Transmit System," filed Mar. 17, 1997, the contents of which is incorporated herein by reference, may be used as well.

The diplexer 540 also includes a second cavity stack 801, optimized for the ITFS/MMDS/OFS frequency band, which couples and bandpass filters the RF energy from the coupler 500 through a second input 807 and to the second cavity stack 801 (which includes 6 resonant cavities). The cavity stack 801 couples the energy into the load 803, such that the RF energy from the coupler 500 combines with the RF energy from the MDS transmitters 520.

The load 803 outputs the combined RF energy to a notch filter assembly 8100 (discussed in more detail in reference to FIG. 30b). The notch filter assembly 8100 further bandlimits the RF energy by notch filtering the RF energy at frequencies slightly below the MMDS band and slightly above the MMDS band. The RF energy from the notch filter assembly is then output to the antenna 550.

FIG. 30b is a perspective view of the notch filter assembly 8100 embodied within the diplexer 540. RF energy from the load 803 (FIG. 30a) is input to a waveguide portion 820, which couples the RF energy to be output to the antenna 550 (FIG. 5A). A dielectric resonator 830a serves as a notch filter assembly and includes a window 850 and a stub 840. The window 850 and the stub 840 cooperate with the waveguide 820 to further suppress the spectral occupancy of the diplexer 540 at specific frequencies. Tuning screws 860 tune the discontinuity of the dielectric resonators such that if the screws 860 protrude into the waveguide by more than one-quarter of a wavelength, the apparent load will become inductive and thus further suppress signals at the low end of the MMDS band near 2.5 GHz. If the screw is turned to less than one-quarter of a wavelength, the load appears to be capacitive and thus the notch filter dielectric resonators 830a and 830b suppress RF energy just above the upper MMDS band at 2.686 GHz. Two dielectric resonator notch filters 830a–b are used, one tuned capacitively and one tuned inductively, to further suppress the out-of-band signals below the 2.5 GHz range and above the 2.686 GHz range. However, additional dielectric resonator notch filers may be used as well to further suppress out-of-band emissions.

Figure 31:
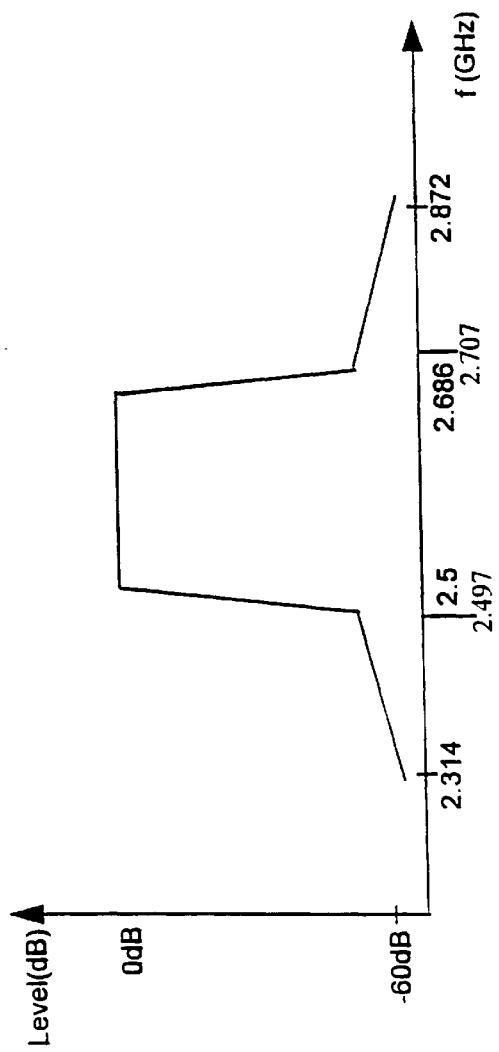
FIG. 31 is a spectral occupancy graph of an output signal not passed through a diplexer.

FIG. 31 is a graph of frequency versus signal power level for the combined RF signal output from the Diplexer 540 (FIG. 30a) to the antenna 550. More particularly, the graph illustrates the spectral occupancy of the radiated emissions from the antenna 550 because U.S. Federal Communications Commission requires out-of-band emissions for MMDS boosters to be 60 dB down from the average power spectral density at band edge 2.5 GHZ and 60 dB down at 2.707 GHz relative to the 2.686 GHz band edge. Without the diplexer 540 (FIG. 30a). emissions from the MMDS transmitters 520 and output coupler 500 would exceed the FCC spectral occupancy requirements, primarily due to intermodulation products generated in the signal combining process. The intermodulation emissions problem is seen in FIG. 31 where output emissions at frequency 2.497 GHZ are greater than the –60 dB requirement. Furthermore the emissions at 2.707 GHZ are above the –60 dB requirement.

Figure 32:
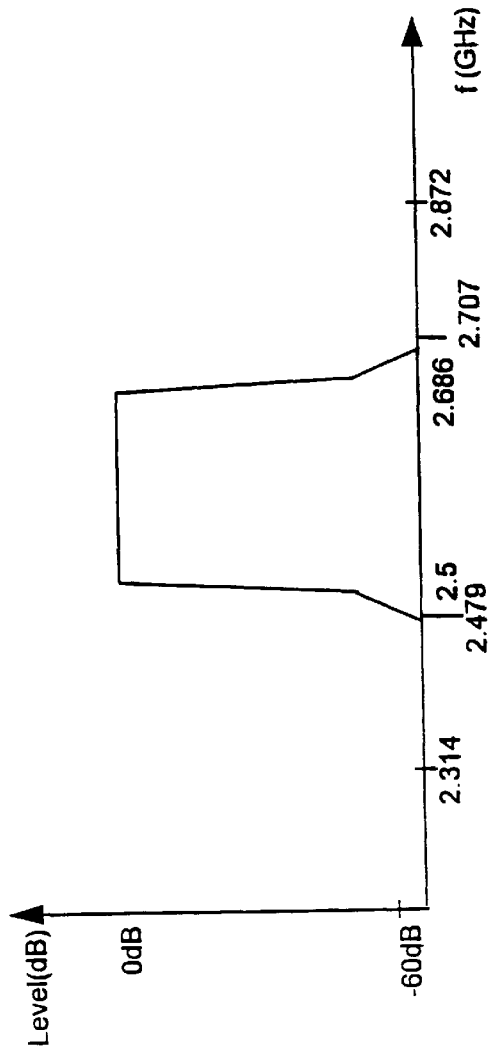
FIG. 32 is a spectral occupancy graph of an output signal passed through a diplexer.

FIG. 32 shows the spectral occupancy of the combined MDS and ITFS/MMDS/OFS energy when the diplexer 540 is used to filter and combine the MDS energy with the ITFS/MMDS/OFS energy. As seen in FIG. 32, the spectral occupancy at 2.497 GHz is about 64 dB below the average power spectral density at the 2.5 GHz band edge. Similarly, the spectral occupancy at 2.707 GHZ is about 64 dB down from the average power spectral density at the 2.686 GHz band edge. Thus, the independent bandpass filtering of the MDS RF energy and the independent bandpass filtering of the ITFS/MMDS/OFS energy respectively provided by the diplexer 540 brings the combined output signal of the modular broadband booster system 100 within the. FCC requirements.

Figure 33:
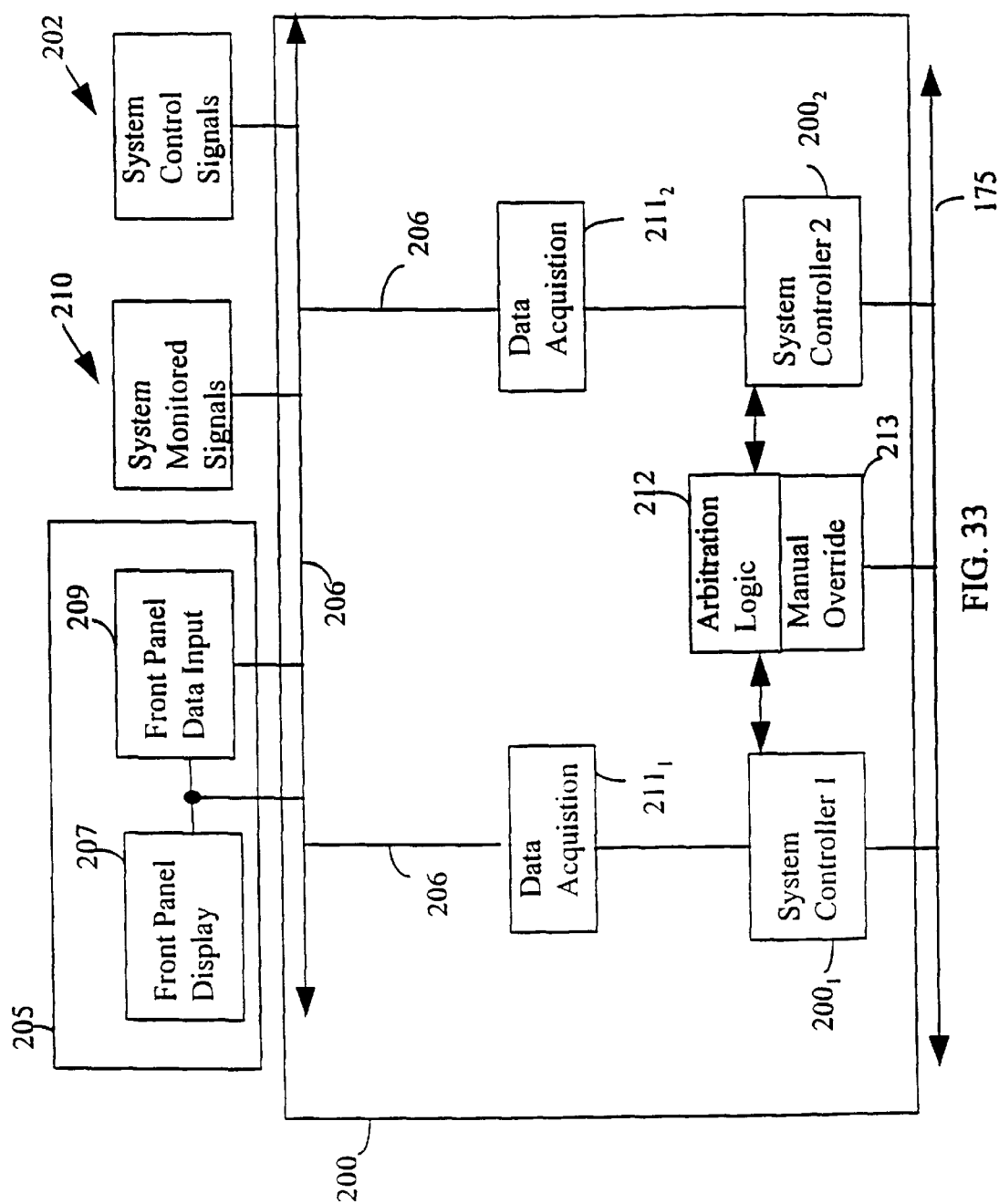
FIG. 33 is a block diagram of a redundant system controller.

FIG. 33 describes the redundant system controller 200 (FIG. 5A) and its interconnection with the GNET serial bus 175, the user interface 205, the system monitored signals 210, and the system control signals 200. The redundant system controller 200 includes a first system controller 1 200$_1$ which includes a Motorola MC68HC11F4FN microcontroller-based circuit board. A system controller 2 200$_2$ is identical in construction to system controller 1 200$_1$ although for cost or time-to-market reasons, only one system controller may be used. An arbitration logic block 212, which is implemented in a programmable array logic (PLA), is equipped with software switchable I/O functions and communicates with both the-system controller 1 200$_1$ and the system controller 2 200$_2$. The arbitration logic block 212 includes an initial setting value that upon initialization assigns either system controller 1 200$_1$ as a master controller (and thus also assigns the system controller 2 200$_2$ as a slave controller), or assigns the system controller 2 200$_2$ initially as the master (and thus system controller 1 200$_1$ as the slave). Assuming, for example, that the system controller 1 200$_1$ is initially assigned by the arbitration logic 212 as the master controller, the system controller 1 200$_1$ will control the GNET serial bus 175 and thus all message traffic over the GNET serial bus 175 will pass through and be controlled by the system controller 1 200$_1$. Under these conditions, the system controller 2 200$_2$, acting as a slave, will continually monitor the "health" of the system controller 1 200$_1$ via the arbitration logic 212 and the GNET serial bus 175 in order to determine if the system controller 1 200$_1$ is functioning properly. If the system controller 2 200$_2$ determines that the system controller 1 200$_1$ is not functioning properly, the system controller 2 200$_2$ will revolt (in a similar manner that which was discussed in reference to FIG. 9A for the driver 115 and the driver 120) and send a control signal through the arbitration logic 212 which will set a software switch in the arbitration logic 212, thereby reassigning the master and slave status of the respective system controllers 200$_{1-2}$.

Even though the respective system controllers 200$_{1-2}$ automatically detect and switch respective master and slave roles, a manual override 213 allows an operator or a remote network management system to positively assign the respective master and slave roles of the system controllers 200$_{1-2}$. The manual override function can be performed over the GNET serial bus 175 or through a front panel data input device 209 which is part of the user interface 205. An operator local to the modular broadband transmission system 100 can assert the master and slave status by observing a front panel display 207, which is part of the user interface 205, and informs the user of the relative roles and health of the system controllers 200$_{1-2}$.

Each of the system controllers 200$_{1-2}$ has access to respective data acquisition devices 211$_{1-2}$ which include a DAC circuit, an A/D circuit, memory and a level shifting circuit. The respective data acquisition circuits 211$_{1-2}$ connect to a system controller local bus 206 which in turn connects to the front panel 205, a set of system monitored signals 210, as well as a set of system control signals 202. The connection of the data acquisition devices 211$_{1-2}$ to the user interface 205 permits the redundant system controller 200 to both accept input from a user, via the front panel data input device 209, but also can display information on a front panel display that is a liquid crystal display. Each of the respective data acquisition devices 211$_{1-2}$ receive system monitored signals 210 which include signals such as status of doors and system 100, thermal status of the booster system 100, ON/OFF states of the fans, a functional status of the main AC rectifier circuit 702, a functional status of an auxiliary AC/DC converter 701, health and status signals regarding the respective drivers (115 and 120), etc. Based on each of these received monitored signals 210, the redundant system controller 200 issues text and graphics-based message displays to be displayed on the front panel display 207 and will set appropriate flags in a MIB. Furthermore, based on the system monitored signals 210, the redundant system controller 200 will issue appropriate system control signals 202 in order to provide power on/power off, hot standby, sound audible alarms, as well as other control signals.

FIG. 34 illustrates in more detail the slave controller and system I/O interface (personal computer) 250 and the user interface 255 (a–d) shown earlier in FIG. 5A. Alternatively, the slave controller and system I/O interface 250 may be adapted perform the functions of one of the redundant system controllers 200. The slave controller and system I/O interface 250 is a personal computer of a Packard Bell 120 MHz Pentium™ type using the Microsoft Windows NT operating system software. A CRT display 255a displays data output from the slave controller and system I/O interface 250 (although other displays such as LCD displays, plasma displays and other displays may be used). Data is input by a local user by a mouse $255_c$, a keyboard $255_e$, a local area network $255_d$, which is a Novell Ethernet or other local connection such as a USB or fire wire connection. The slave controller and system I/O interface 250 also connects to the GNET serial bus 175, but serves as the "slave" on the GNET serial bus 175 because the GNET bus 175 recognizes only one master at a time, and the redundant system controller 200 (FIG. 5A) is the master. However, the slave controller and system I/O interface 250 is the primary external interface of the modular broadband booster system 100 (FIG. 5A), and thus, communicates with external sources through the PSTN 260 and the remote network 265 (a SNMP compliant network connecting to an Internet), although other networks such as wireless networks, cellular networks, ASDL networks, etc. may be used as well.

The slave controller and system I/O interface 250 serves as the primary system interface to the MMDS network management central facility (network manager) connected through the network 265. The network manager is centrally located at the main transmitter 1 (FIG. 1), operated by the MMDS service provider, and manages a number of modular broadband booster systems as part of an MMDS distribution network. The network manager is SNMP compliant such that SNMP "GET", "SET", "TRAP" messaging conventions are supported.

The slave controller and system I/O interface 250 manages the MIB for the modular broadband message booster system 100 (FIG. 5A). The MIB maintains selected status information about the modular broadband message booster system 100 (FIG. 5A) which is used by the MMDS network manager to remotely monitor and control the operation of the modular broadband message booster system 100 (FIG. 5A).

An enterprise portion of a MIB employed by the modular broadband booster system (MBBS) 100 (FIG. 5A) defines a superior object class "Comwave_Transmitter" which includes the attributes "Name" and "IPaddress". An example attribute value corresponding to the attributes to the superior object class "Comwave_Transmitter" would be "Name=MBBS1" which refers to a specific modular broadband booster system 100 that is part of the MMDS distribution network.

Subobject classes for the above identified superior object class "Transmitter" of the MIB include the following:
 Master;
 Slice;
 MDS;
 System Alarms;
 Drivers;
 Coupler; and
 Power Supply.

Each of the above-identified subobject classes inherits the attributes of the superior object class "Comwave_Transmitter.".

Attributes of the "Master" subobject class with attribute values include:
 Maddr=<address of the master>
 Failure detected=<description of failure>
 My_Mn=Master yes/Master no; and
 Status=ON/OFF.

The above attributes within the above subobject class "Master" allows the network manager to remotely detect and correct failures in the redundant system controller 200 (FIG. 5A), as well as control master/slave status.

Attributes of the "Slice" subobject class with example attribute values include:
 Saddr=<address of the slice>
 Failure detected=<description of failure>
 Status ON/OFF/hot standby/cold standby/transmit/reset;
 VDDtolerance=VDD <10.5/VDD >10.5/VDD=10.5;
 IDS#low=IDS_1_low/ . . . /IDS_8_low;
 IDS#high=IDS_L_high/ . . . /IDS_8_high;
 PS reset=yes/no
 OV fault=<description of fault>
 PSstatus=enable/disable;
 ISC fault=<description of fault>
 PWM=increase/decrease;
 VGS#MonLow=VGS1MONlow/ . . . /VGS8MONlow;
 VGS#MonHigh=VGS1MONhigh/ . . . /VGS8MONhigh;
 VGS#IncrUp=VGS1incrementup/ . . . /VGS8incrementup;
 VGS#IncrDown=VGS1incrementdown/ . . . /VGS8increment down;
 VDS#PSLow=VDS1/ . . . /VDS8;
 VDS#PSHigh=VDS1/ . . . /VDS8;
 RefPStatus=low/normal/high; and
 ForPStatus=low/high.

The above attributes within the above subobject class "Slice" allows the network manager to remotely control the ON/OFF status of individual slices (i.e., PA modules) as well placing an individual slice in a hot standby state or a cold standby state, a transmit state or receive state. In addition, the network manager will have access to the following status values within a given PA slice, VDD, IDS, reflected power and forward power, and various power supply fault signals and power supply PWM signals. In addition, each of the attributes for the object class "Slice" will allow the network manager to monitor and control each of the respective GaAs FET amplifiers used in the RF amplifier module 375 (FIG. 16).

The subobject class "MDS" will include the following attributes with attribute values:
 MDSaddr=<address of MDS>; and
 Status=ON/OFF/standby/health.

The above-identified attributes will allow the network manager to remotely monitor and control each of the two MDS transmitters 520 (FIG. 5A). Furthermore, the network manager will be able to monitor the health and status of the respective MDS transmitters.

The subobject class "System_Alarms" includes the following attributes with attribute values:
 ThermalAlarm=high/low;
 System overtemp=<temperature of system>;

FanStatus=ON/OFF; and

OpenDoor=Yes/No.

The above-identified attributes of the subobject class "System_Alarms" allows a network manager to remotely monitor various system features including thermal overtemp conditions and sounding alarms therefor, notifying operators of the operational ON/OFF status of a system fan, and an open door condition.

The "Drivers" subobject class of the MIB includes the following attributes with attribute values:

Daddr=<address of driver>;

Master=Yes/No;

For.P=high/normal/low;

Power=increment/decrement;

RefP=low/normal/high; and

Driver=ON/OFF.

The above-identified attributes within the subobject class "Drivers" allows a network manager to individually monitor and alter a respective Master status of the driver modules 115, 120 (FIG. 9A). In addition, the network manager will be able to monitor the forward and reflected powers in increments, the respective driver 115, 120 gains in order to provide appropriate output power for the respective drivers 115, 120. In addition, the network manager will be able to control an ON and an OFF status of each of the individual drivers 115, 120.

The subobject class "Coupler" includes the following attributes with attribute values:

RefP=low/normal/high; and

ForP=low/normal/high.

The above-identified attributes of the subobject class "Coupler" allow the network manager to monitor and adjust the respective reflected and forward powers as measured at the output of the radial combiner 400 (FIG. 5A).

The subobject class "Power Supply" of the MIB includes the following attributes with attribute values:

MainAddr=<address of main power supply>;

AuxAddr=<address of auxiliary power supply>; and

Health=<ON/OFF>.

The above-identified attributes of the subobject class "Power Supply" will allow the network manager to remotely monitor and control the health of the respective main AC rectifier circuit 702 (FIG. 25) and auxiliary power supply 701 (FIG. 25).

The slave controller and system I/O interface 250 employs an expert system which gathers and maintains an updated table of the respective attribute values for each attribute in the MIB for the modular broadband booster system 100 (FIG. 5A). Upon detection of an individual failure or detection of an abnormal reading of any of the system monitored signals 210 (FIG. 33), the expert system will alert the slave controller and system I/O interface 250 to initiate an SNMP TRAP signal which will report the detection of a potential failure within the modular broadband booster 100 (FIG. 5A) to the network manager via the network 265. Unique SNMP TRAP messages will be provided for each of the potential faults or perceived abnormal readings in the modular broadband booster system 100. By providing unique TRAP messages, the network manager precisely determines the nature of the perceive fault merely by looking at the unique number assigned to the TRAP message.

In response to receiving an SNMP trap message, the network manager issues an SNMP GET signal in order to retrieve various attribute values that the network manager believes correspond to the reported TRAP message. By employing the expert system to maintain a current table of attribute values for the MIB, the slave controller and system I/O interface 250 is consistently prepared to provide an updated response to the network manager's SNMP GET request.

The slave controller and system I/O interface 250 is also capable of dispatching, within the modular broadband booster system 100, a control signal received from the network manager via the network 265 corresponding to whatever values are included in a SNMP SET signal from the network manager. For example, if the network manager detects that a given PA slice 310 has failed, the network manager may issue an SNMP SET message which sets the Slice status attribute to hot standby.

FIG. 35a shows the trap message data structure for reporting messages to the network manager. A trap message data structure 266 includes the following subfields: Trap No., Object Class, Attribute 1=, Attribute 2=, EOM. The Trap No. subfield contains a unique number for each of TRAP message in the vocabulary of the slave controller and system I/O interface 250. Each unique TRAP message number will correspond to a given perceived problem or a status value within the MIB. The object class, attribute 1=, attribute 2=, subfields are included to successively report the respective values of first and second attributes within a given object class. The EOM subfield reports to the network manager that it marks an end of the TRAP message.

FIG. 35b is an example TRAP message which is assigned a number "000028". This exemplary TRAP message reports to the network manager that a "reflected power" is reported as being "high" on a "slice" module assigned the "address 7". Given the information that the PA slice 7 has a reflected power that is high, the network manager could now reasonably conclude that an impedance mismatch has been detected between the given PA slice 310 and the radial combiner 400 (FIG. 5A). In response, the network manager can either defer the system control to the redundant system controller 200 and respective microcontroller 326 on the individual slice, or can take action by issuing a SNMP SET function which may perhaps set PA slice 7 ($310_7$) in a standby state or an OFF state. Suppose the SNMP network manager chooses to get additional information by polling the MIB and obtaining other system information. Based on the system information, the network manager may make other adjustments to the modular broadband booster system 100 (FIG. 5A) based on other perceived system problems.

The structure of the TRAP messages is defined such that a network manager may instantly be appraised of problems as they arise. Because the issuance of a TRAP message from the modular broadband booster 100 is proactive, the system 100 promptly alerts the network manager of an early problem so that the network manager can adapt its polling scheme from amongst the several booster systems in the MMDS network and provide immediate attention to what the respective modular broadband booster system 100 perceives as a problem.

In order to temporarily cure a problem, the network manager may, for example, decide to reallocate network resources. For example, the network manager may increase transmit power from neighboring modular broadband booster systems 100, in order to provide coverage to a service area that is typically covered by a modular broadband booster system 100 (FIG. 5A) that is down for maintenance. While conventional receivers 2 (FIG. 1) would not benefit from the increased transmit power from the neighboring booster system 100 (FIG. 5A) because of the spatial isolation offered by the high-gain antenna employed by the receiver 2, receivers 2 that are configured to provide diversity reception of a plurality transmit sources would benefit from the neighboring broadcasts. Because of the modular architecture and graceful degradation characteristics of the modular broadband booster system 100, the network manager may compensate for reduced power conditions at adjacent booster sites by reallocating the respective output powers of individual ones of the broadband booster system 100.

Figure 36:
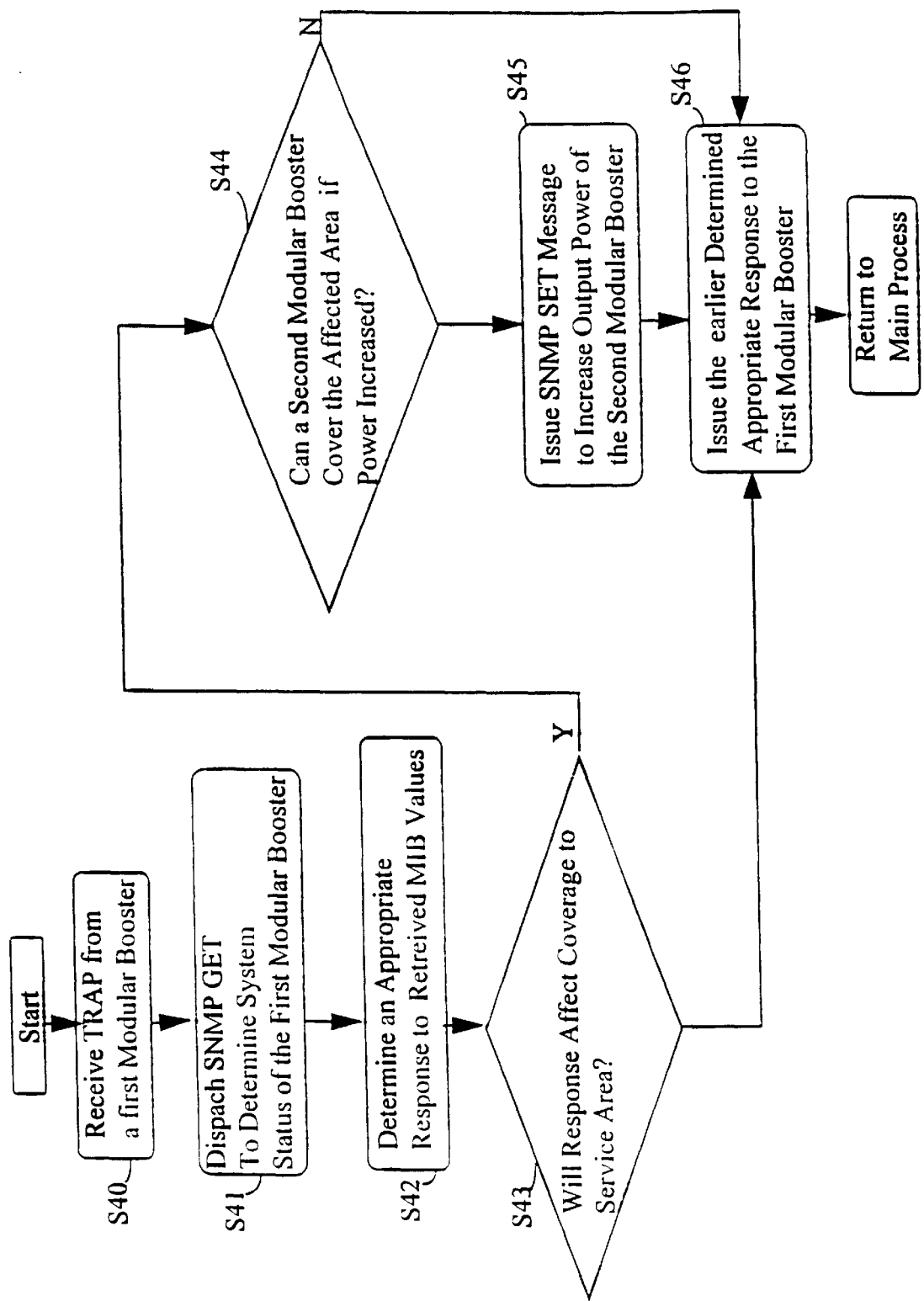
FIG. 36 is a flowchart illustrating a process for reconfiguring selected ones of modular boosters used in a network of modular boosters.

FIG. 36 illustrates an exemplary process flow diagram employed by a network manager as part of an MMDS network 265 (FIG. 5A) in order to dynamically control network resources. The specific example process flow set forth in FIG. 36 illustrates how a plurality of modular broadband booster systems 100 may be dynamically controlled and reconfigured by a central network management controller (or even self controlled amongst the several ones of modular broadband booster systems 100) such that service areas will not be affected in the event any particular one of the plurality of modular broadband booster systems 100 detects a fault that will limit its output power. The process begins in step S40 when the network manager via network 265 (FIG. 5A) receives a TRAP message from a first modular broadband booster system 100. Once received, the process flows to step S41 where the network manager in network 265 dispatches a SNMP GET message to the first modular broadband booster system 100 in order to retrieve the status data in the MIB of the first modular booster 100. The process then flows to step 42 where the network manager uses the MIB values obtained via the SNMP GET message in order to determine an appropriate response to the initial TRAP message from the first modular booster. Once an appropriate response is determined, the process flows to step 43 where the network manager queries whether the determined appropriate response will effect coverage to a respective service area covered by the first modular booster. If the response to the inquiry in step S43 is negative, the process flows to step S46 where the network manager issues the earlier determined appropriate response to the first modular booster; however, if the response to the inquiry in step 43 is affirmative, the process flows to step S44 where the network manager queries whether a second modular booster is present such that an increase in the effective radiated power from the second modular booster (perhaps because the second modular booster has some spare PA slices that are either off or in hot standby mode) could compensate for the decrease in coverage area from the first modular booster. If the response to the inquiry in step S44 is negative, the process flows to step S46 and the earlier determined appropriate message is dispatched to the first modular booster; however, if the response to the inquiry in step S44 is affirmative, the network manager issues an SNMP SET message to the second modular booster in order to increase the output power of the second modular booster (perhaps by bringing on-line spare PA slices). By increasing the output power of the second modular booster, no gap in coverage occurs in the effected (or what would have been the effected) area. After the SNMP SET message is sent in step S45, the process flows to step S46 where the earlier determined appropriate message to the first modular booster is dispatched by the network manager.

The process disclosed in FIG. 36, is made possible by the modular architecture of the modular broadband booster system 100 on the presence of a microcontroller module 325 on respective of the PA modules 310. Because each of the modular boosters 100 are N-way modular boosters, each modular broadband booster system 100 may reserve selected ones of the N PA slices 310 to be used only in the even when extra service area or coverage area is required. Thus, in normal operations perhaps only 50% of the N PA slices 310 are used, however, when extra service area is required, additional ones of the PA slice modules 310 may be brought on line by the network manager in order to provide seamless coverage within the service area of the network.

FIGS. 37a and 37b respectively show a front view and side view of the component parts of the modular broadband booster system 100. In FIG. 37a, a rack 90° that is 40 rack units in height (RU, rack unit=1.75 inches) houses the PA slice modules $310_{1-8}$ in one of the chassis 311a, the PA slice modules $310_{9-16}$ in a second of the chassis 311a, the driver A 115, the driver B 120, the MDS transmitters 520, and the main AC rectifier circuit 702 and the auxiliary power supply 701. In addition, a chimney unit 904 is included in order to exhaust air forced through the rack 90° by the fan 901.

FIG. 37b is a side view of the rack 90° shown in FIG. 37a. FIG. 37b shows, in addition to the components shown in FIG. 37a include the radial combiner 400, the semi-rigid lines 401, the coupler 500, and the N-way splitter 130. The chassis 311a are each of a size 6 U. The fan unit 901 of a size 3 U. The driver A 115 and the driver B 120 are both of a size 4 U and the respective 2 MDS transmitters 520 are of a size 8 U. The main AC rectifier circuit 702 and auxiliary power supply 701 occupy 9 Us.

FIG. 37c is a back view of the PA slices $310_{1-16}$ and the radial combiner 400 as mounted in the rack 900 (FIGS. 37a and 37b). The PA slices $310_{1-8}$ are mounted above the PA slices $310_{9-16}$ in the respective chassis 311a. Each of the PA slices $310_{9-16}$ connect to the radial combiner 400 via corresponding semi-rigid lines 401. In order to support "hot-swapping" of individual PA slices 310, the lengths of each of the semi-rigid lines 401 are minimized by connecting the outermost PA slices 310 (e.g., PA slices $310_1$, $310_8$, $310_9$, and $310_{16}$) with the corresponding semi-rigid lines $401_1$, $401_8$, $401_9$, and $401_{16}$ to the nearest one of the 16 inputs to the radial combiner 400. As shown in FIG. 37c, the PA slices $310_{9-16}$ are positioned "up-side down" with respect to the PA slices $310_{1-8}$ so that the lengths of semi-rigid lines $401_9$, and $401_{16}$ are less than what would be required if the PA slices $310_{9-16}$ were not mounted up-side down.

SECOND EMBODIMENT

Figure 38:
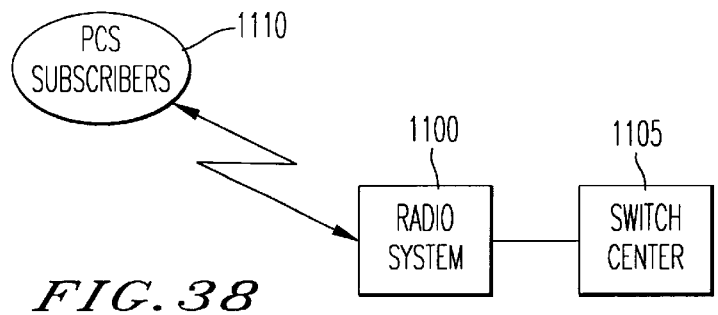
FIG. 38 is a block diagram of a modular transmitter system used as a personal communication system base station in a second embodiment of the present invention.

FIG. 38 shows a radio system 1100 which is similar to the modular broadband booster system of the first embodiment although optimized for use as a radio system (RS) (i.e., base station), as an element of a personal communication service (PCS) system. The radio system 1100 is used in a personal access communication system (PACS) PCS system which receives frequencies between 1850.1 MHZ to 1909.9 MHZ and transmits within the band 1930.1 MHZ to 1989.9 MHZ. However, the radio system 1100 may also be used with other PCS systems.

In the PCS system, PCS subscribers 1110 communicate with a RS 1100 (shown in more detail in FIG. 39) over a radio link. The RS 1100 receives incoming messages from individual PCS subscribers 1110 and passes them to a switch center 1105. This switch center then routes the given messages to an appropriate destination location. If the destination location is within the area covered by the RS 1100, the switch center 1105 will forward the message to the RS 1100 which permits the RS 1100 to establish a broadcast connection to an intended recipient of the original message.

Figure 39:
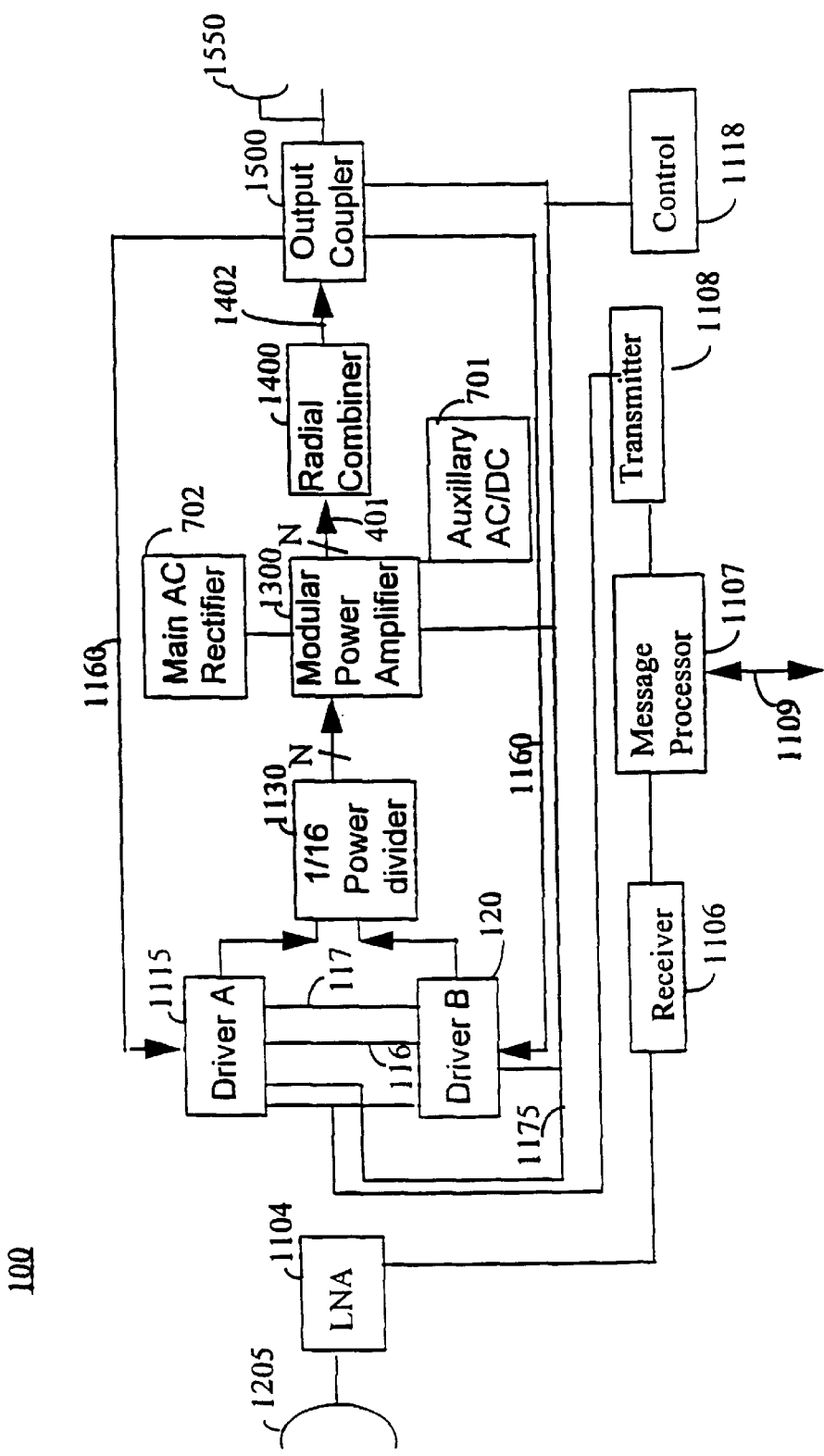
FIG. 39 is a detailed block diagram of the radio system of the second embodiment.

FIG. 39 shows the RS 1100 as used in the PCS system. A receive antenna 1205 is optimized to receive in the frequency band of 1850.1 MHZ to 1909.9 MHZ. Energy coupled to the receive antenna 1205 is forwarded to a low noise amplifier 1104, which amplifies the coupled energy and forwards it to a receiver 1106. The receiver 1106 downconverts the received energy and provides an output to a message processor 1107. The message processor 1107 detects and decodes the received energy in order to reconstruct the original message and then forwards the message to the switch center 1105 for channel assignment. Messages coming from the switching center 1105 are passed to the message processor 1107. The message processor 1107 then forwards an outgoing channel assignment and control message to a transmitter 1108 which combines the assignment and control message with other outgoing messages and up-converts the composites message to the PCS frequency band based on the respective channel assignments for the outgoing messages.

The transmitter 1108 outputs the composite messages to a driver A 1115 and a driver B 1120, each optimized for the PCS frequency band. The drivers 1115, 1120 output the respective signals (depending on which is the Master) to a 1/N power divider. The value N is appropriately selected based on the budget and power demands of the hosting RS facility. If more power is required, the value N is increased or if less power is required, the value of N is decreased. The output of the 1/N power divider 1130 is provided to a modular power amplifier 1300 which contains at least N PA slice modules 310, each optimized for use in the PCS band. The modular power amplifier 1300 outputs a corresponding set of N amplified signals via lines 1401 to a radial combiner 1400 which combines the N amplified signals. The respective size of the lines 1401 and radial combiner 1400 are adjusted to be optimized for the PCS band. The radial combiner 1400 outputs a single summed output through line 1402 (optimized for the PCS band) to an output coupler 1500 which is optimized for the PCS band. The output coupler then outputs the RF energy into a transmit antenna 1550 which is optimized for the PCS band.

A network 1175 interconnects the respective drivers 1115, 1120, the modular power amplifier 1300, and the output coupler 1500. The network 1175 operates under control of the control device 1118 which provides similar features to the redundant system controller 200, and the slave controller I/O 250 with their corresponding user interfaces 205, 255 of the first embodiment.

THIRD EMBODIMENT

Figure 40:
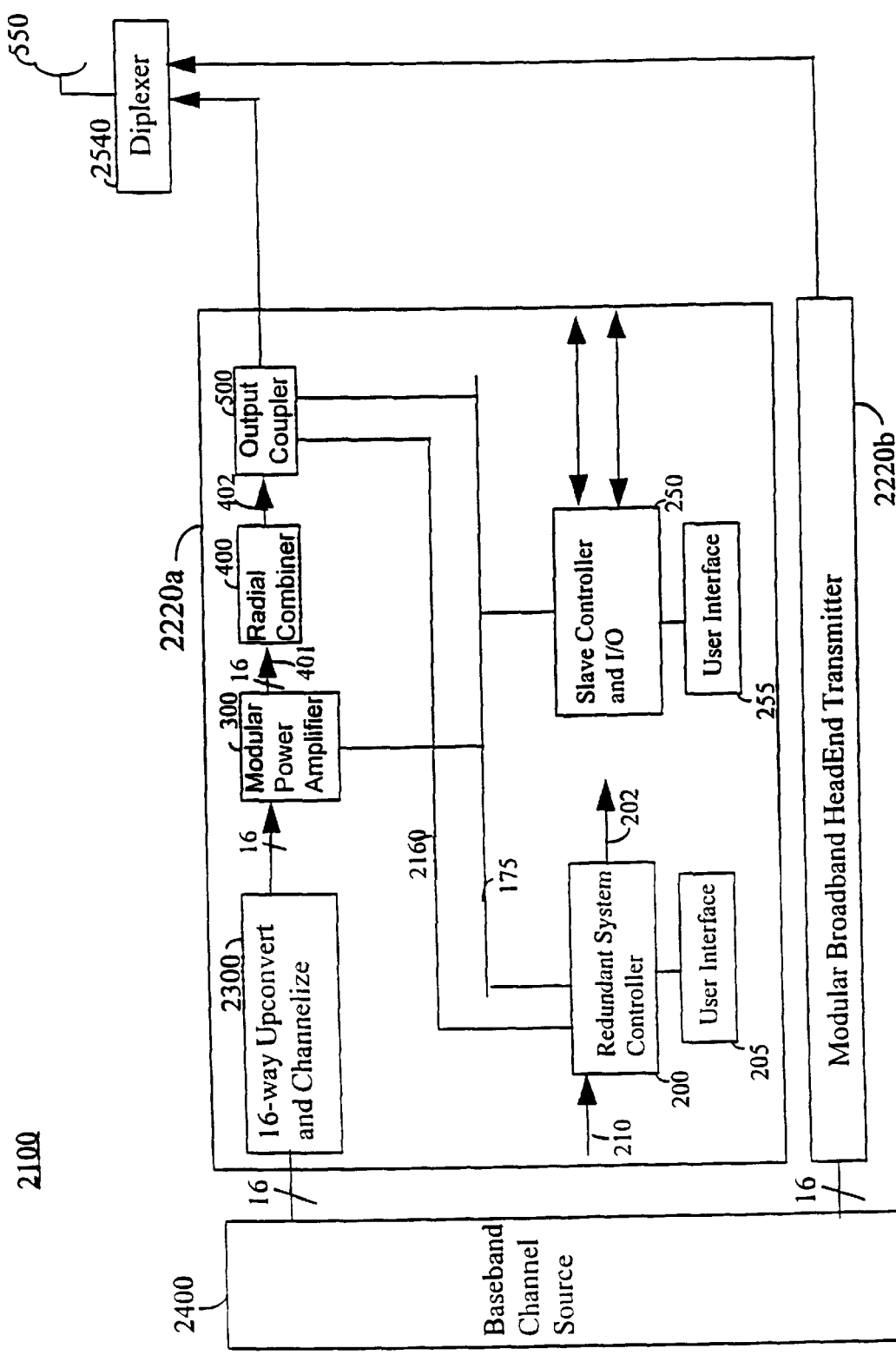
FIG. 40 is a block diagram of a head-end transmitter system of a third embodiment of the present invention.

FIG. 40 illustrates a third embodiment of the invention which is directed to a modular broadband head-end transmitter having a first modular broadband head-end transmitter 2220a combined with a second modular broadband head end transmitter 2220b. Each of the respective broadband head-end transmitters 2220 receives 16 separate MMDS channels (or more generally N) from a baseband channel source 2400. The baseband channel source 2400 provides the separate MMDS channels to each of the respective modular broadband head-end transmitters 2220. Each of the respective modular broadband head-end transmitters 2220 employs a 16-way up-convert and channelizing device 2300, which maintains isolation between the respective input signals while simultaneously up-converting each of the signals to a separate MMDS channel. The output of the 16-way (N-way) up-convert and channelizing device 2300 is provided on 16 (N) separate lines, each feeding a separate PA slice 310 (see FIG. 5A) which independently amplifies each of the 16 (N) channels and outputs the respective output on one of 16 (N) separate semi-rigid lines 401. Each of the semi-rigid lines 401 feeds an independent port of the radial combiner 400 which combines the separate amplified RF signals into a single output 402, and subsequently provided to the output coupler 500. A directional coupler output 2160 monitors the output signal and feeds a forward and a reflected power signal to the redundant system controller 200.

Sixteen (N) other channels are processed in a similar manner through the modular broadband head end transmitter 2220b.

The respective outputs of the modular broadband head-end transmitters 2220a and 2220b are provided to a diplexer 2340 which is optimized for the MMDS frequency band. The diplexer 2340 provides a single output to the transmit antenna 550.

FOURTH EMBODIMENT

Figure 41:
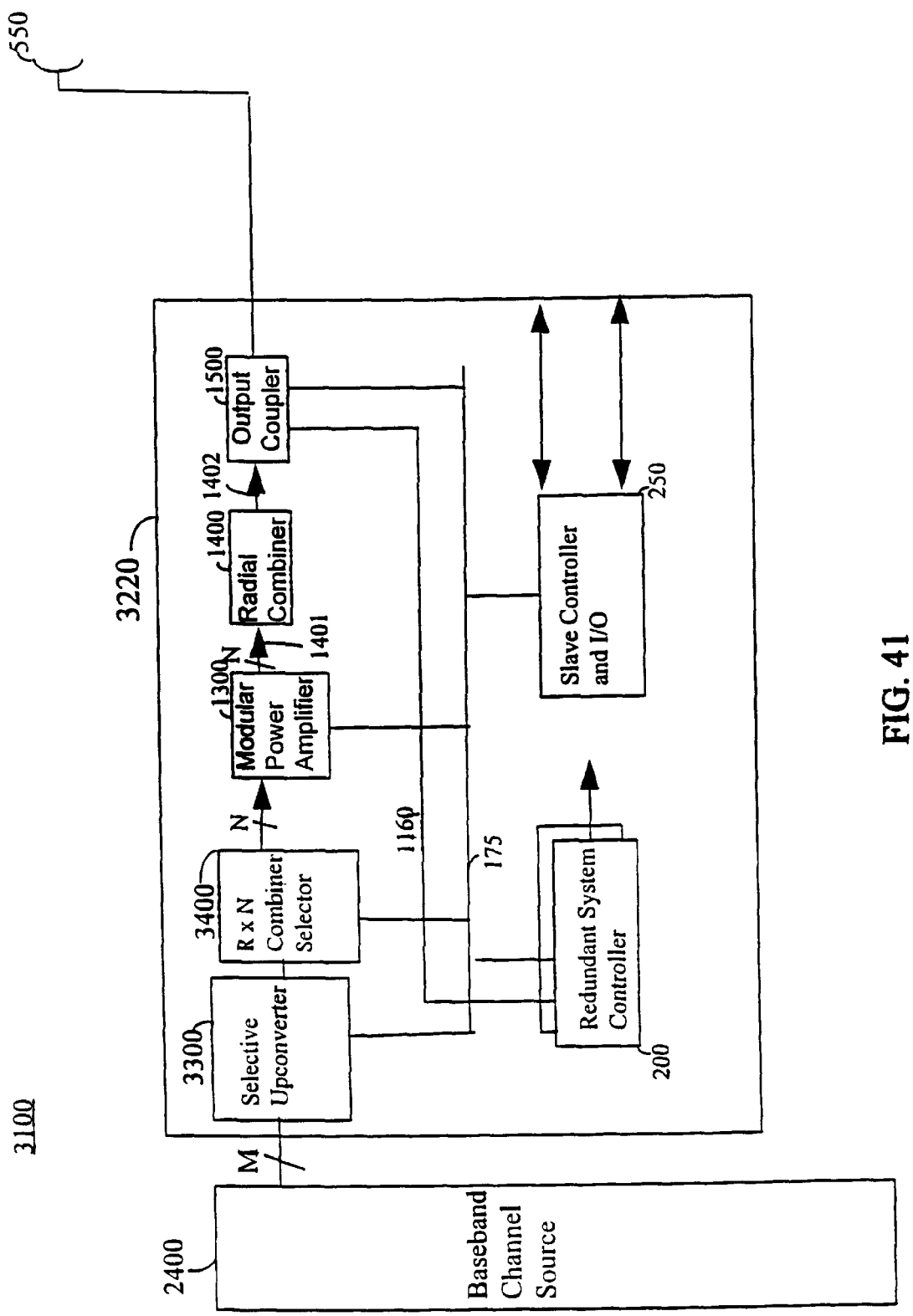
FIG. 41 is a block diagram of a head-end transmitter system of a fourth embodiment of the present invention.

FIG. 41 shows a reconfigurable head-end transmit system 3100 that includes a baseband channel source 2400 and a reconfigurable modularized transmit system 3220. Under control of a redundant system controller 200, a selective up-converter 3300 accepts a set of M inputs (where M can be as small as 1) from the baseband channel source 2400 and up-converts a selected set of R of the signals to the specific channels based on control signals from the redundant system controller to be broadcast from the output antenna 550. Once each of the selected R signals is up-converted to its appropriate channel, the R signals are output to an R×N ("R by N") combiner selector circuit 3400, which is connected to the GNET serial bus 175 and controlled by the redundant system controller 200. The R×N combiner selector 3400 appropriately combines or divides the respective R signals to produce N outputs. Although the operator can adjust a number of separate power amplifier paths through which an individual signal will pass, normally, if R is less than N, the operator will designate which of the R signals is to be broadcast at a higher power than the other channels. Suppose the operator selects a "signal 1" of the R signals to be broadcast at a higher power than the other signals, the signal 1 will be divided and power scaled within the R×N combiner selector 3400 and passed through two separate amplification paths within the modular power amplifier 1300. Thus the signal 1 will be transmitted at twice the power (3 dB) than the other signals. When the value R is equal to N, each of the respective R signals is amplified to a common level. When the value R is greater than the value N, the redundant system controller determines which of the R signals will be paired with one another and passed through an individual one of the N amplification paths in the modular power amplifier 1300. Each signal that is paired with another signal and passed through one path of the modular power amplifier 1300 will be broadcast with less effective radiative power than a signal that was not paired with another signal.

FIFTH EMBODIMENT

Figure 42A:
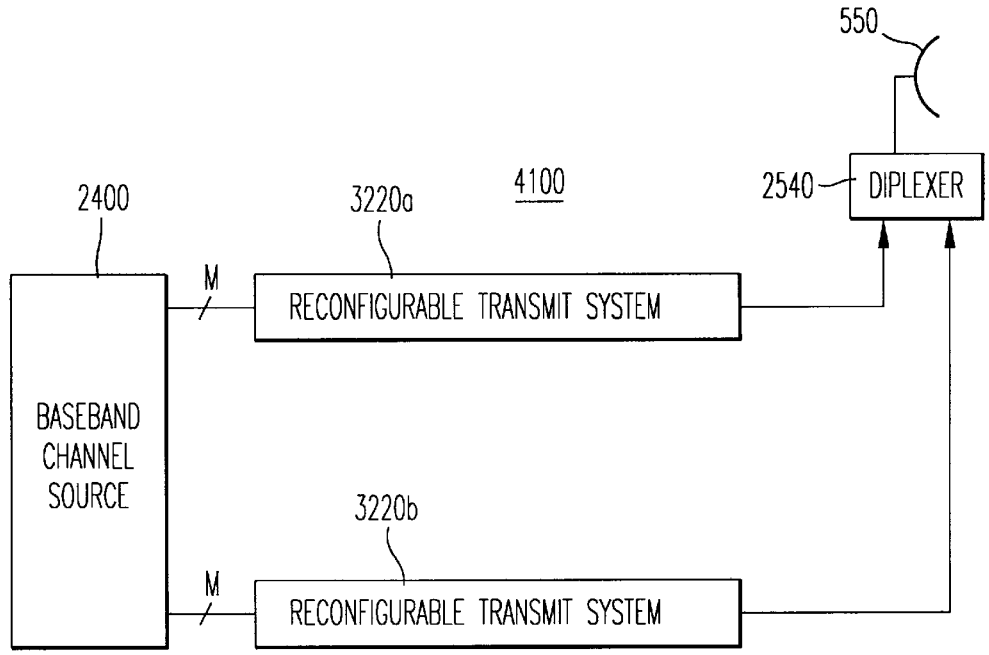
FIG. 42A is a block diagram of a head-end transmitter system of a fifth embodiment of the present invention.

FIG. 42A illustrates a fifth embodiment of the present invention where the reconfigurable head-end transmit system 3220 of the fourth embodiment is combined with the baseband channel source 2400 and diplexer 2540 of the third embodiment. The baseband channel source 2400 provides M signals to the reconfigurable head-end transmit system 3220a and a different M signals to the reconfigurable head-end transmit system 3220b. Under control of the respective redundant system controllers 200 (FIG. 41), a selected set of R of the M signals are combined and/or selected with one another in order to form N respective signal paths through each of the reconfigurable transmit systems 3220. Each of the signal paths is independently amplified and output through the reconfigurable head-end transmit system 3220 and provided to the diplexer 2540 which filters and combines the respective outputs of the reconfigurable transmit systems 3220 and provides a single input to the transmit antenna 550.

Figure 42B:
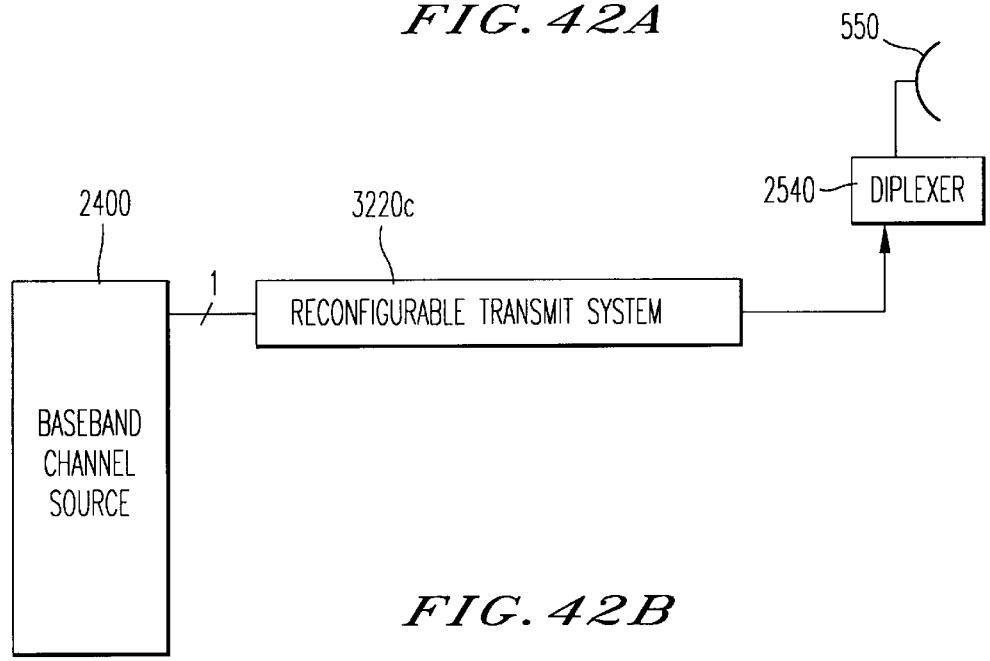
FIG. 42B is a block diagram of a single channel head-end transmitter system of the fifth embodiment.

While the two reconfigurable head-end transmit systems 3220a and 3220b are shown in FIG. 42, other reconfigurable head-end transmit systems could be included as well in order for individual ones of the selected input signals to be broadcast from the output antenna 550 with a greater effective radiated power. One such example of this latter configuration is shown in FIG. 42B, where the baseband channel source 2400 provides a single channel (which may carry, for example, between 1 to 6 digital programs) to a reconfigurable transmit system 3220c. The reconfigurable transmit system 3220 optionally includes the R×N combiner selector 3400 and the diplexer 2540, for example, and other components (e.g., redundant system controller 200, slave controller and I/O 250) that are not necessary for head end operation. PA Slice fault detection may be performed at the module level and communication of the detected fault may be achieved by a "wired OR" reporting scheme as monitored by driver controller 131 (FIG. 8). Once one of the PA Slices reports a fault condition, the driver controller 131 issues a fault detection message, and a technician may then identify the location of the failed PA Slice module by observing which of the N PA Slice modules has an illuminated LED on its front panel.

A benefit with the structure shown in FIG. 42B is that a head end operator may configure the system to broadcast a single channel at a desired power level simply by adding the appropriate number of PA slice modules to the modular power amplifier. As with the other embodiments, this simplified architecture offers (1) graceful degradation when one or more PA slice modules fail, (2) "hot swap" capability, and (3) a defined upgrade path if more than one channels are later to be transmitted from the head end transmitter. Similarly, the simplified architecture of FIG. 42B is reconfigurable to allow for a change in desired output power according to a change in concept of operations for the subject head end transmit facility. Moreover, the number of PA modules may be increased so as to meet an increase in output power requirements and decreased so as to meet a decrease in output power requirements.

SIXTH EMBODIMENT

Figure 43:
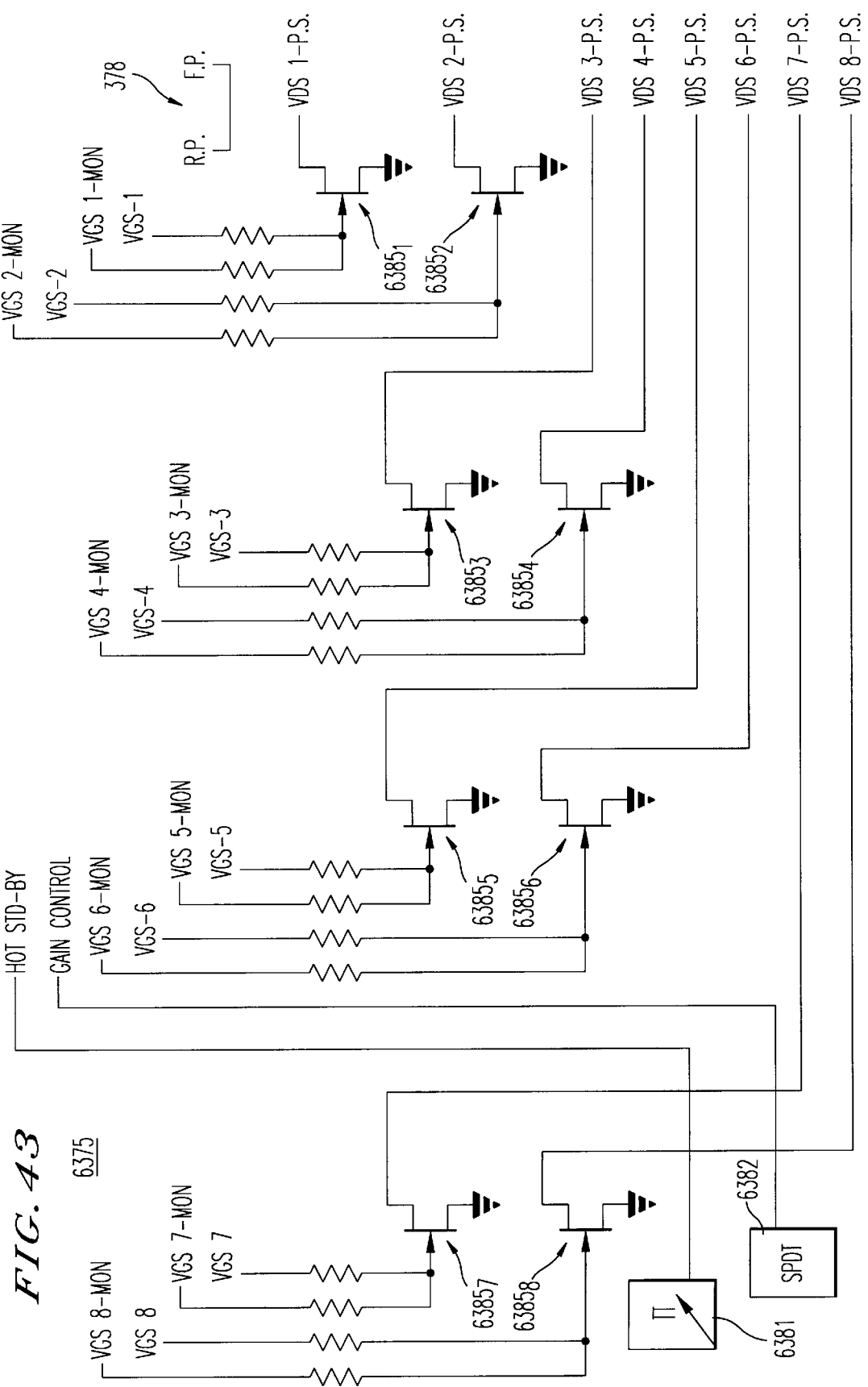
FIG. 43 is a block diagram of signal monitoring and control lines for an RF power amplifier module of a sixth embodiment of the present invention.

FIG. 43 illustrates an alternative amplifier architecture 6375 that is similar to the RF amplifier module 375 of the first embodiment, but FET amplifiers $6385_5$, $6385_2$ and $6385_1$ are added to the architecture. Furthermore, a set of amplifiers $6385_{1-4}$ are of a type 4XFLL 200, a pair of amplifiers $6385_{7-8}$ are of the 2XFLL 171 type, and a pair of amplifiers $6385_{5-6}$ are of the 4XFLL 200 type. While this architecture requires additional amplifiers as compared to the first embodiment, each of the several amplifiers are readily available.

SEVENTH EMBODIMENT

Figure 44:
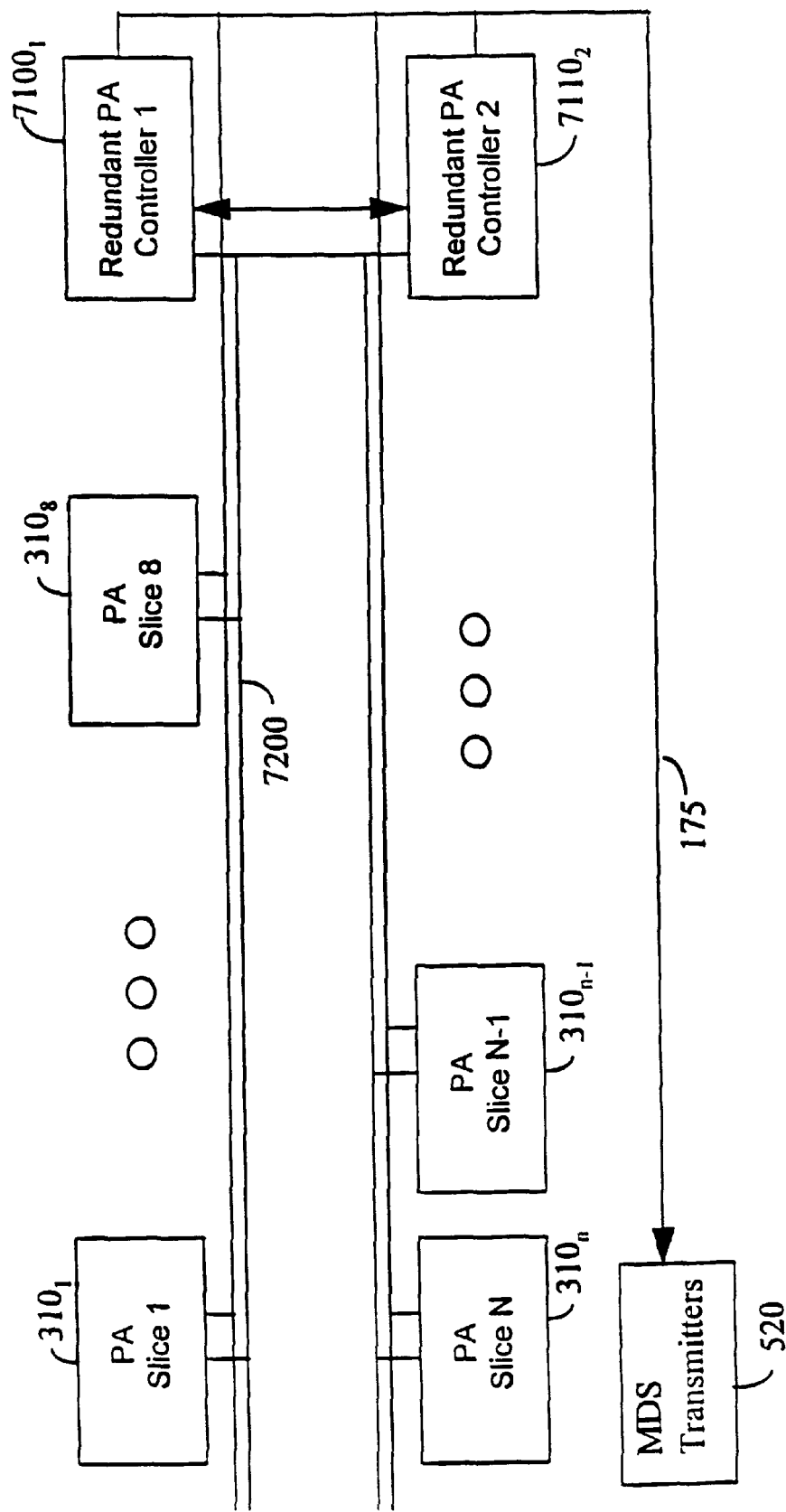
FIG. 44 is a block diagram of a differential bus and a redundant controller architecture of a seventh embodiment of the present invention.

FIG. 44 shows a SPI bus 720 which interconnects each of the respective PA slices $310_1$–$310_n$ for sharing data monitoring and control signals between each other. The SPI bus 720 is particularly well suited for each of the microcontroller modules 325 on each of the respective PA slice modules $310_{1-n}$. The GNET serial bus 175 also connects to each of the individual PA slices $310_{1-n}$, as well as to the MDS transmitters 520. Separate redundant PA controllers 1 and 2, $7100_{1-2}$, are provided to arbitrate the use of the SPI bus. The redundant PA controller 1 $7100_1$ and the redundant PA controller 2 $7100_2$ will assert master and slave control using the same process described with respect to the redundant system controllers 200 of the first embodiment.

The processes set forth in the present description may be implemented using a conventional general purpose microprocessor programmed according to the teachings of the present specification, as will be appreciated to those skilled in the relevant art(s). Appropriate software coding can readily be prepared by skilled programmers based on the teachings of the present disclosure, as will also be apparent to those skilled in the relevant art(s).

The present invention thus also includes a computer-based product which may be hosted on a storage medium and include instructions which can be used to program a computer to perform a process in accordance with the present invention. The storage medium can include, but is not limited to, any type of disk including floppy disk, optical disk, CD-ROMS, and magneto-optical disks, ROMS, RAMs, EPROMs, EEPROMs, flash memory, magnetic or optical cards, or any type of media suitable for storing electronic instructions.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A power amplifier module for amplifying an input signal applied thereto and providing an amplified output signal to a N-way radial combiner that combines said amplified output signal with other amplified output signals from other power amplifier modules, said power amplifier module comprising:

an amplifier submodule comprising a plurality of discrete amplifiers arranged in an amplifier chain which amplifies said input signal and provides an amplified output signal, each discrete amplifier having a gate terminal, a drain terminal and a source terminal, each amplifier having a gate-to-source voltage applied between said gate terminal and said source terminal and a drain voltage applied to said drain terminal;

a processor submodule configured to control a level of said amplified output signal, comprising,
    a monitoring mechanism configured to monitor respective gate-to-source voltages and said drain voltages,
    a comparison mechanism configured to compare said gate-to-source voltages and said drain voltages as monitored by said monitoring mechanism with predetermined gate-to-source voltages and drain voltages, and
    an adjustment mechanism configured to adjust at least one of said respective gate-to-source voltages and said drain voltages;

a power supply submodule configured to supply said drain voltages to said discrete amplifiers in said amplifier submodule, said processor submodule configured to apply said gate-to-source voltages to said discrete amplifiers in said amplifier submodule;

a bus connected to said power supply submodule, said processor submodule and said amplifier submodule for transferring data, voltages, and control commands therebetween; and an enclosure having an internal portion that houses at least said amplifier submodule, said processor submodule, and said bus therein.

2. The power amplifier module of claim 1, wherein said processor submodule comprises a processing unit programmed to respond to at least one of a command sent from a system controller and an internally detected fault condition, said processing unit controlling said respective gate-to-source voltages and said drain voltages via said power supply submodule when said processor submodule enters a cold standby mode of operation, a transition mode of operation, a hot-standby mode of operation, a transmit mode of operation and a failed mode of operation.

3. The power amplifier module of claim 2, wherein:

said input signal is in the wireless cable frequency range; and said processor turns off said discrete amplifiers in said amplifier chain when in the cold standby mode of operation.

4. The power amplifier module of claim 2, wherein, when in said transition mode of operation, said processor is configured to successively control respective gate-to-source voltages so as to pinch-off respective channels in said discrete amplifiers, increase respective drain voltages, and then adjust said respective gate-to-source voltages to normal operating voltages.

5. The power amplifier module of claim 2, wherein, when in said hot-standby mode of operation, said processor is configured to adjust said respective drain voltages and gate-to-source voltages to remain at normal operating voltages although said input signal is disconnected from said amplifier chain so that said amplifier chain does not amplify said input signal.

6. The power amplifier module of claim 2, wherein, when in said transmit mode of operation, said processor is configured to adjust respective drain voltages and gate-to-source voltages of said discrete amplifiers to normal operating voltages and connect said input signal to said amplifier chain so that said amplifier chain amplifies said input signal.

7. The power amplifier module of claim 2, wherein, when in said failed mode of operation, said processor is configured to turn off respective discrete amplifiers and send a message to a system controller indicating that said power amplifier module has failed.

8. The power amplifier module of claim 1, further comprising:

a coupler configured to monitor an output power of said amplified output signal and produce a monitored output power parameter that is communicated to said processor submodule; and a signal level adjustment mechanism connected to said amplifier chain and configured to adjust a level of said input signal applied to said amplifier chain, wherein said processor submodule being configured to control a level at which said amplified output signal is output by comparing said monitored output power parameter with a predetermined range of values, and if said monitored output power parameter is outside of said predetermined range, controlling said signal level adjustment mechanism to bring said amplified output signal to within said predetermined range.

9. The power amplifier module of claim 8, wherein:

said monitored output power parameter comprises a forward power parameter and a reflected power parameter, said processor submodule being configured to turn-off said power amplifier module and send a message to a system controller indicating said power amplifier has failed if said reflected power parameter exceeds a predetermined threshold.

10. The power amplifier module of claim 1, further comprising a local bus connector configured to connect to another bus through which data is communicated between said processor submodule and said other power amplifier modules.

11. The power amplifier module of claim 1, wherein said enclosure comprises a conductive material, said internal portion being defined by opposing walls, at least one of said opposing walls having a channel formed therein having a depth and width of sufficient size to hold said bus therein, said metallic material and said channel cooperating to reduce electromagnetic interference generated by said amplifier submodule, said processor submodule and said power supply submodule.

12. The power amplifier module of claim 11, wherein said internal portion of said enclosure comprises electromagnetic isolation shields that subdivide said internal portion into compartments that host said amplifier submodule, said processor submodule and said power supply submodule, said channel extending between at least two of said compartments.

13. The power amplifier module of claim 1, further comprising:

a chassis; and a backplane having a plurality of connectors formed thereon, wherein said enclosure is configured to slide within said chassis and plug into at least one of said plurality of connectors.

14. The power amplifier module of claim 2, wherein said enclosure assembly comprises a front-panel having an interlock switch disposed thereon, said processor submodule configured to detect when said interlock switch is actuated by a user and respond by entering said cold standby mode of operation by sequentially changing respective of said gate-to-source voltages of said discrete amplifiers to pinch-off respective channels of said discrete amplifiers, and substantially reducing said drain voltage prior to enabling said power amplifier to be disconnected from said N-way radial combiner.

15. The power amplifier module of claim 1, wherein said processor submodule comprises a module shut-down mechanism configured to turn off said discrete amplifiers in response to receiving a shut-down message received from a system controller, said processor submodule causing said discrete amplifiers to shut-off by sequentially changing respective of said gate-to-source voltages of said discrete amplifiers so as to pinch-off respective channels of said discrete amplifiers, and substantially reducing said drain voltage prior to enabling said power amplifier to be disconnected from said N-way radial combiner.

16. A power amplifier module for amplifying an input signal applied thereto and providing an amplified output signal to a radial combiner that combines said amplified output signal with other amplified output signals from other power amplifier modules, said power amplifier module comprising:

means for amplifying said input signal and providing an amplified output signal, comprising, a plurality of discrete amplifiers, and means for applying a gate-to-source voltage and a drain voltage to respective of said discrete amplifiers;

means for controlling a level of said amplified output signal, comprising, means for monitoring said gate-to-source voltage and said drain voltage of respective of said discrete amplifiers, means for comparing said gate-to-source voltage and said drain voltage of respective of said discrete amplifiers with predetermined gate-to-source voltages and drain voltages, and for producing a comparison result, and means for adjusting at least one of said gate-to-source voltage and said drain voltage of respective of said discrete amplifiers based on said comparison result;

means for transferring data, voltages, and control commands between said means for amplifying and means for controlling; and means for enclosing said means for amplifying, means for controlling, and means for transferring in a single enclosure.

17. The power amplifier module of claim 16, further comprising means for responding to at least one of a command sent from a system controller and an internally detected fault condition by operating said means for controlling in one of a cold standby mode of operation, a transition mode of operation, a hot-standby mode of operation, a transmit mode of operation and a failed mode of operation.

18. The power amplifier module of claim 16, further comprising:

means for monitoring an output power of said amplified output signal and producing a monitored output power parameter; and means for adjusting a level of said input signal applied to said amplifier chain by comparing said monitored output power parameter with a predetermined range of values and if said monitored output power parameter is outside of said predetermined range, bringing said amplified output signal to within said predetermined range.

19. The power amplifier module of claim 16, wherein said means for enclosing further comprises means for reducing electromagnetic interference between said means for amplifying, means for controlling and means transferring.

20. The power amplifier module of claim 16, further comprising means for mounting said power amplifier module in a rack by pluggably connecting said power amplifier module to a backplane configured to host said other power amplifier modules.

21. The power amplifier module of claim 16, further comprising means for disconnecting said power amplifier module from said radial combiner while said other power amplifier modules continue to amplify said input signal.

22. The power amplifier module of claim 21, further comprising:

means for receiving a shut-down message from at least one of a system controller and a fault detection mechanism; and means for responding to said shut-down message by sequentially changing respective of said gate-to-source voltages of said discrete amplifiers so as to pinch-off respective channels of said discrete amplifiers, and substantially reducing said drain voltage of said discrete amplifiers.

23. A method for amplifying an input signal applied a power amplifier and providing an amplified output signal to a radial combiner that combines said amplified output signal with other amplified output signals from other power amplifier modules, said method comprising the steps of:

amplifying said input signal by applying said input signal to a plurality of discrete amplifiers;

applying a gate-to-source voltage and a drain voltage to respective of said discrete amplifiers;

controlling with a processor a level of said amplified output signal, comprising the steps of, monitoring said gate-to-source voltage and said drain voltage of respective of said discrete amplifiers, comparing said gate-to-source voltage and said drain voltage of respective of said discrete amplifiers with predetermined gate-to-source voltages and drain voltages, and producing a comparison result, and adjusting at least one of said gate-to-source voltage and said drain voltage of respective of said discrete amplifiers based on said comparison result; and enclosing said discrete amplifiers and said processor in a single enclosure.

24. The method of claim 23, further comprising the step of responding to at least one of a command sent from a system controller and an internally detected fault condition by operating said discrete amplifiers in one of a cold standby mode of operation, a transition mode of operation, a hot-standby mode of operation, a transmit mode of operation and a failed mode of operation.

25. The method of claim 23, further comprising the steps of:

monitoring an output power of said amplified output signal and producing a monitored output power parameter; and adjusting a level of said input signal applied to said discrete amplifiers by comparing said monitored output power parameter with a predetermined range of values and if said monitored output power parameter is outside of said predetermined range, bringing said amplified output signal to within said predetermined range.

26. The method of claim 23, further comprising the step of mounting said single enclosure in a rack with similar enclosures that enclose said other power amplifiers.

27. The method of claim 23, further comprising the step of disconnecting said power amplifier from said radial combiner while said other power amplifiers continue to amplify said input signal.

28. The method of claim 23, further comprising the steps of:

receiving a shut-down message from at least one of a system controller and a fault detection mechanism; and responding to said shut-down message by sequentially changing respective of said gate-to-source voltages of said discrete amplifiers so as to pinch-off respective channels of said discrete amplifiers, and substantially reducing said drain voltage of said discrete amplifiers.

* * * * *